(12) United States Patent
Lee et al.

(10) Patent No.: US 12,356,792 B2
(45) Date of Patent: Jul. 8, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jongwon Lee, Yongin-si (KR); Namsu Kang, Yongin-si (KR); Minkyung Kim, Yongin-si (KR); Minho Park, Yongin-si (KR); Huiju Park, Yongin-si (KR); Dongkyu Lee, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1022 days.

(21) Appl. No.: 17/343,549

(22) Filed: Jun. 9, 2021

(65) Prior Publication Data

US 2022/0115619 A1    Apr. 14, 2022

(30) Foreign Application Priority Data

Oct. 8, 2020  (KR) .................. 10-2020-0130451

(51) Int. Cl.
| | | |
|---|---|---|
| *H01L 51/54* | (2006.01) | |
| *H10K 50/13* | (2023.01) | |
| *H10K 85/60* | (2023.01) | |
| *H10K 101/00* | (2023.01) | |

(52) U.S. Cl.
CPC ........... *H10K 50/13* (2023.02); *H10K 85/622* (2023.02); *H10K 85/626* (2023.02); *H10K 85/633* (2023.02); *H10K 85/654* (2023.02); *H10K 85/6574* (2023.02); *H10K 2101/90* (2023.02)

(58) Field of Classification Search
None
See application file for complete search history.

(56) References Cited

U.S. PATENT DOCUMENTS

| | | |
|---|---|---|
| 6,936,962 B2 | 8/2005 | Hamada et al. |
| 8,860,013 B2 | 10/2014 | Okamoto |
| 9,184,405 B2 | 11/2015 | Song et al. |
| 9,385,339 B2 | 7/2016 | Yamazaki et al. |
| 10,193,078 B2 | 1/2019 | Ito et al. |
| 10,547,020 B2 | 1/2020 | Jang et al. |
| 11,401,268 B2 | 8/2022 | Seo et al. |
| 2008/0032123 A1 | 2/2008 | Spindler et al. |
| 2011/0042655 A1 | 2/2011 | Kim et al. |

FOREIGN PATENT DOCUMENTS

| | | |
|---|---|---|
| JP | 2001-131434 A | 5/2001 |
| JP | 2004-179142 A | 6/2004 |
| JP | 2008-091198 A | 4/2008 |
| JP | 2011-504536 A | 2/2011 |
| KR | 10-2012-0077301 A | 7/2012 |
| KR | 10-1201696 B1 | 11/2012 |
| KR | 10-2014-0059713 A | 5/2014 |
| KR | 10-2016-0005196 A | 1/2016 |
| KR | 10-2018-0013536 A | 2/2018 |
| KR | 10-2019-0088651 A | 7/2019 |
| KR | 10-2020-0082022 A | 7/2020 |

OTHER PUBLICATIONS

Korean Notice of Allowance for KR Application No. 10-2020-0130451, dated Apr. 8, 2025, 3 pages.

*Primary Examiner* — Andrew K Bohaty
(74) *Attorney, Agent, or Firm* — Womble Bond Dickinson (US) LLP

(57) ABSTRACT

A light-emitting device includes: a first electrode; a second electrode facing the first electrode; and an interlayer between the first electrode and the second electrode and including an emission layer stack, wherein the emission layer stack includes: a first emission layer including a first host and a first dopant; and a second emission layer including a second host, a second dopant, and an electron transport compound, wherein the first host and the second host are different compounds from each other, the first emission layer is in contact with the second emission layer, and the second emission layer is closer to the second electrode than the first emission layer.

20 Claims, 2 Drawing Sheets

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2020-0130451, filed on Oct. 8, 2020, in the Korean Intellectual Property Office, the entire content of which is hereby incorporated by reference.

BACKGROUND

1. Field

One or more embodiments of the present disclosure relate to a light-emitting device and an electronic apparatus including the same.

2. Description of Related Art

Light-emitting devices are self-emission devices that have wide viewing angles, high contrast ratios, short response times, and excellent characteristics in terms of brightness, driving voltage, and response speed, compared to other devices in the art.

In a light-emitting device, a first electrode is on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to thereby generate light.

SUMMARY

One or more embodiments include a device with improved efficiency and lifespan compared to other devices in the art.

Additional aspects of embodiments will be set forth in part in the description which follows and, in part, will be apparent from the description, or may be learned by practice of the presented embodiments of the disclosure.

According to one or more embodiments, a light-emitting device includes:
a first electrode,
a second electrode facing the first electrode, and
an interlayer between the first electrode and the second electrode and including an emission layer, wherein:
the emission layer stack includes a first emission layer including a first host and a first dopant, and a second emission layer including a second host, a second dopant, and an electron transport compound, wherein:
the first host and the second host are different compounds from each other,
the first emission layer is in contact with the second emission layer, and
the second emission layer is positioned in a direction of the second electrode.

According to one or more embodiments, an electronic apparatus includes the light-emitting device.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
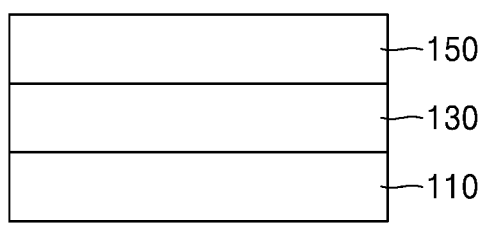
FIG. 1 is a schematic view of a light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

In a light-emitting device including a single-layered emission layer of the related art, such a single-layered emission layer, for example, a blue emission layer, may include (e.g., consist of) a single host and a single dopant. In the case of the existing host, the host has stronger electron characteristics than hole characteristics so that excitons are formed at the interface between an emission layer and an electron blocking layer. In addition, to improve efficiency, a fast hole transport compound is used for a hole transport layer to maximize or increase the exciton concentration at the interface between the emission layer and the electron blocking layer. Accordingly, a triplet-triplet annihilation (TTA) component may be improved, thereby increasing the efficiency. Further, a way of adopting an additional hole transport layer may be also used. In more detail, an additional hole transport layer that exhibits fast charge mobility characteristics and is capable of reducing driving voltage may be co-deposited on an existing structure including a hole transport layer.

However, in this case, excitons are formed at the interface between an emission layer and an electron blocking layer so that the electron blocking layer is deteriorated, thereby increasing efficiency, but reducing a lifespan.

Also, a way of increasing efficiency may be used by, in a light-emitting device including a double-layered emission layer of the related art, improving a TTA component by generating excitons at the interface between two emission layers.

An aspect of embodiments of the present disclosure provides a light-emitting device including:
a first electrode;
a second electrode facing the first electrode;
an interlayer between the first electrode and the second electrode and including an emission layer stack, wherein:
the emission layer stack includes a first emission layer including a first host and a first dopant, and a second emission layer including a second host, a second dopant, and an electron transport compound, wherein:
the first host and the second host are different compounds from each other,
the first emission layer is in contact (e.g., physical contact) with the second emission layer, and the second emission layer is positioned in a direction of the second electrode.

In an embodiment, the first electrode may be an anode, the second electrode may be a cathode, and the light-emitting device may further include a hole transport region between the first electrode and the emission layer stack and including a hole injection layer, a hole transport layer, electron blocking layer, or any combination thereof.

In one or more embodiments, the first electrode may be an anode, the second electrode may be a cathode, and the light-emitting device may further include an electron transport region between the second electrode and the emission layer stack and including a hole blocking layer, an electron transport layer, an electron injection layer, or any combination thereof.

The hole transport region and the electron transport region will be further described below.

In an embodiment, the emission layer stack may emit blue light. In an embodiment, the emission layer stack including the first emission layer and the second emission layer may emit blue light regardless of what kind of light each of the first emission layer and the second emission layer emits. In one or more embodiments, the first emission layer may emit white light, the second emission layer may emit blue light, and the emission layer stack including the first emission layer and the second emission layer may emit blue light. In one or more embodiments, the first emission layer may emit blue light, the second emission layer may emit white light, and the emission layer stack including the first emission layer and the second emission layer may emit blue light. In one or more embodiments, the first emission layer may emit blue light, the second emission layer may emit blue light, and the first dopant and the second dopant respectively included in the first emission layer and the second emission layer may all be blue dopants. In one or more embodiments, the first dopant included in the first emission layer and the second dopant included in the second emission layer may be identical to or different from each other.

In one or more embodiments, the first emission layer may emit blue light.

In one or more embodiments, the second emission layer may emit blue light.

In an embodiment, hole mobility ($M_H$) and electron mobility ($M_E$) of the electron transport compound may satisfy Equation (1):

$$M_H \leq M_E \times 0.95 \tag{1}$$

Equation (1) is expressed by a formula that the electron transport compound has both a hole-transporting ability and an electron-transporting ability but the electron-transporting ability is equal to or at least slightly greater than the hole-transporting ability.

Regarding the electron-transporting ability, when the electron transport compound satisfying Equation (1) is used together with the second host and the second dopant that are included in the second emission layer, the electron mobility characteristics of the second host may be improved. Accordingly, a zone in which excitons are generated at the interface between the first emission layer and the second emission layer becomes significantly narrow, thereby leading to maximization or an increase of a TTA component. Thus, problems of reducing the lifespan related to emission at the interface between the first emission layer and the second emission layer may be solved or improved, and concurrently (e.g., simultaneously), the efficiency may be also maximized or increased.

In an embodiment, the electron transport compound may include: a CN moiety-containing compound; a triazole moiety-containing compound; an oxadiazole moiety-containing compound; an aromatic imidazole moiety-containing compound; a naphthalene diimide moiety-containing compound; a perylene moiety-containing compound; a boron-containing compound; a compound including anthracene and a phosphine oxide moiety; a triazine moiety-containing compound; a pyridine moiety-containing compound; a pyrimidine moiety-containing compound; and/or a carbazole moiety-containing compound.

The aromatic imidazole moiety may refer to, for example, the following moiety (where substituents are omitted for clarity):

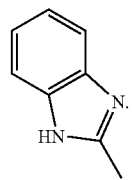

The naphthalene diimide moiety may refer to, for example, the following moiety (where substituents are omitted for clarity):

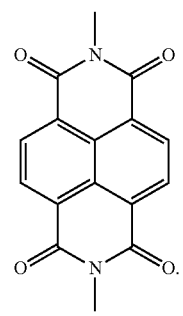 [SMILES: CN1C(=O)c2ccc3c4c(ccc(c24)C1=O)C(=O)N(C)C3=O]

The compound including anthracene and a phosphine oxide moiety may be represented by Formula 1:

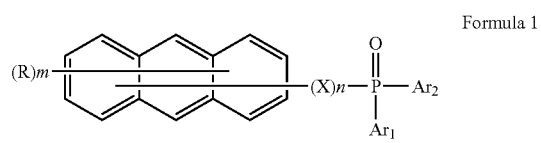

wherein, in Formula 1,

R, $Ar_1$, $Ar_2$, and X may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and m and n may each independently an integer from 1 to 5.

In an embodiment, the electron transport compound may include one of the following compounds:

5
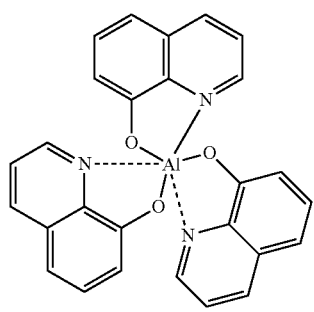
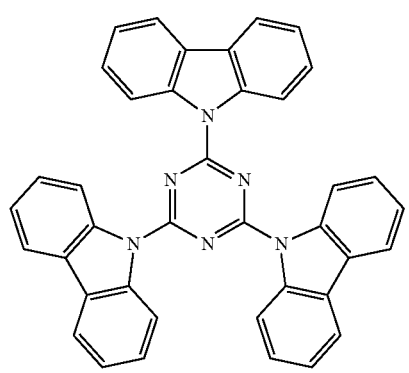
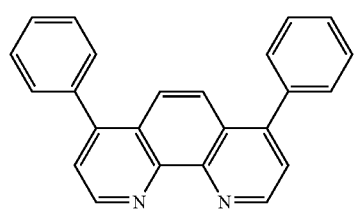
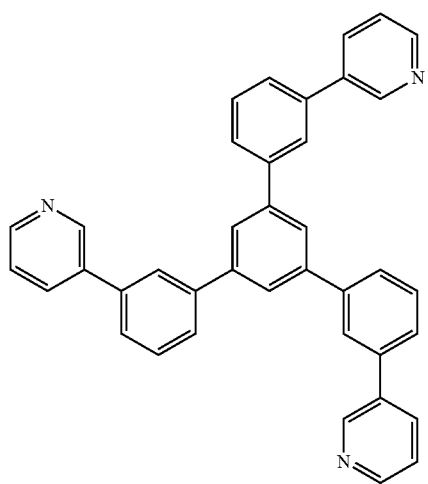
6
1
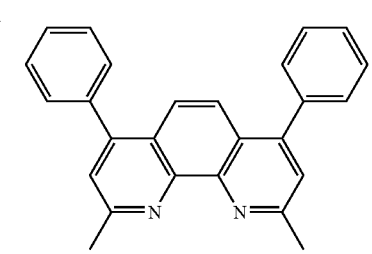
2
3
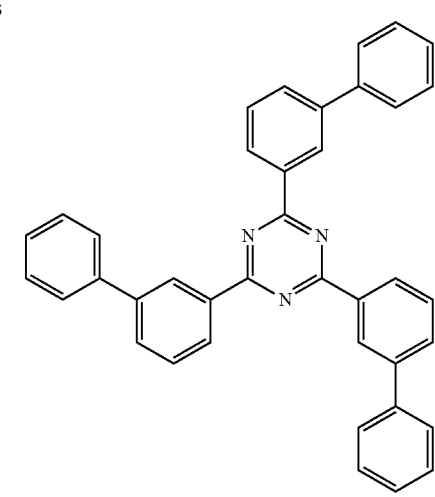
4
5
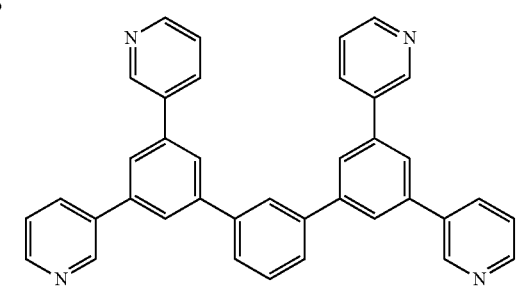
6
7
8
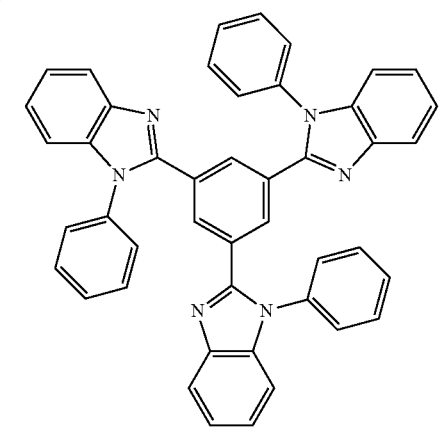

-continued
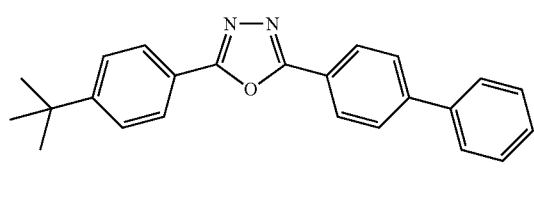
9
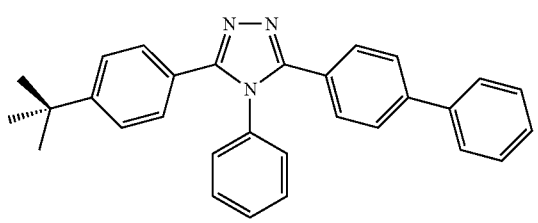
10
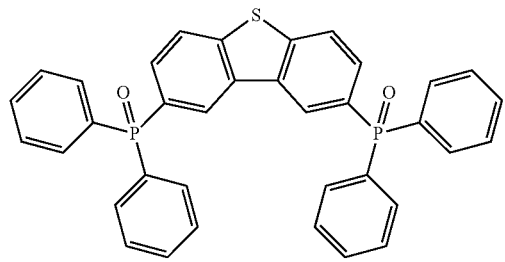
11
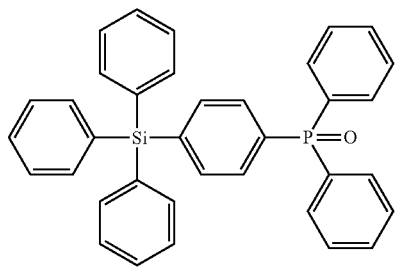
12
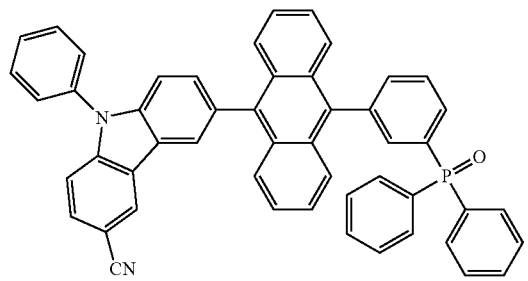
13
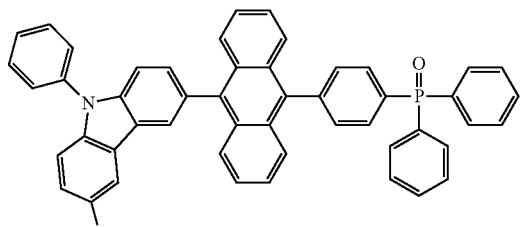
14
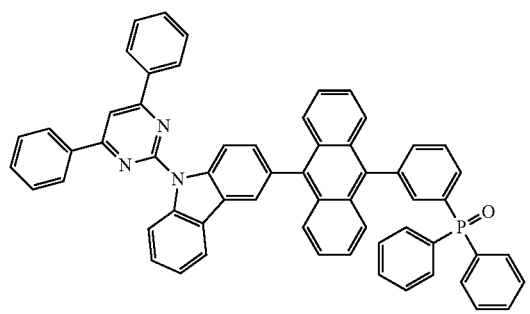
15
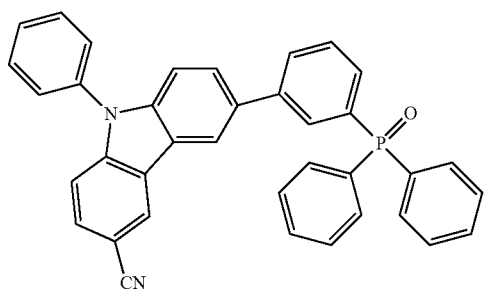
16
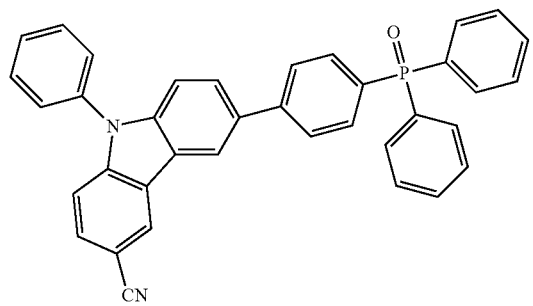
17
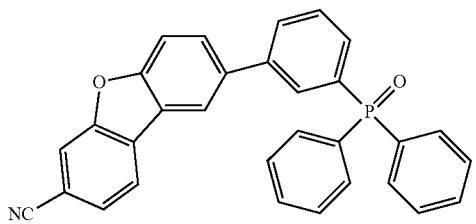
18

-continued
19
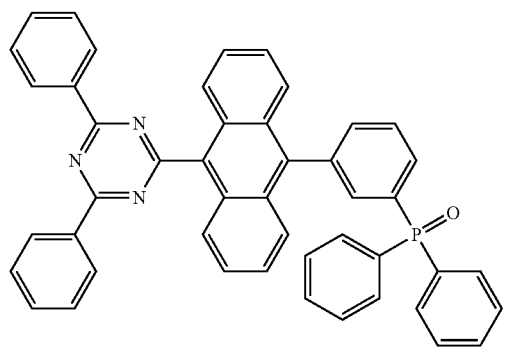
20
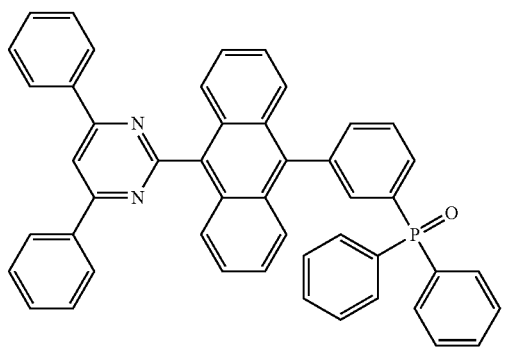
21
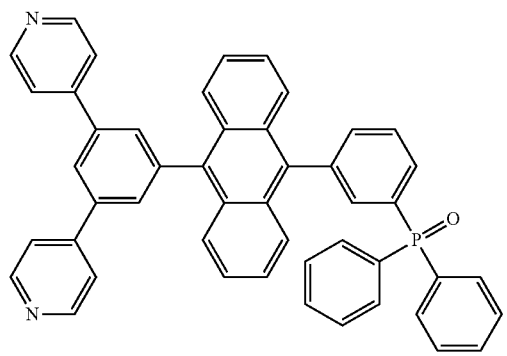
22
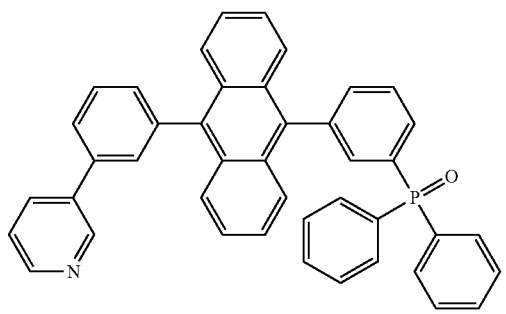
23
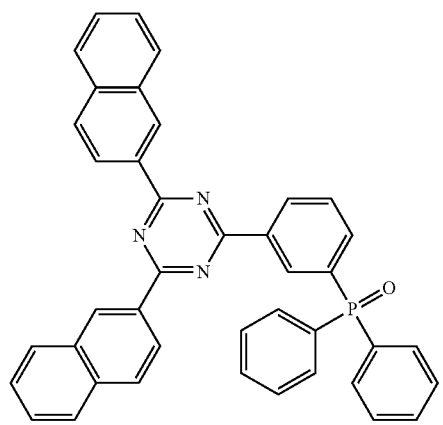
24
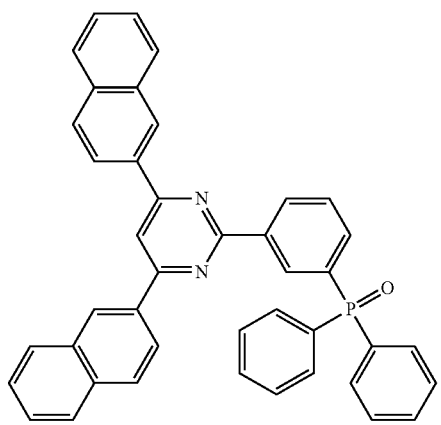
25
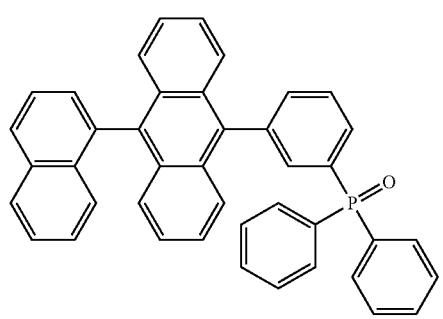
26
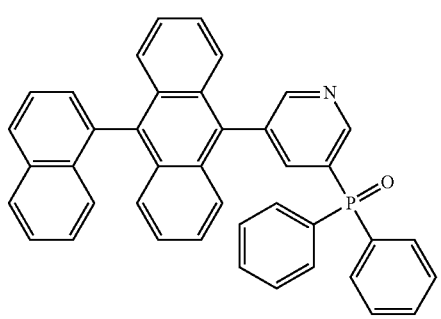

-continued
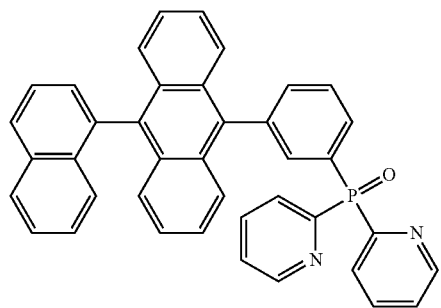
27
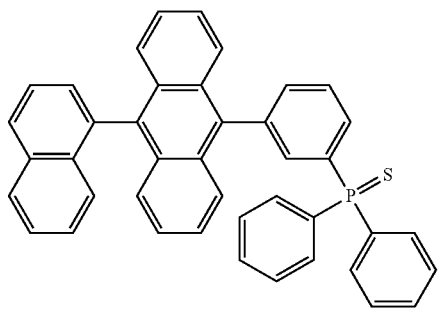
28
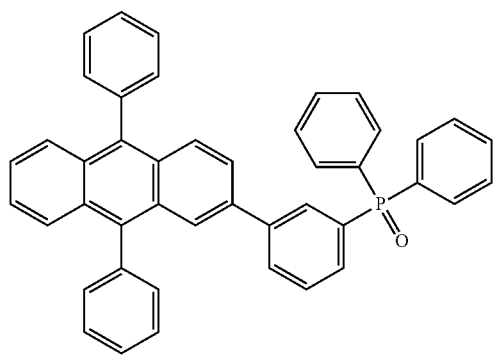
29
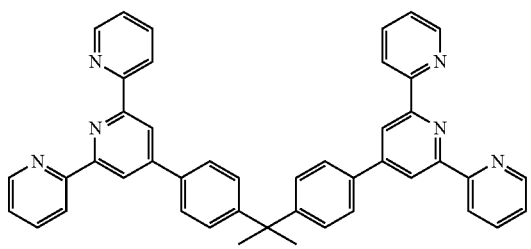
30
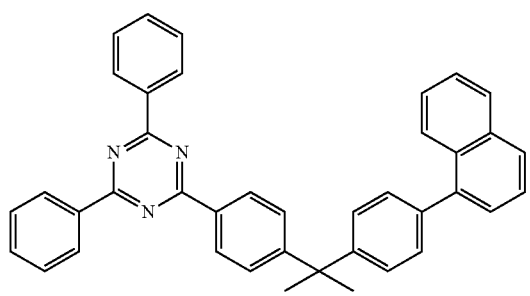
31
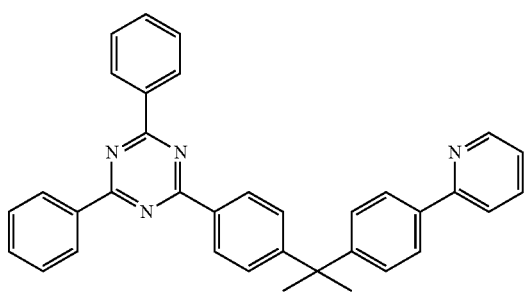
32
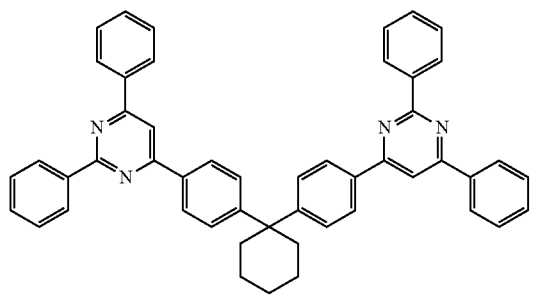
33
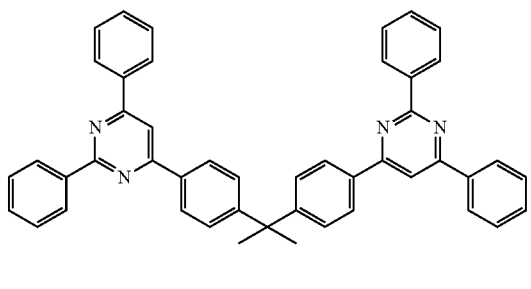
34

35
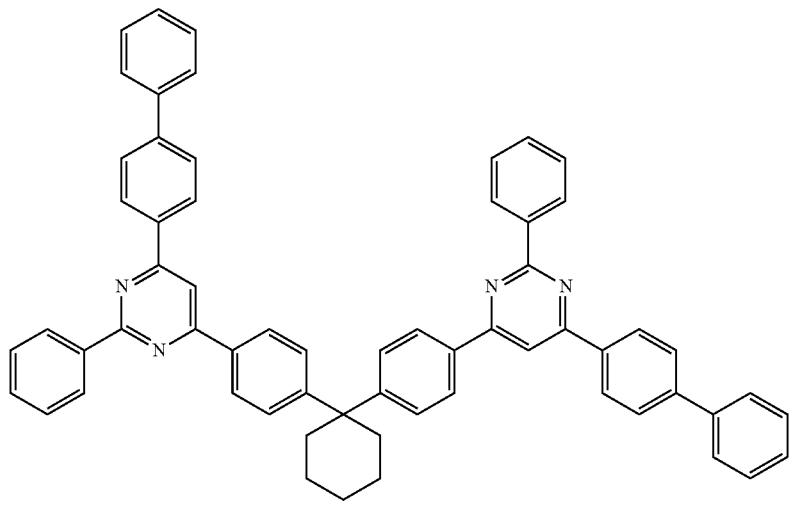
36
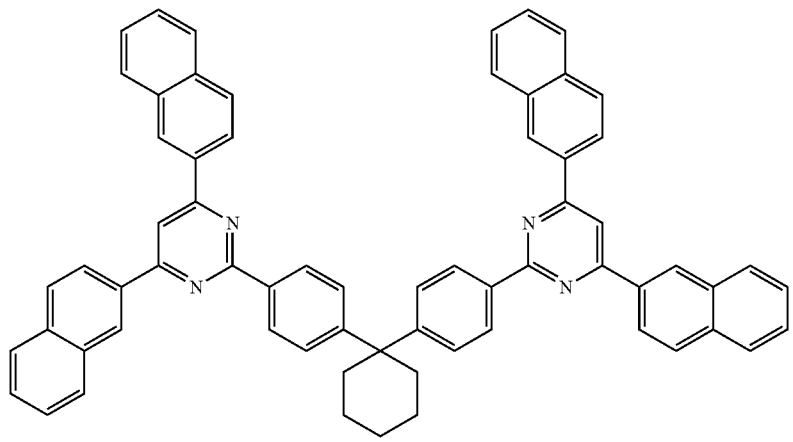
37
38
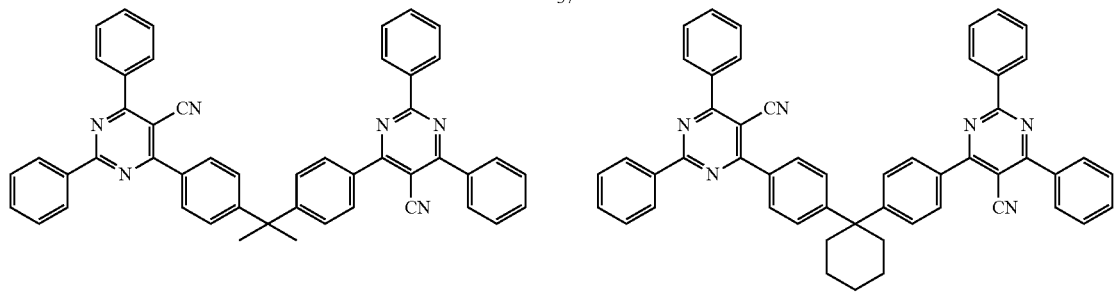
39
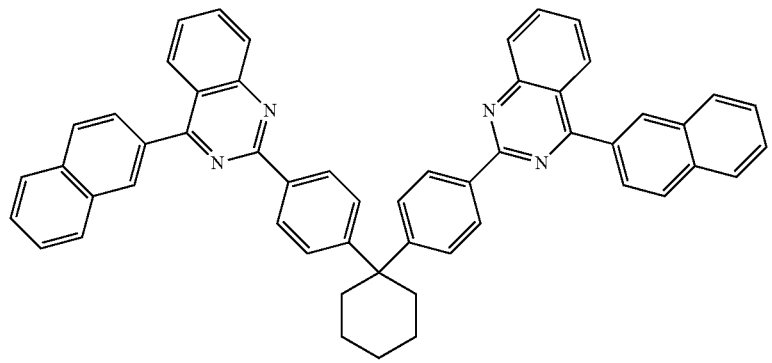

40
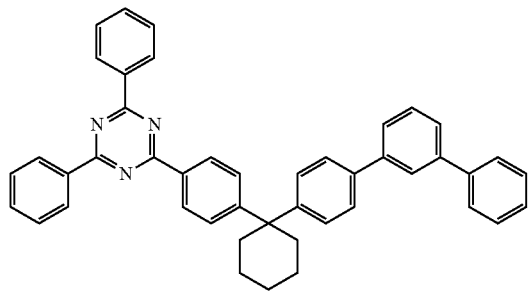
41
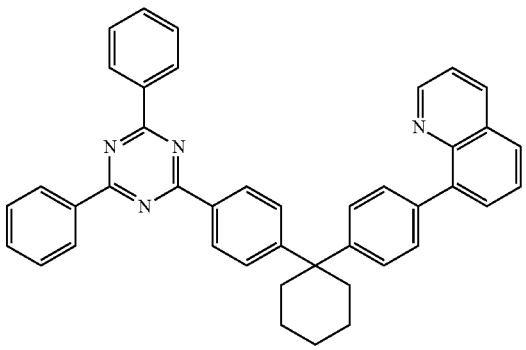
42
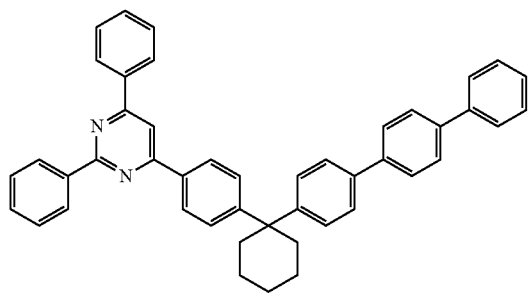
43
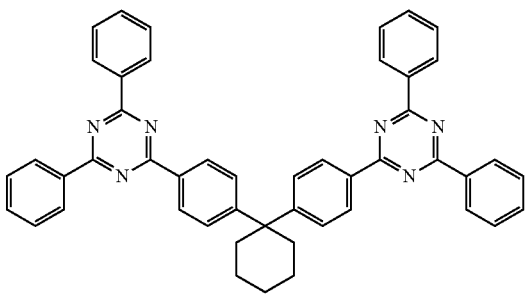
44
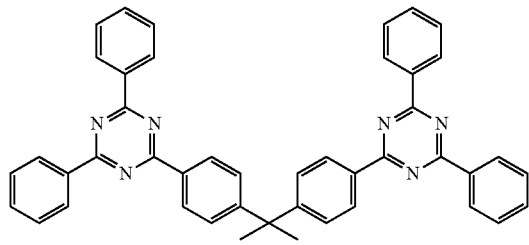
45
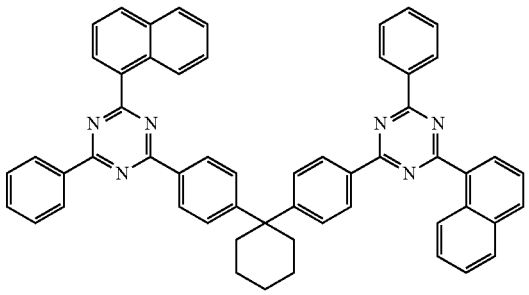
46
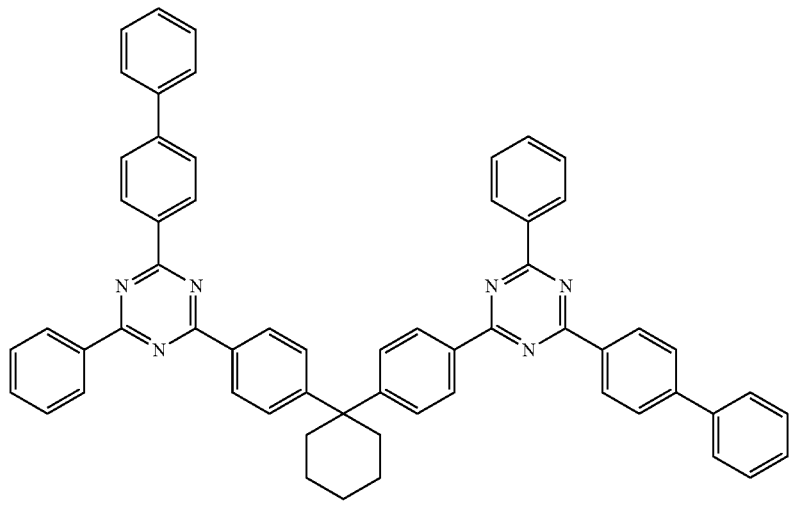

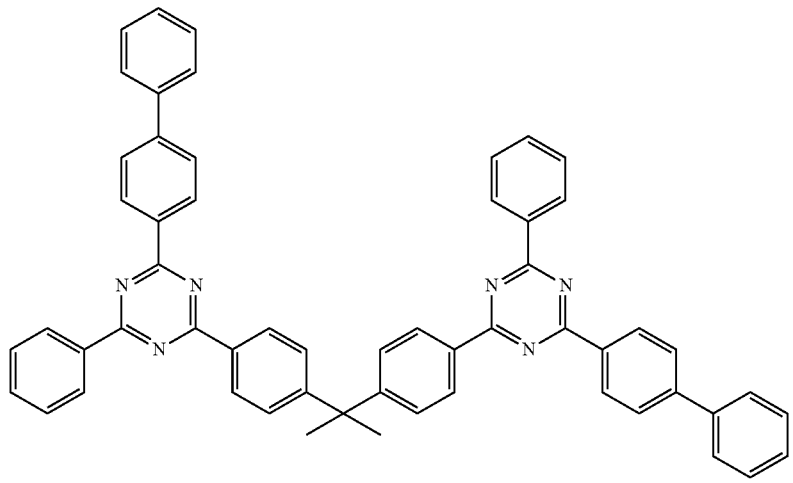
47
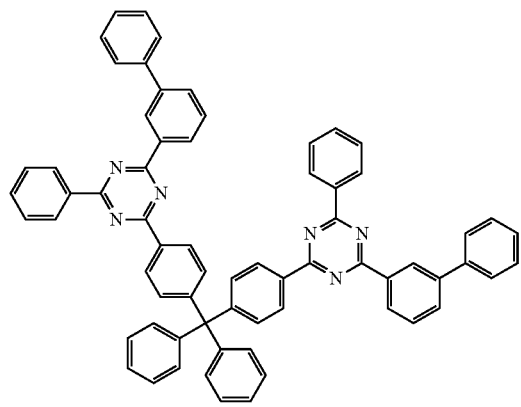
48
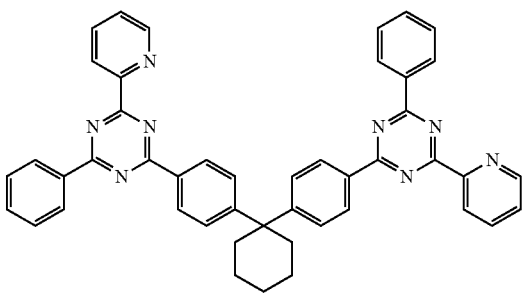
49
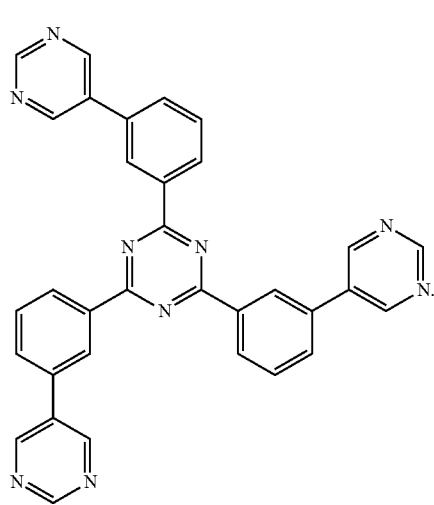
50

In an embodiment, an amount of the electron transport compound in the second emission layer may be equal to or less than 20 wt % based on the total amount of compounds in the second emission layer. In one or more embodiments, the amount of the electron transport compound in the second emission layer may exceed 0 wt % or may be equal to or less than 20 wt % based on the total amount of compounds in the second emission layer. In one or more embodiments, the amount of the electron transport compound in the second emission layer may be in a range of about 5 wt % to about 15 wt %.

When the amount of the electron transport compound in the second emission layer exceeds 20 wt %, the efficiency and lifespan of the light-emitting device are beyond the optimum state.

In an embodiment, the first emission layer and the second emission layer may emit light according to a delayed fluorescence mechanism.

In one or more embodiments, the first dopant and the second dopant may be any suitable dopant capable of delayed fluorescence. In one or more embodiments, the first dopant and the second dopant may be identical to or different from each other.

In an embodiment, holes injected from the first electrode and electrons injected from the second electrode may recombine at the interface between the first emission layer and the second emission layer.

In an embodiment, the first host may be the following compound:

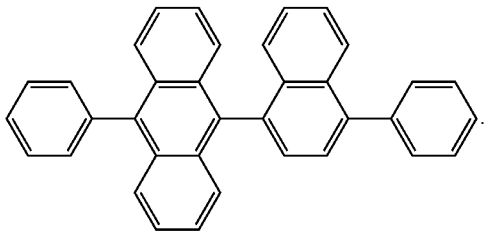 [SMILES: c1ccc(-c2ccc(-c3c4ccccc4c(-c4ccccc4)c4ccccc34)c3ccccc23)cc1]

In an embodiment, the second host may be the following compound:

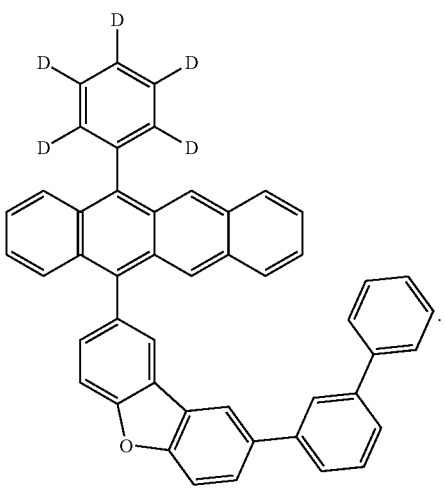 [SMILES: [2H]c1c([2H])c([2H])c(-c2c3ccccc3c(-c3ccc4oc5ccc(-c6cccc(-c7ccccc7)c6)cc5c4c3)c3cc4ccccc4cc23)c([2H])c1[2H]]

Another aspect of embodiments of the present disclosure provides an electronic apparatus including the light-emitting device.

In an embodiment, the electronic apparatus may further include a thin-film transistor, wherein:
the thin-film transistor may include a source electrode and a drain electrode (or an activation layer), and
the first electrode of the light-emitting device may be electrically coupled to at least one selected from the source electrode and the drain electrode of the thin-film transistor.

In an embodiment, the electronic apparatus may further include a color filter, a color conversion layer, a touch screen layer, a polarizing layer, or any combination thereof.

The term "interlayer," as used herein, refers to a single layer and/or all of a plurality of layers between a first electrode and a second electrode of a light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally under the first electrode 110 or above the second electrode 150. As the substrate, a glass substrate and/or a plastic substrate may be used. In an embodiment, the substrate may be a flexible substrate, and may include plastics having excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. In an embodiment, when the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, the first electrode 110 may have a three-layered structure of ITO/Ag/ITO.

Interlayer 130

The interlayer 130 is on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include a metal-containing compound, such as an organometallic compound, an inorganic material, such as quantum dots, and/or the like, in addition to various suitable organic materials.

The interlayer 130 may include, i) two or more emission layers sequentially stacked between the first electrode 110 and the second electrode 150 and ii) a charge generation layer between the two emission layers. When the interlayer 130 includes the emission layers and the charge generation layer as described above, the light-emitting device 10 may be a tandem light-emitting device.

The charge generation layer may include a p-charge generation layer and/or an n-charge generation layer.

In an embodiment, the p-charge generation layer may include a quinone derivative, a cyano group-containing compound, or any combination thereof.

In an embodiment, a thickness of the p-charge generation layer may be in a range of about 0.1 Å to about 100 Å. In one or more embodiments, the thickness of the p-charge generation layer may be in a range of about 0.5 Å to about 50 Å.

In an embodiment, a thickness of the n-charge generation layer may be in a range of about 0.1 Å to about 100 Å. In one or more embodiments, the thickness of the n-charge generation layer may be in a range of about 0.5 Å to about 50 Å.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers in each structure are stacked sequentially on the first electrode 110.

The hole transport region may include a compound represented by Formula 201, a compound represented by Formula 202, or any combination thereof:

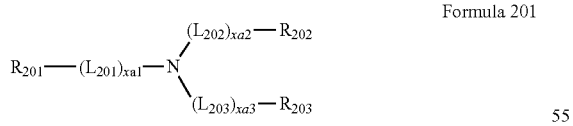

Formula 201

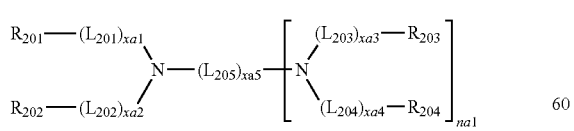

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{20}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{20}$ heterocyclic group unsubstituted or substituted with at least one $R_{10a}$, xa1 to xa4 may each independently an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (see Compound HT16 and/or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217.

CY201

CY202

CY203

CY204

CY205

-continued

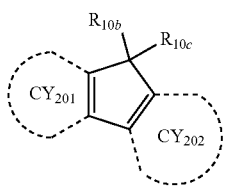

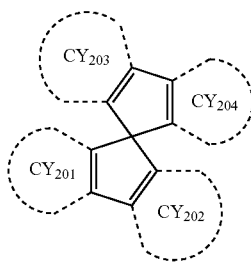

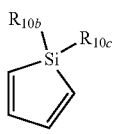

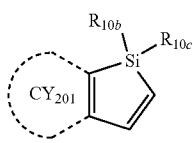

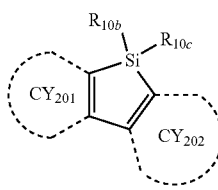

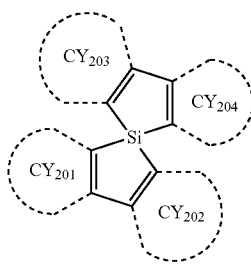

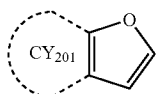

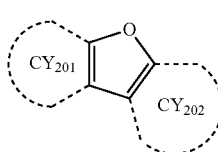

CY206

CY207

CY208

CY209

CY210

CY211

CY212

CY213

CY214

-continued

CY215

CY216

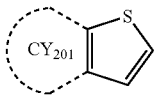

CY217

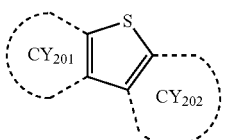

wherein, in Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$.

In one or more embodiments, ring $CY_{201}$ to ring $CY_{204}$ may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ is a group represented by one of Formulae CY201 to CY203, xa2 may be 0, and $R_{202}$ may be a group represented by one of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203, and may include at least one of groups represented by Formulae CY204 to CY217.

In or more embodiments, each of Formulae 201 and 202 may not include groups represented by Formulae CY201 to CY217.

For example, the hole transport region may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
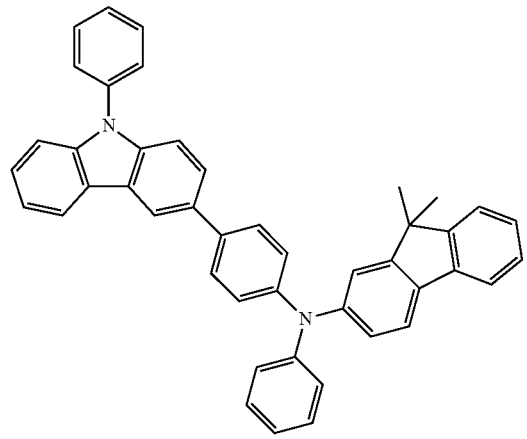
HT2
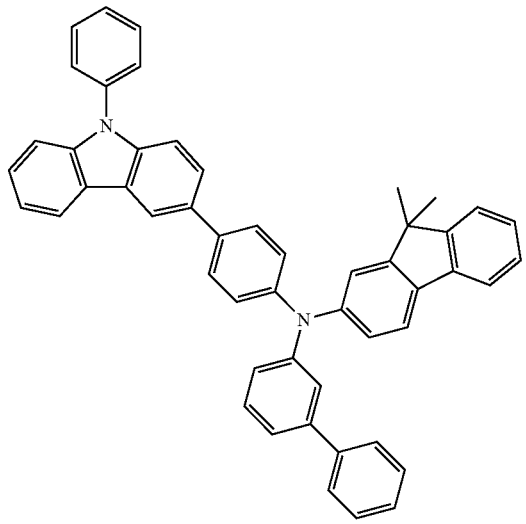
HT3
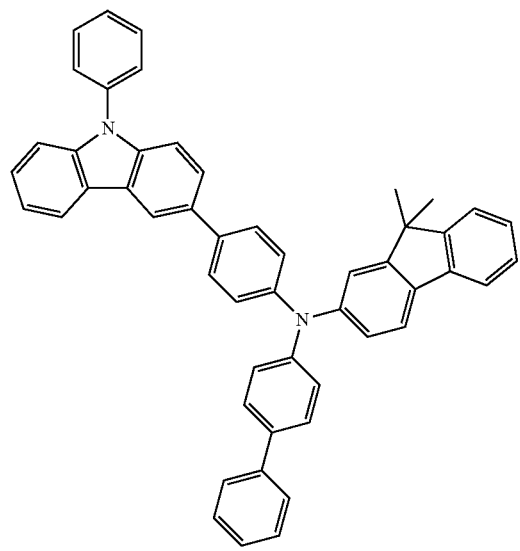
HT4
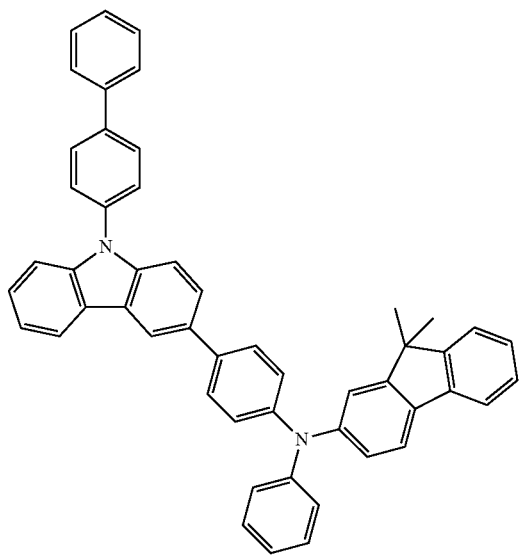
HT5
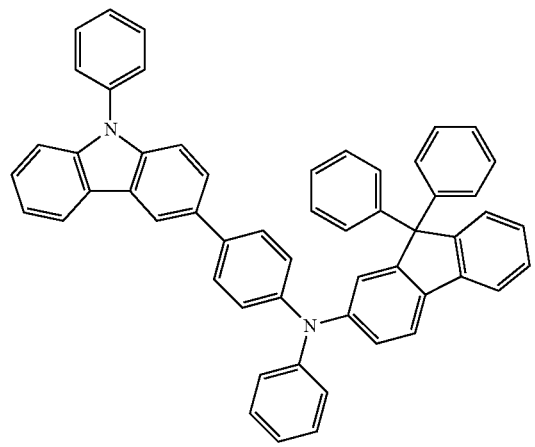
HT6
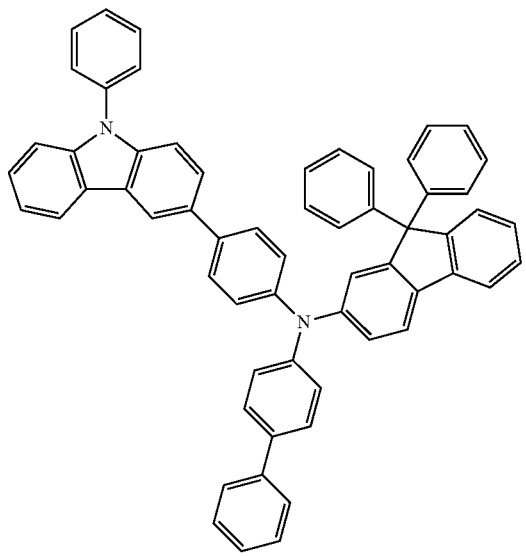

-continued
HT7
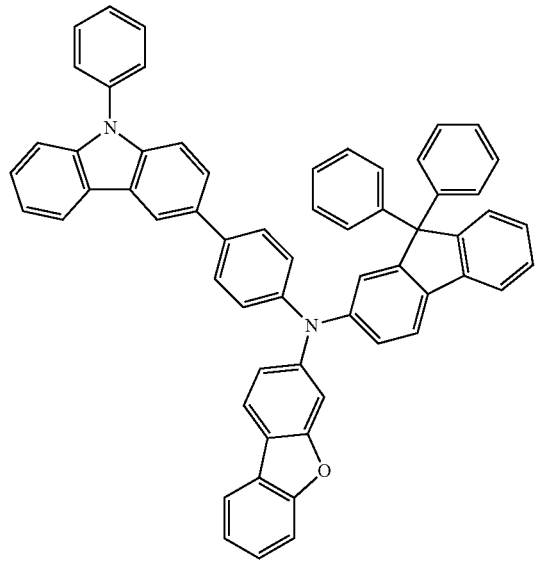
HT8
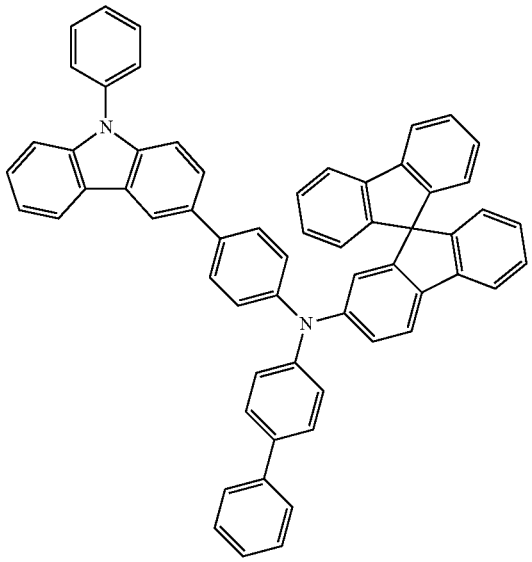
HT9
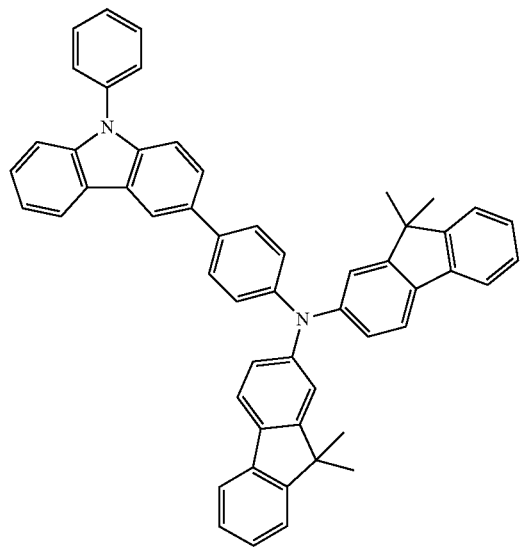
HT10
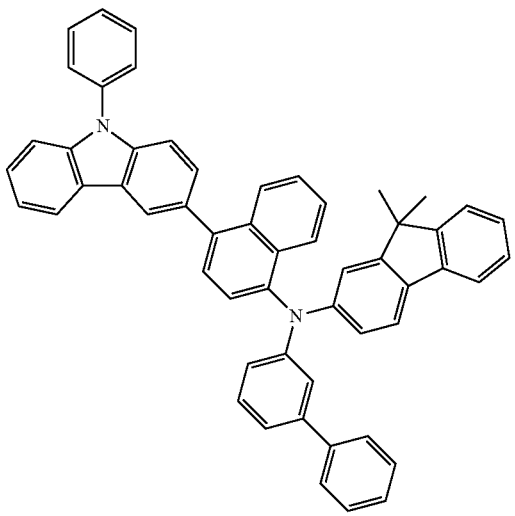
HT11
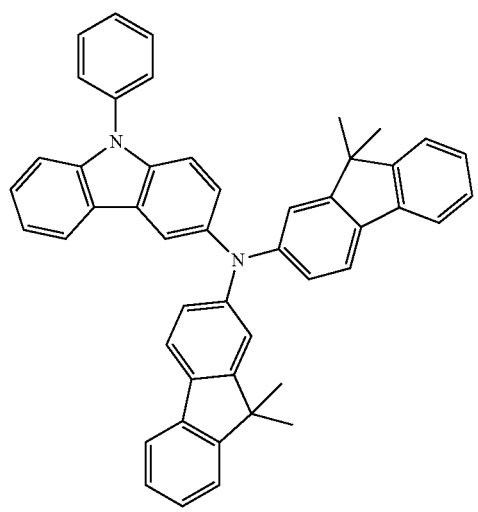
HT12
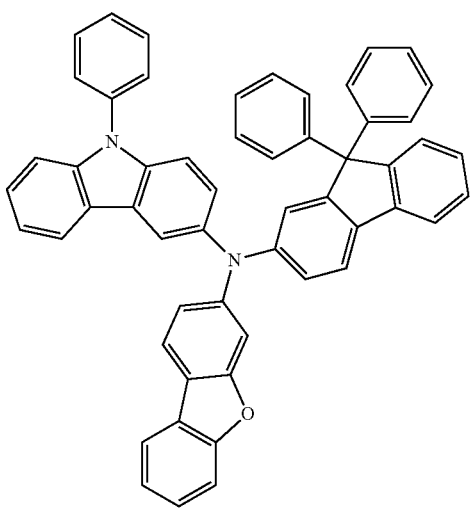

-continued
HT13
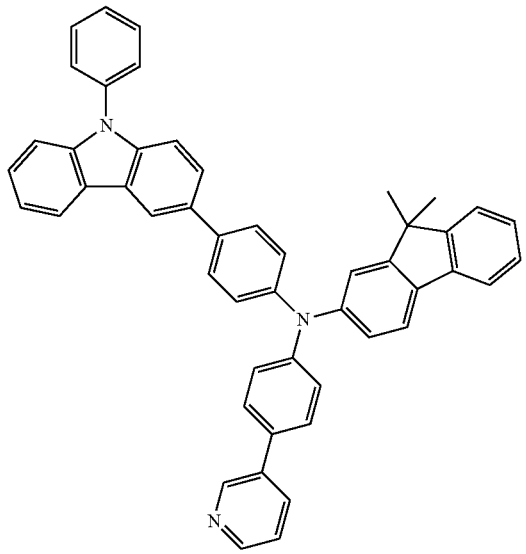
HT14
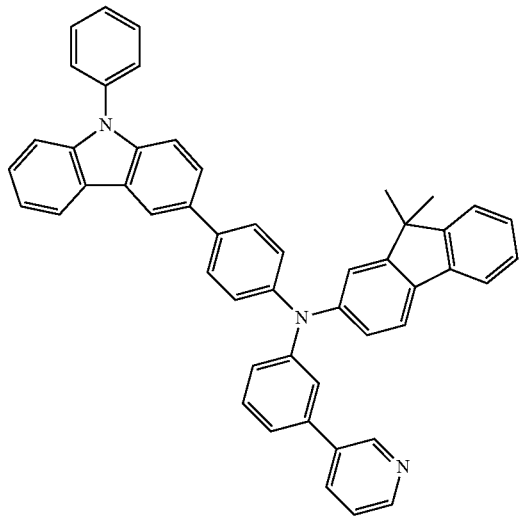
HT15
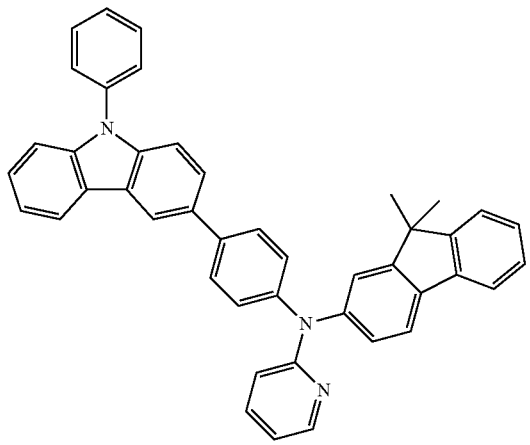
HT16
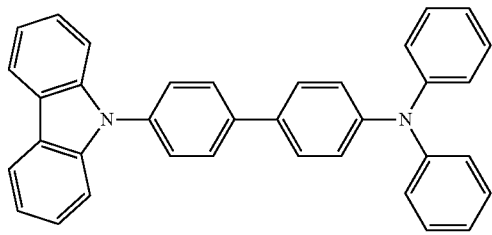
HT17
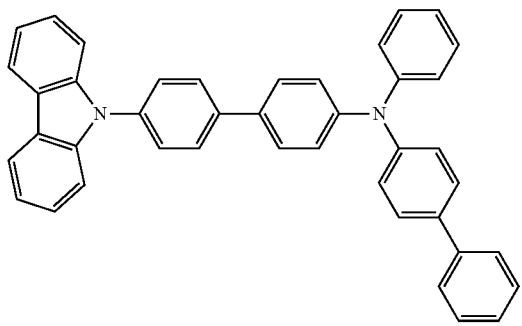
HT18
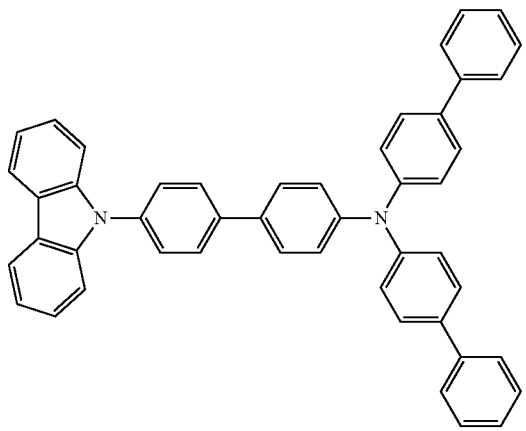

-continued
HT19
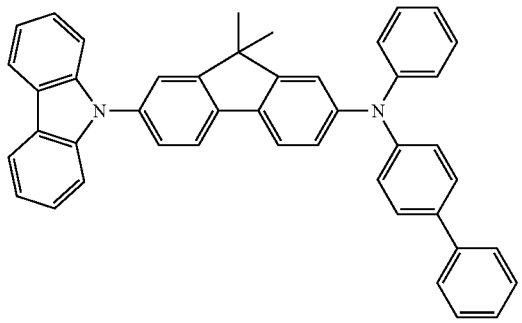
HT20
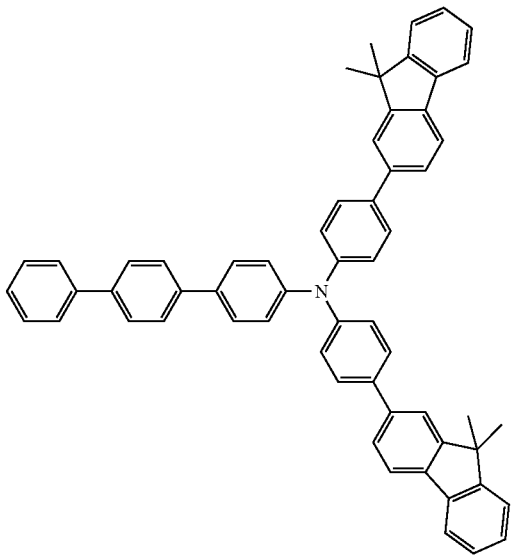
HT21
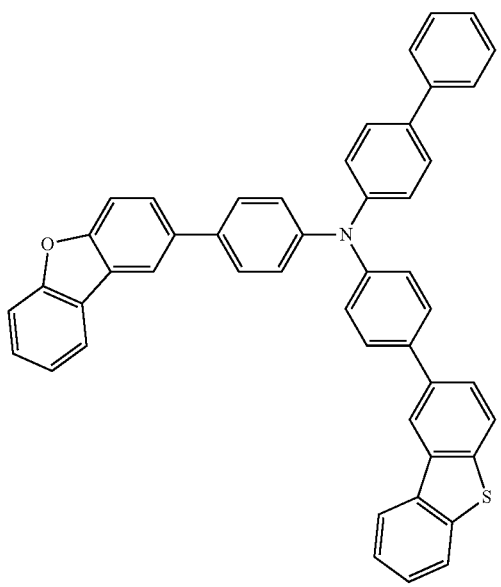
HT22
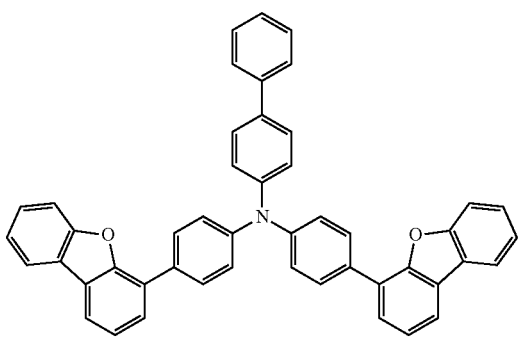
HT23
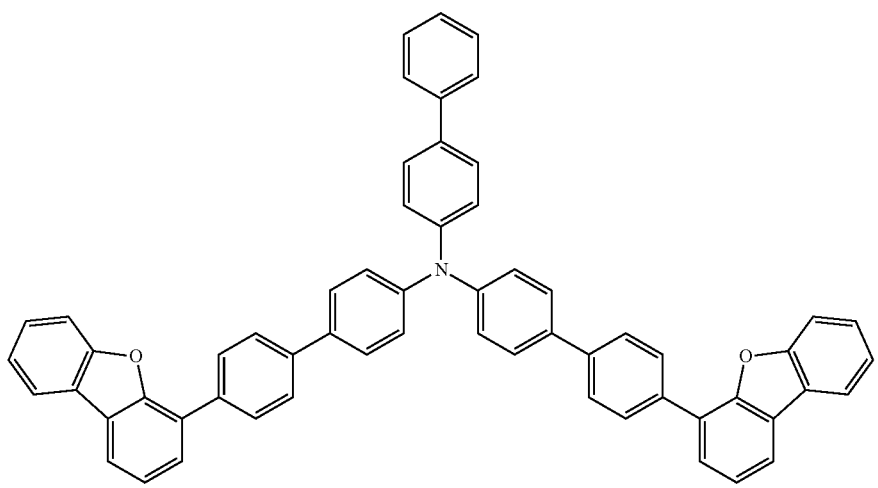

-continued
HT24
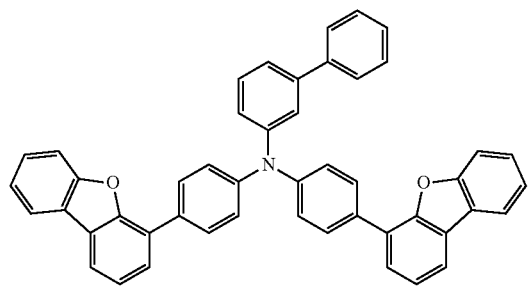
HT25
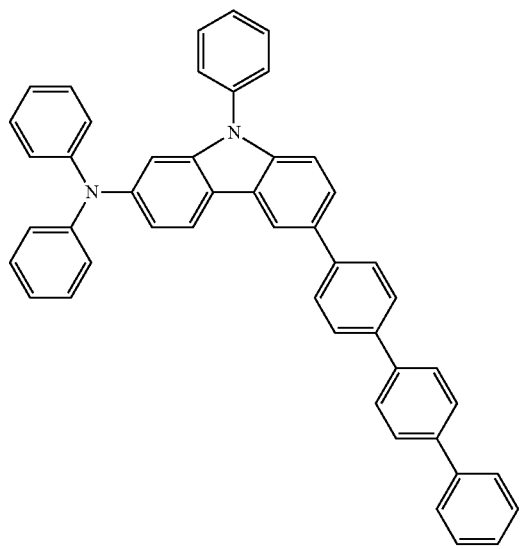
HT26
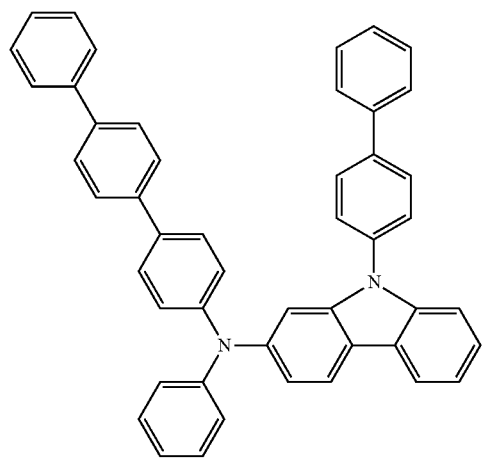
HT27
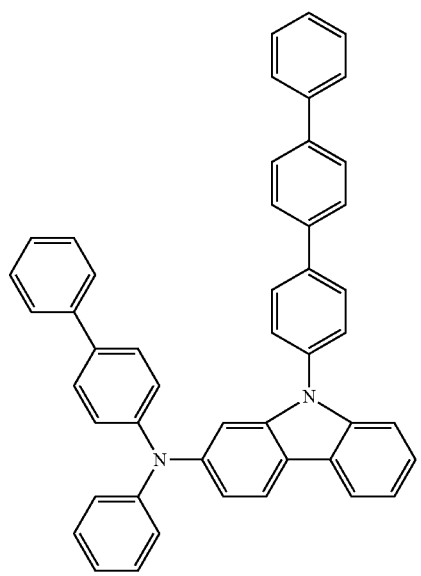
HT28
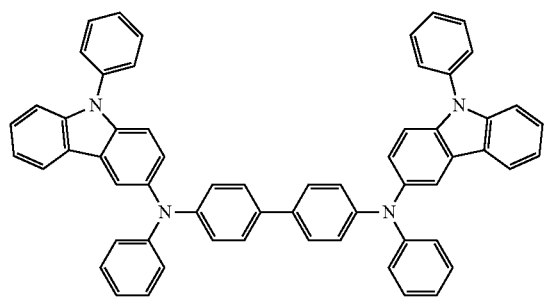
HT29
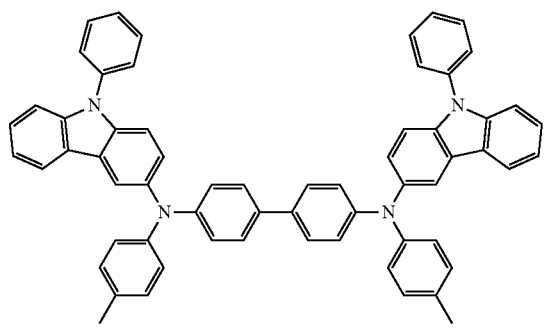

-continued
HT30
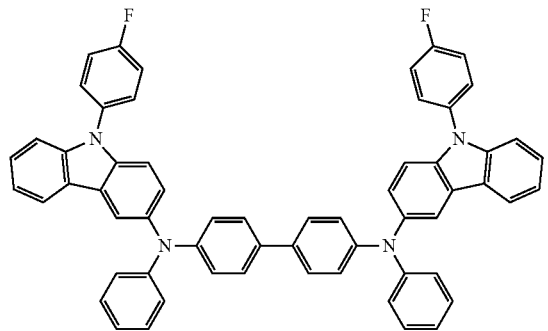
HT31
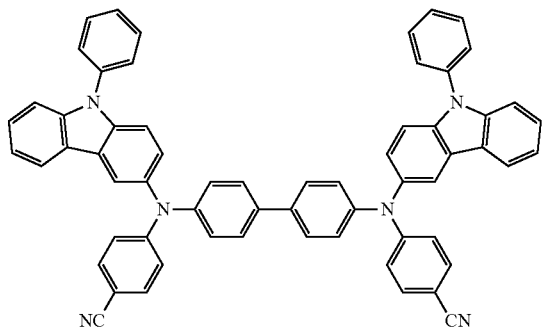
HT32
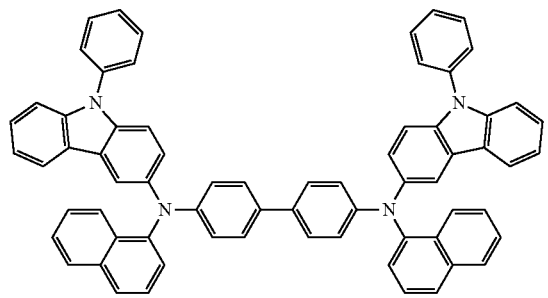
HT33
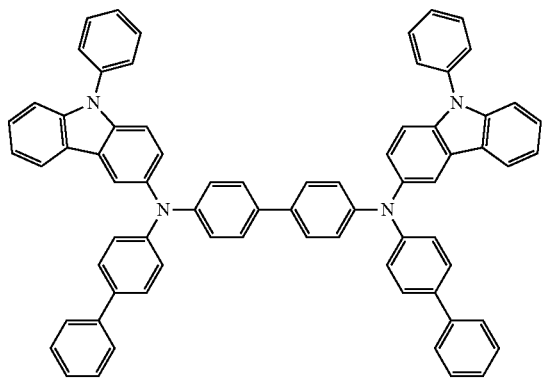
HT34
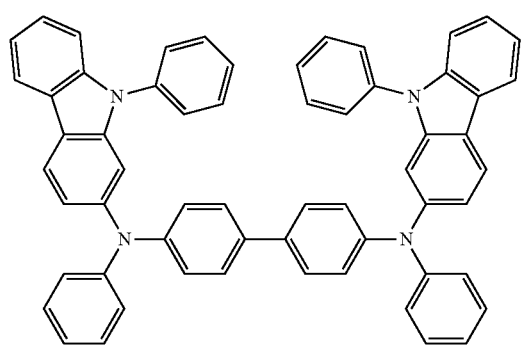
HT35
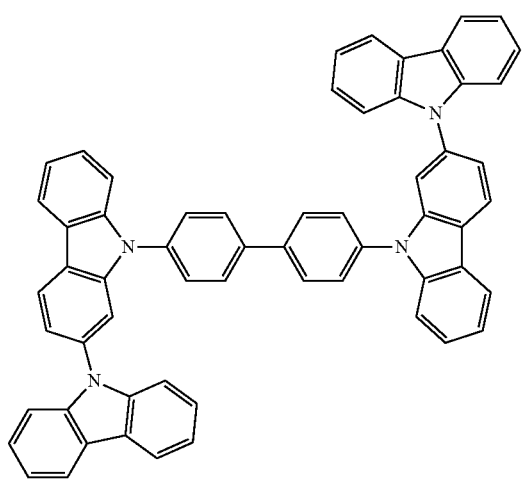

-continued
HT36
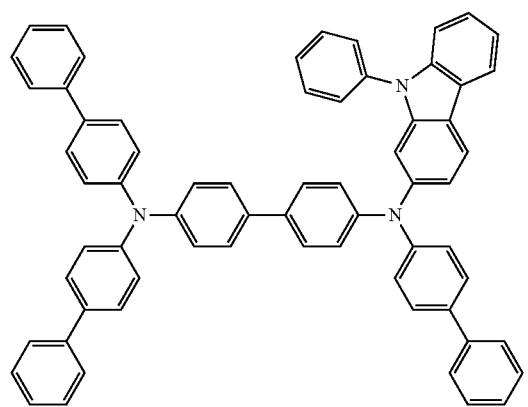
HT37
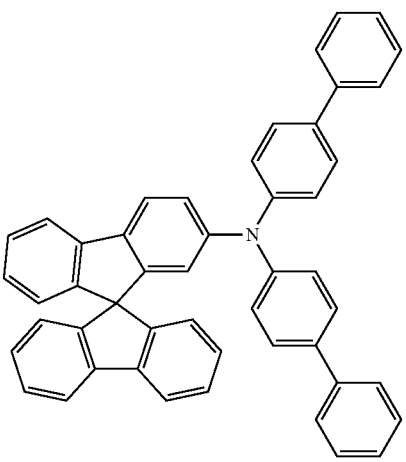
HT38
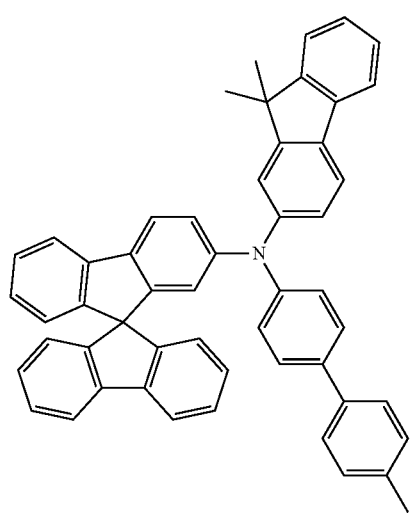
HT39
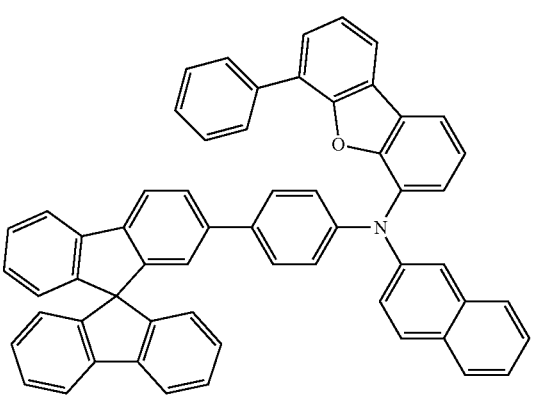
HT40
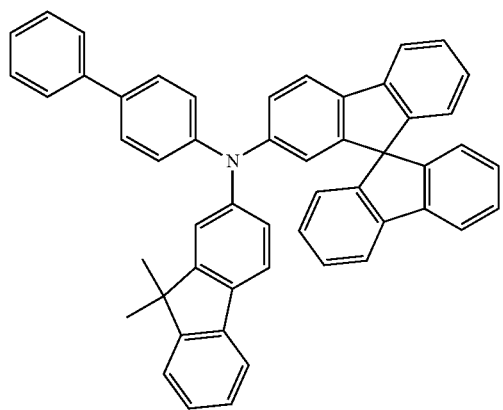
HT41
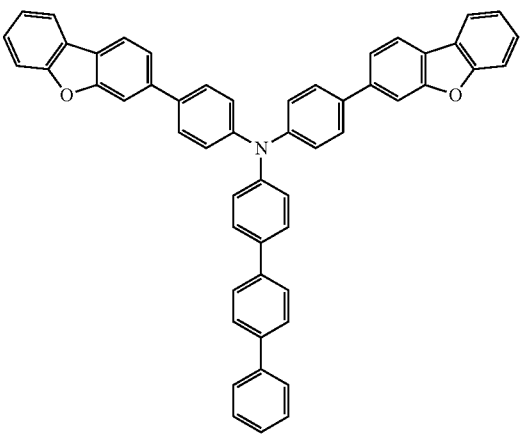

-continued
HT42
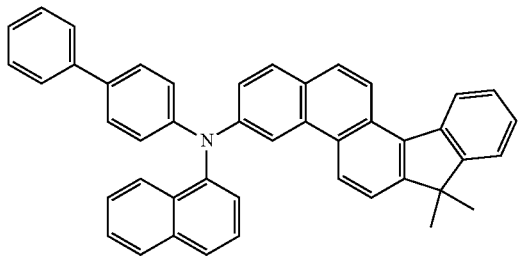
HT43
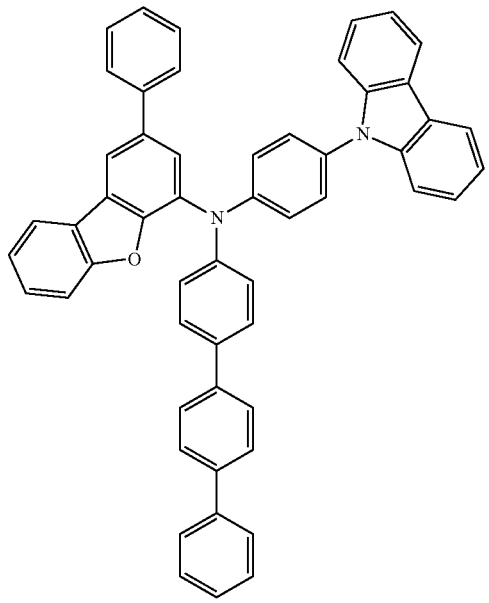
HT44
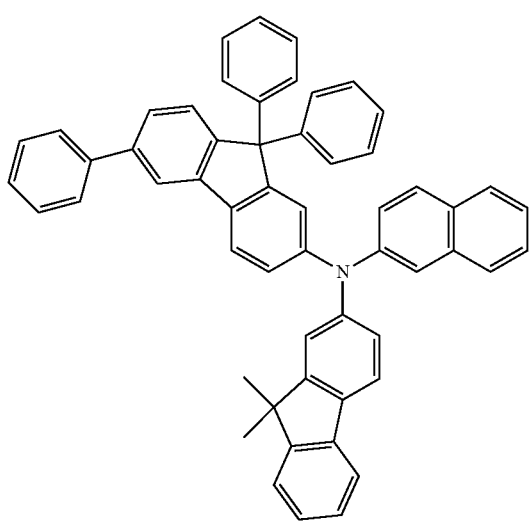

-continued
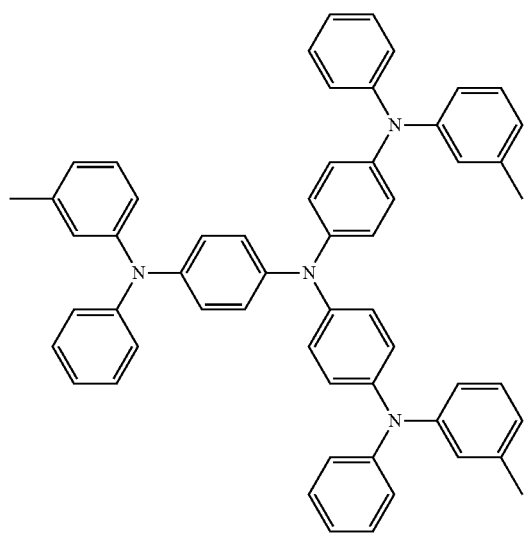
m-MTDATA
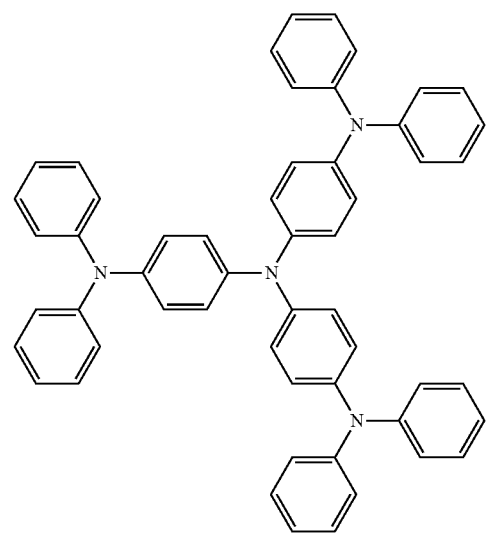
TDATA
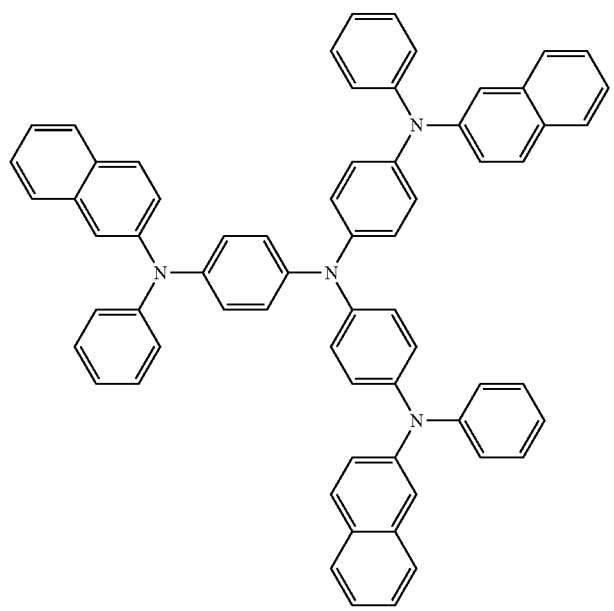
2-TNATA
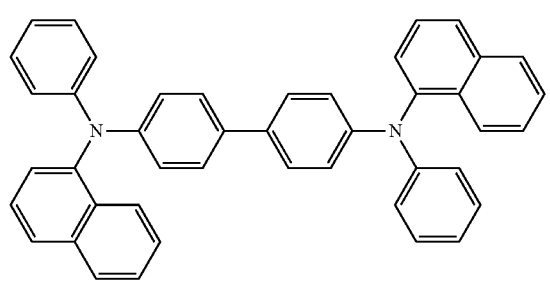
NPB -continued
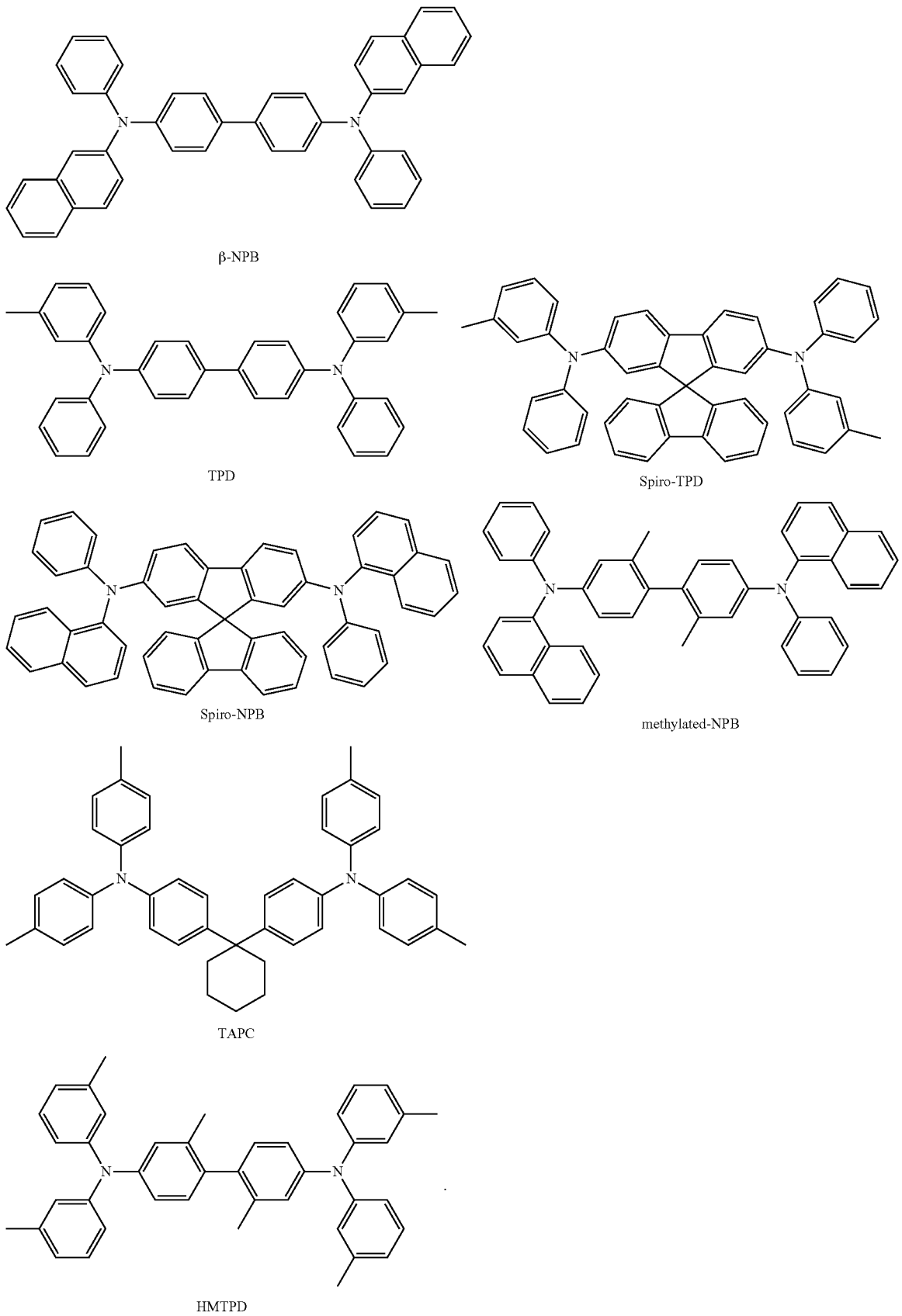

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 10 Å to about 9,000 Å, for example, about 20 Å to about 100 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the flow of electrons from the electron transport region. The emission auxiliary layer and the electron blocking layer may include the materials as described above.

p-Dopant

The hole transport region may further include, in addition to these materials, a charge-generation material for the improvement of conductive properties (e.g., electrically conductive properties). The charge-generation material may be uniformly or non-uniformly dispersed in the hole transport region (for example, in the form of a single layer including (e.g., consisting of) a charge-generation material).

The charge-generation material may be, for example, a p-dopant.

For example, a lowest unoccupied molecular orbital (LUMO) energy level of the p-dopant may be equal to or less than −3.5 eV.

In an embodiment, the p-dopant may include a quinone derivative, a cyano group-containing compound, a compound containing element EL1 and element EL2, or any combination thereof.

Examples of the quinone derivative include TCNQ, F4-TCNQ, and the like.

Examples of the cyano group-containing compound include HAT-CN, a compound represented by Formula 221, and the like:

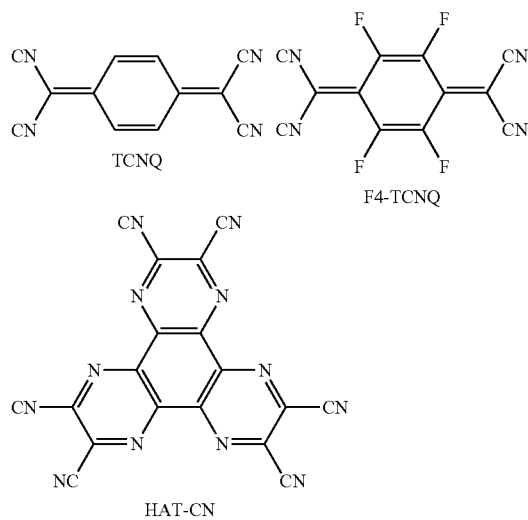

TCNQ

F4-TCNQ

HAT-CN

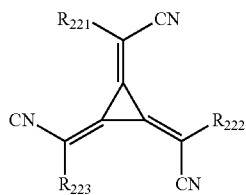

Formula 221 wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal include an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid include silicon (Si), antimony (Sb), tellurium (Te), and the like.

Examples of the non-metal include oxygen (O), halogen (for example, F, Cl, Br, I, etc.), and the like.

Examples of the compound containing element EL1 and element EL2 include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of the metal halide include alkali metal halide, alkaline earth metal halide, transition metal halide, post-transition metal halide, lanthanide metal halide, and the like.

Examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, $CuF$, $CuCl$, $CuBr$, $CuI$, etc.), silver halide (for example, $AgF$, $AgCl$, $AgBr$, $AgI$, etc.), gold halide (for example, $AuF$, $AuCl$, $AuBr$, $AuI$, etc.), and the like.

Examples of the post-transition metal halide include zinc halide (for example, $ZnF_2$, $ZnCl_2$, $ZnBr_2$, $ZnI_2$, etc.), indium halide (for example, $InI_3$, etc.), tin halide (for example, $SnI_2$, etc.), and the like.

Examples of the lanthanide metal halide include $YbF$, $YbF_2$, $YbF_3$, $SmF_3$, $YbCl$, $YbCl_2$, $YbCl_3$, $SmCl_3$, $YbBr$, $YbBr_2$, $YbBr_3$, $SmBr_3$, $YbI$, $YbI_2$, $YbI_3$, $SmI_3$, and the like.

Examples of the metalloid halide include antimony halide (for example, $SbCl_5$, etc.) and the like.

Examples of the metal telluride include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

Emission Layer in Interlayer 130

When the light-emitting device 10 is a full-color light-emitting device, the emission layer may be patterned into a red emission layer, a green emission layer, and/or a blue emission layer, according to a sub-pixel. The emission layer may have a stacked structure of two or more layers of a red emission layer, a green emission layer, and a blue emission layer, in which the two or more layers contact (e.g., physically contact) each other or are separated from each other. In one or more embodiments, the emission layer may include two or more materials of a red light-emitting material, a green light-emitting material, and a blue light-emitting material, in which the two or more materials are mixed with each other in a single layer to emit white light.

In an embodiment, a plurality of emission layers may be included in the light-emitting device.

For example, each of the plurality of emission layers may emit blue light.

In an embodiment, the emission layer may include a host and a dopant. The dopant may include a phosphorescent dopant, a fluorescent dopant, or any combination thereof.

An amount of the dopant included the emission layer may be in a range of about 0.01 parts by weight to about 15 parts by weight based on 100 parts by weight of the host.

In one or more embodiments, the emission layer may include a quantum dot.

In one or more embodiments, the emission layer may include a delayed fluorescence material. The delayed fluorescence material may act as a host or a dopant included in the emission layer.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

The first host may be a compound having strong hole characteristics. The expression "compound having strong hole characteristics," as used herein, refers to a compound that is easy to accept holes (e.g., that has a relatively higher affinity toward holes), and such characteristics may be obtained by including a hole-accepting moiety (for example, a hole-transporting (HT) moiety).

The hole-accepting moiety may be, for example, a π electron-rich heteroaromatic group (for example, a carbazole derivative or an indole derivative) or an aromatic amine group.

The second host may be a compound having strong electron characteristics. The expression "compound having strong electron characteristics," as used herein, refers to a compound that is easy to accept electrons (e.g., has a relatively higher affinity toward electrons), and such characteristics may be obtained by including an electron-accepting moiety (for example, an electron-transporting (ET) moiety).

The electron-accepting moiety may be, for example, a π-deficient heteroaromatic compound. For example, the electron-accepting moiety may be a nitrogen-containing heteroaromatic compound.

When a compound includes only either of an HT moiety or an ET moiety, the nature of the compound may be clearly defined as HT-type or ET-type.

In an embodiment, a compound may include both an HT moiety and an ET moiety. In this embodiment, simple comparison of the total number of HT moieties included in the compound with and the total number of ET moieties included in the compound may be a criterion for predicting whether the compound is HT-type or ET-type, but cannot be an absolute criterion (e.g., may not be the sole criterion). One of the reasons why it cannot be an absolute criterion is the fact that each of a single HT moiety and a single ET moiety does not have exactly the same ability to attract holes and electrons.

Thus, a relatively reliable way of determining whether a compound of a certain structure is HT-type or ET-type is to implement the compound directly in a device.

The first host and the second host may each independently include a compound represented by Formula 301:

$$[Ar_{301}]_{xb11}-[(L_{301})_{xb1}-R_{301}]_{xb21} \qquad \text{Formula 301}$$

wherein, in Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ may each be the same as described in connection with Q$_1$.

For example, when xb11 in Formula 301 is 2 or more, two or more of Ar$_{301}$(s) may be linked to each other via a single bond.

In one or more embodiments, the host may include a compound represented by Formula 301-1, a compound represented by Formula 301-2, or any combination thereof:

wherein, in Formulae 301-1 and 301-2, ring A$_{301}$ to ring A$_{304}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, L$_{301}$, xb1$_7$ and R$_{301}$ may each be the same as described elsewhere herein, L$_{302}$ to L$_{304}$ may each independently be the same as described in connection with L$_{301}$, xb2 to xb4 may each independently be the same as described in connection with xb1$_7$ and R$_{302}$ to R$_{305}$ and R$_{311}$ to R$_{314}$ may each be the same as described in connection with R$_{301}$.

In one or more embodiments, the host may include an alkaline earth-metal complex. In one or more embodiments, the host may include a Be complex (for example, Compound H55), an Mg complex, a Zn complex, or a combination thereof.

In one or more embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but embodiments of the present disclosure are not limited thereto:

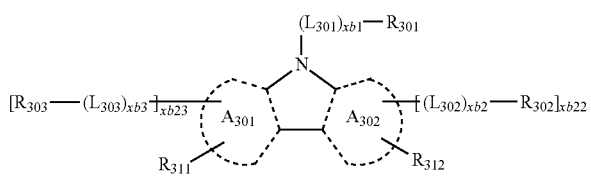

Formula 301-1

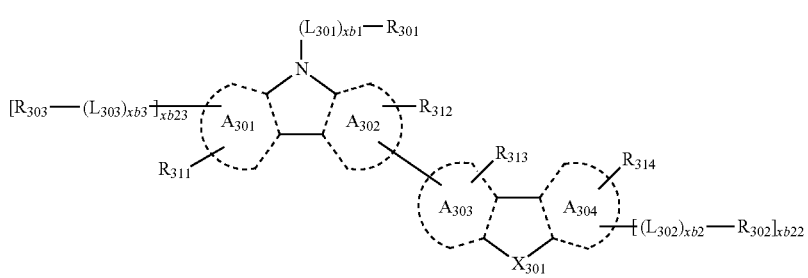

Formula 301-2

H1 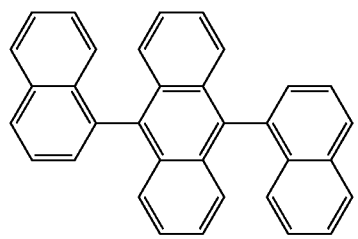
H2 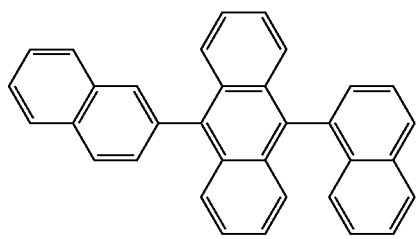
H3 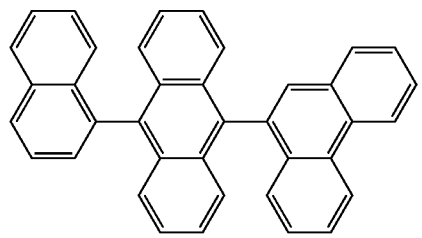
H4 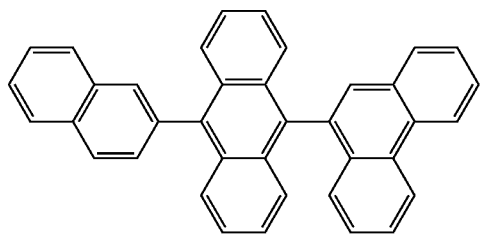
H5 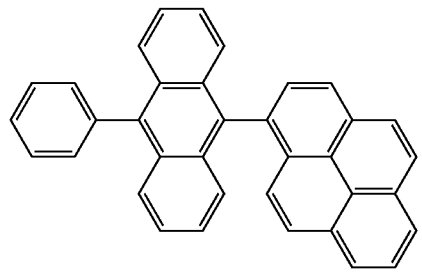
H6 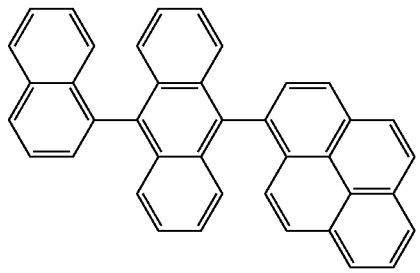
H7 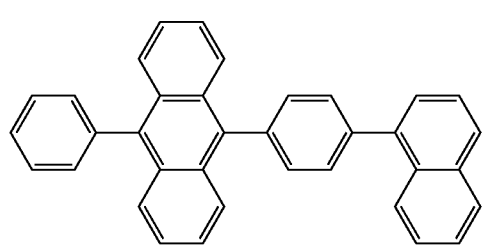
H8 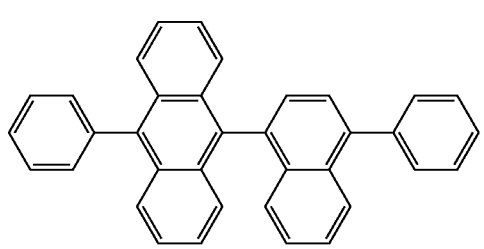
H9 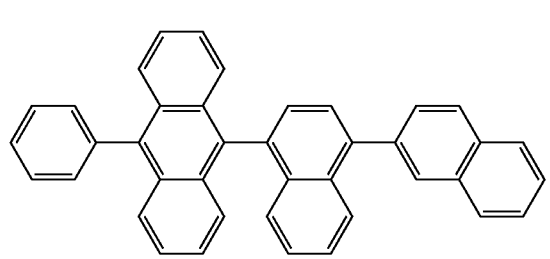
H10 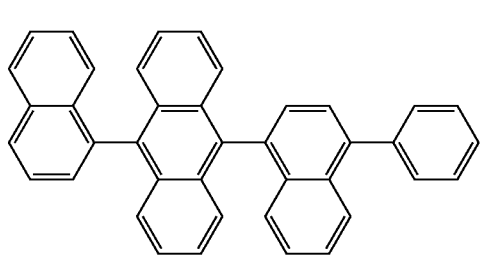
H11 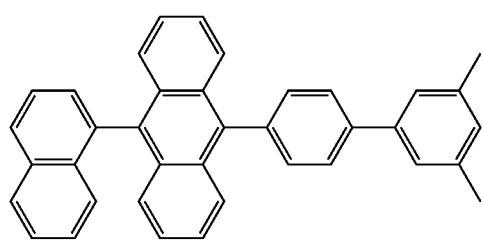
H12 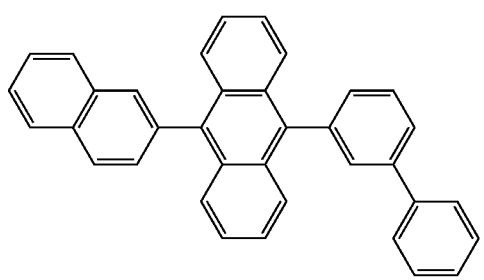

-continued
H13
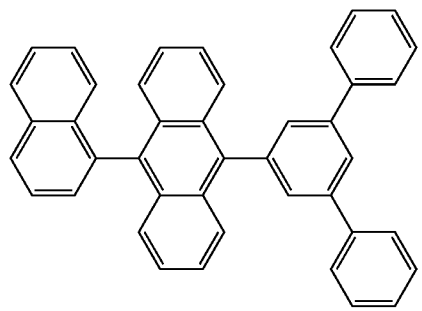
H14
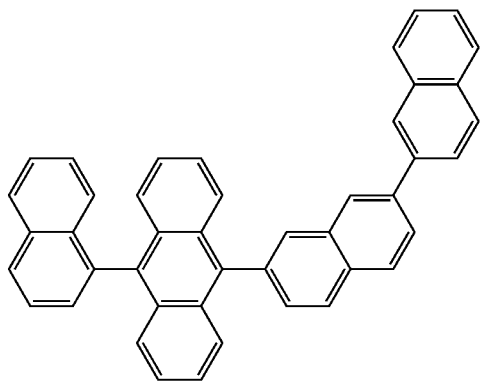
H15
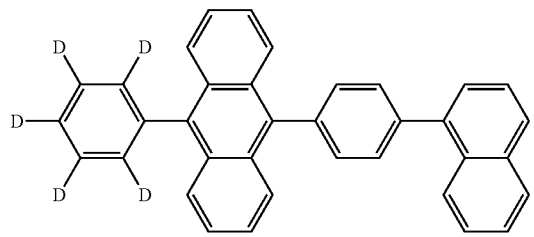
H16
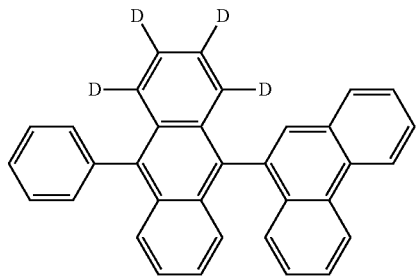
H17
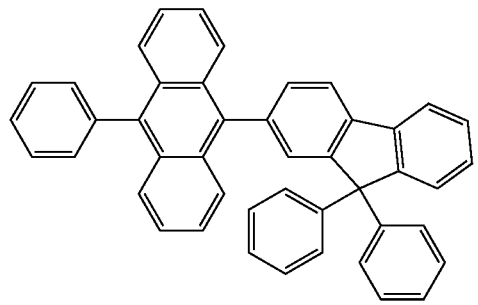
H18
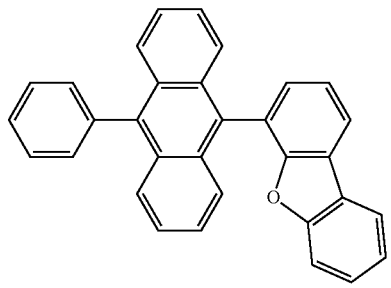
H19
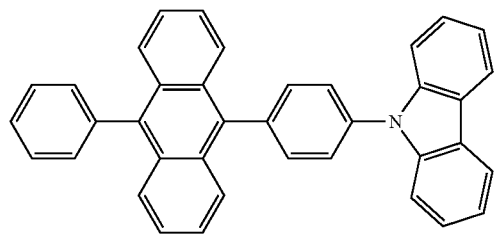
H20
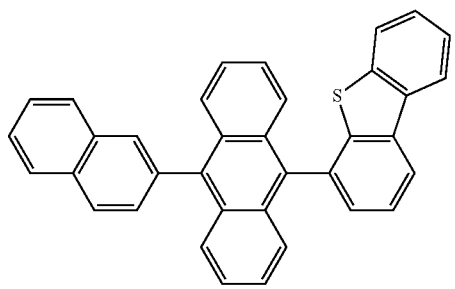

-continued
H21
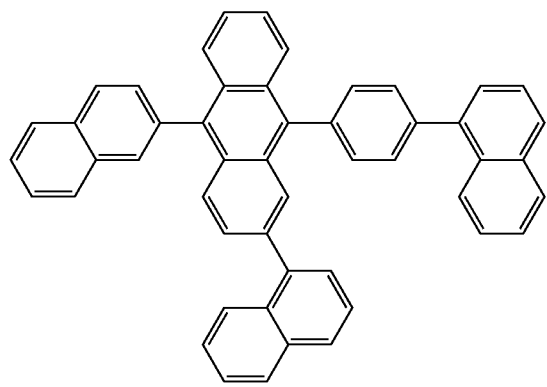
H22
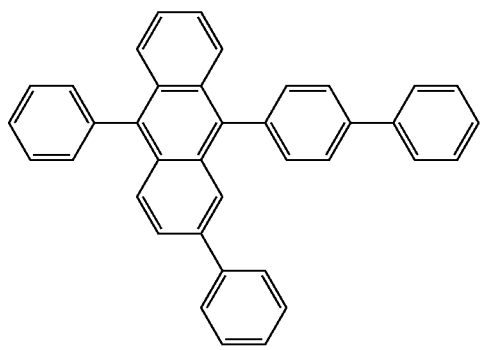
H23
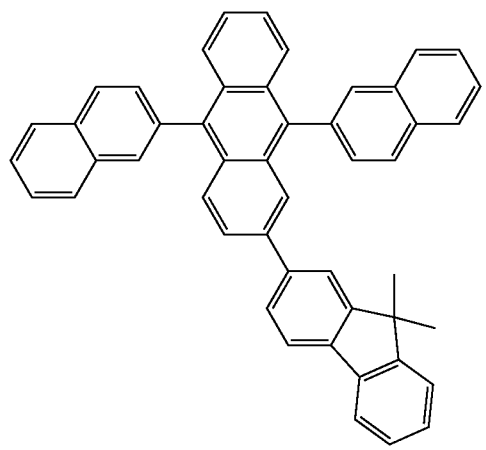
H24
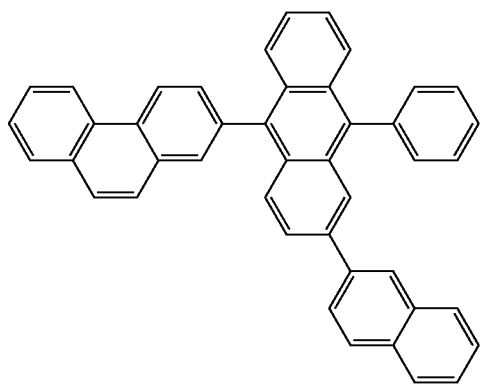
H25
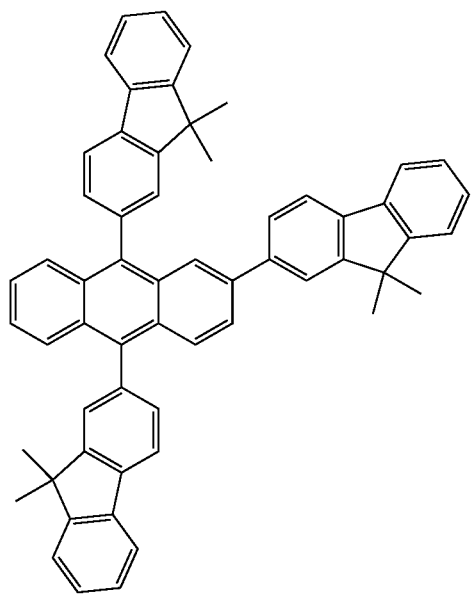
H26
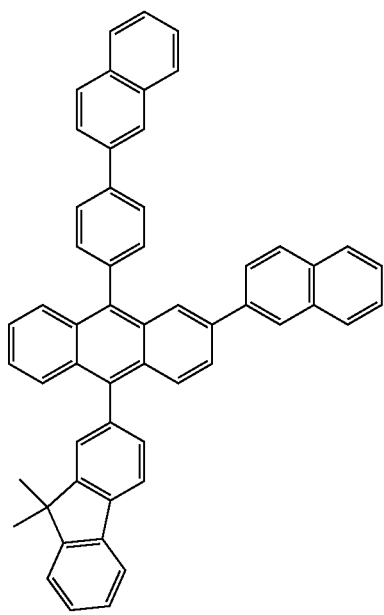

-continued
H27
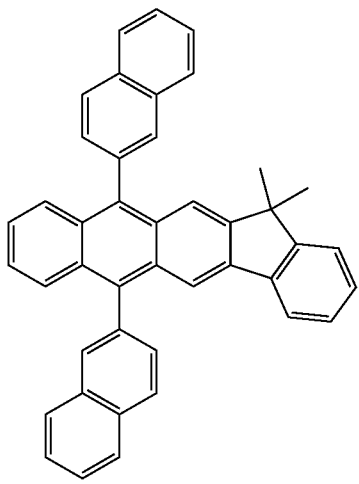
H28
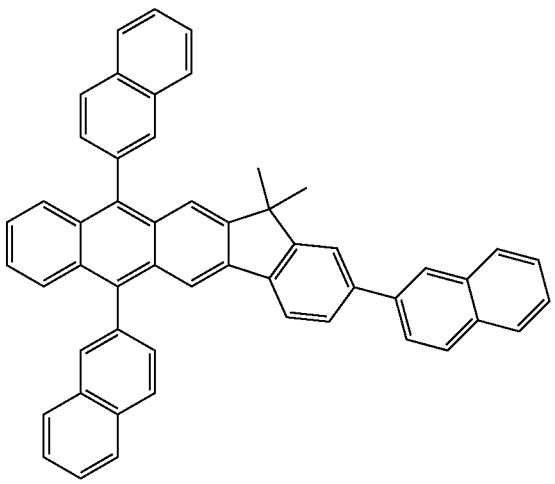
H29
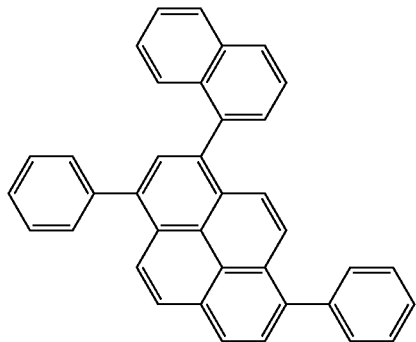
H30
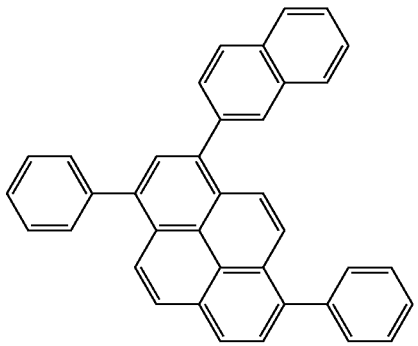
H31
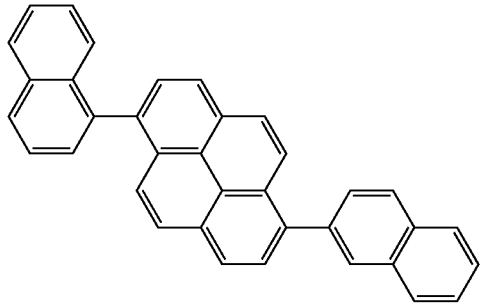
H32
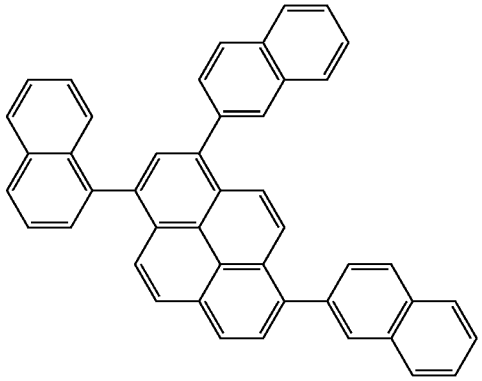
H33
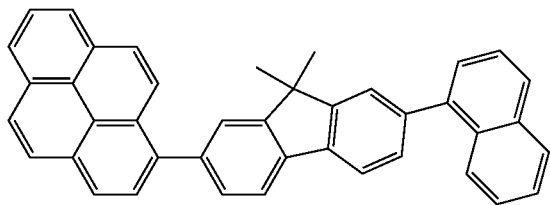
H34
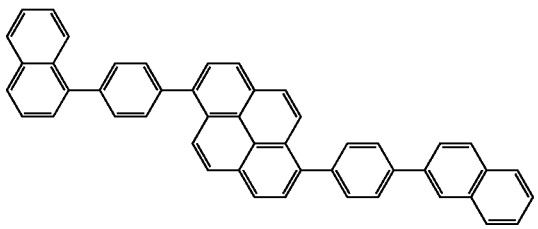

-continued
H35
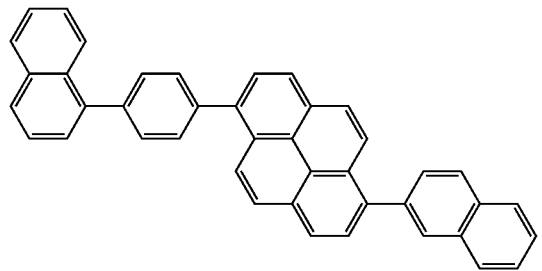
H36
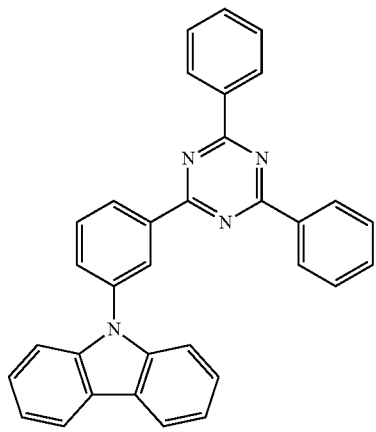
H37
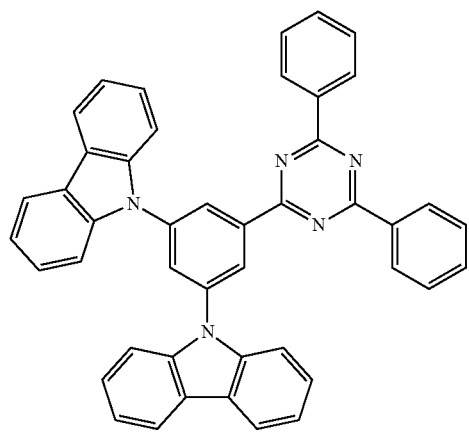
H38
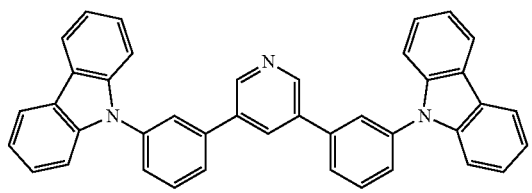
H39
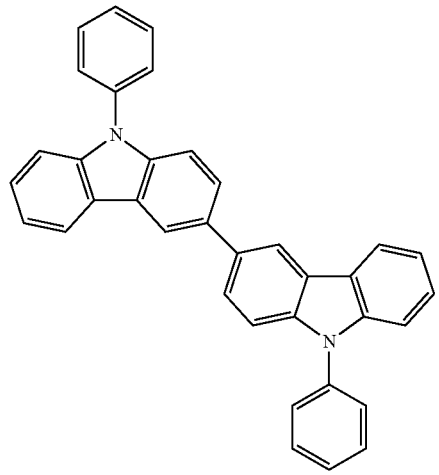
H40
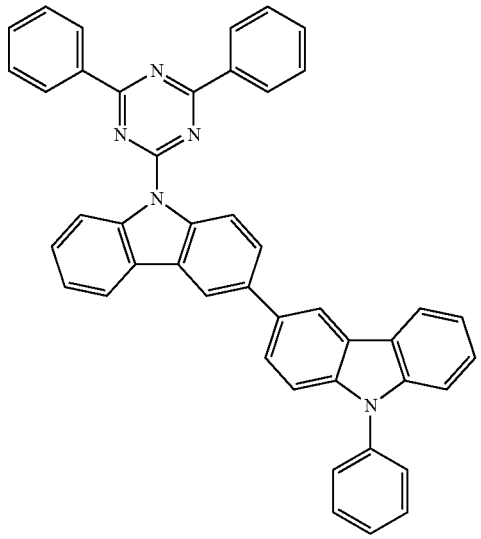

-continued
H41
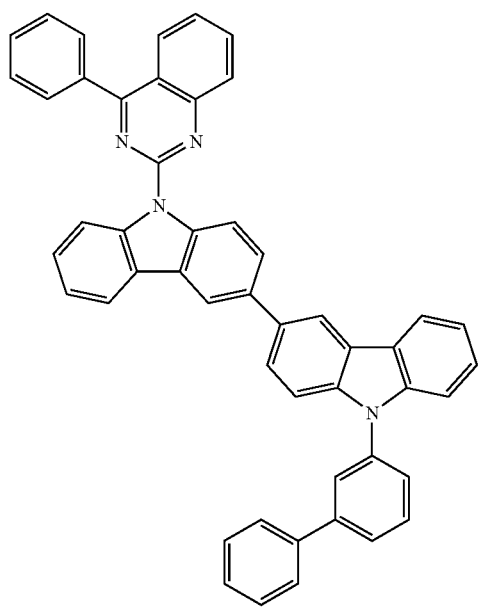
H42
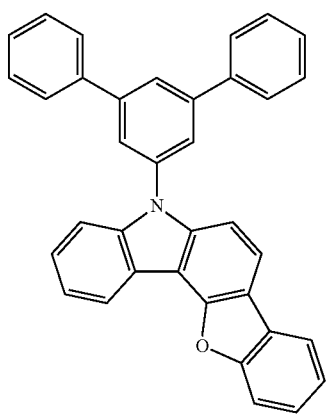
H43
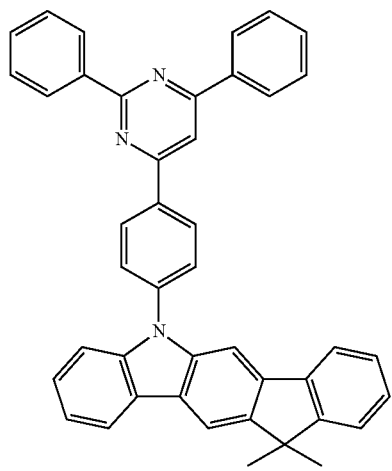
H44
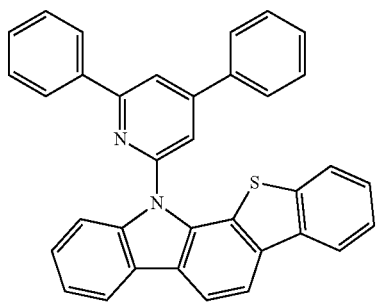
H45
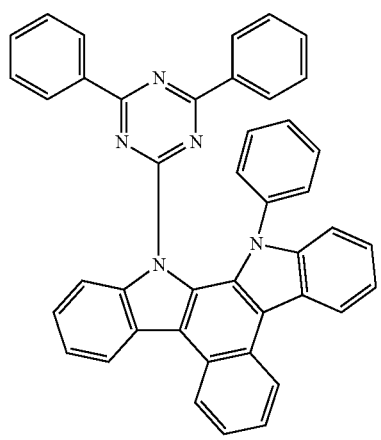
H46
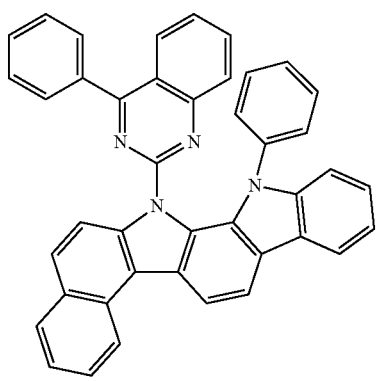

-continued
H47
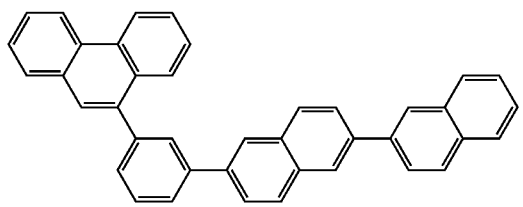
H48
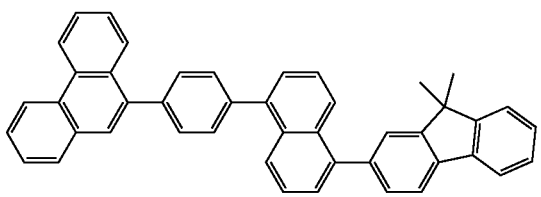
H49
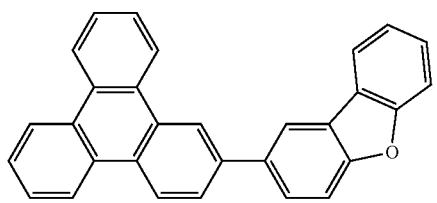
H50
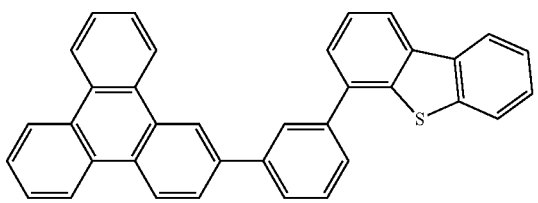
H51
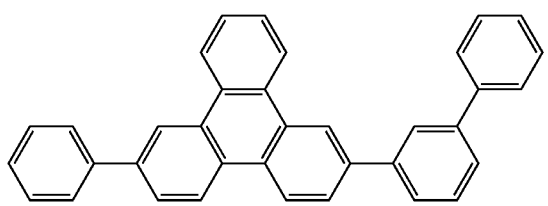
H52
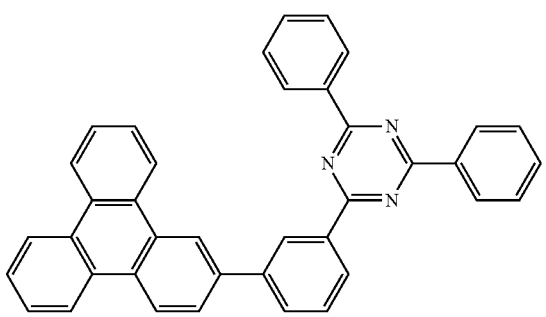
H53
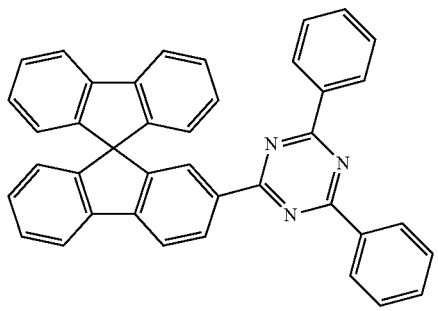
H54
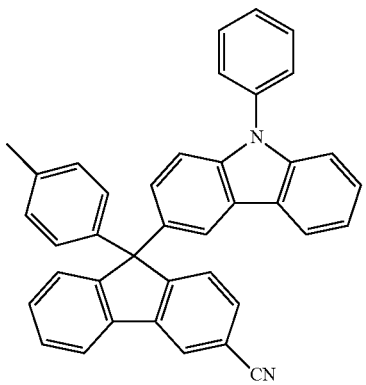
H55
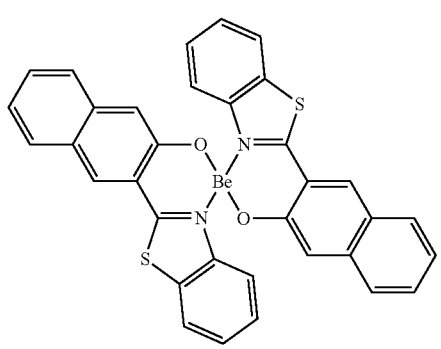
H56
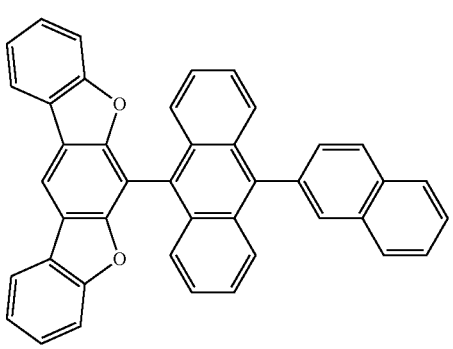

-continued
H57
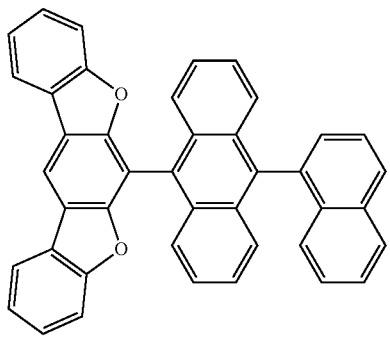
H58
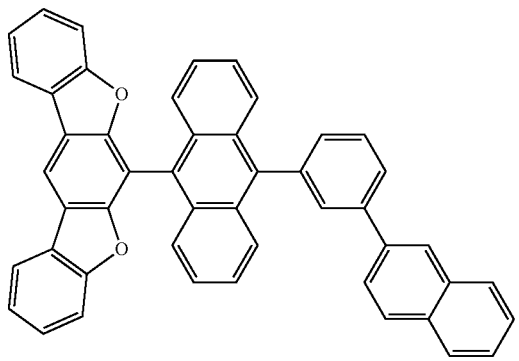
H59
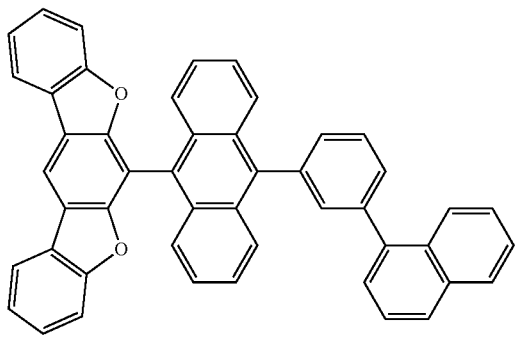
H60
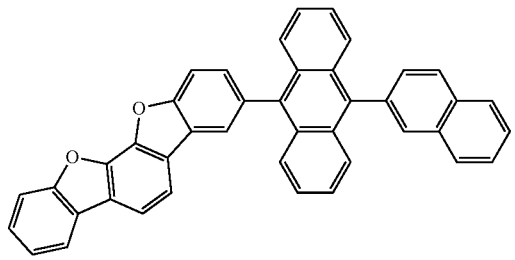
H61
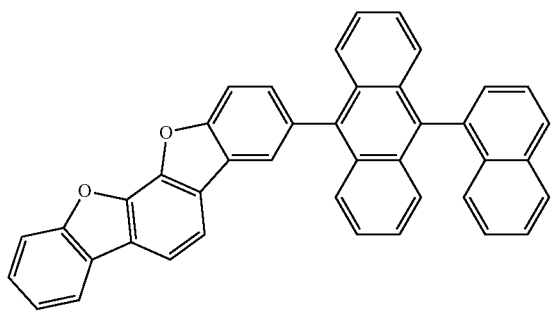
H62
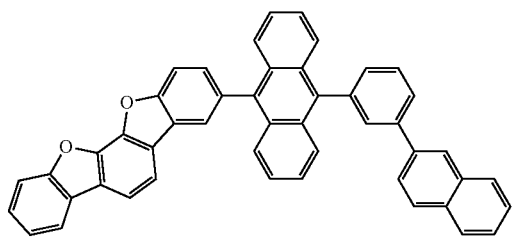
H63
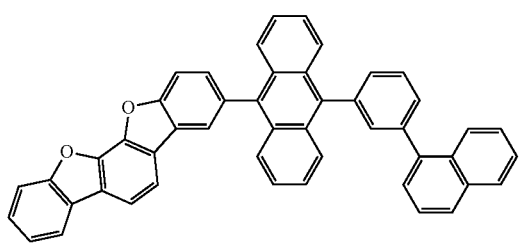
H64
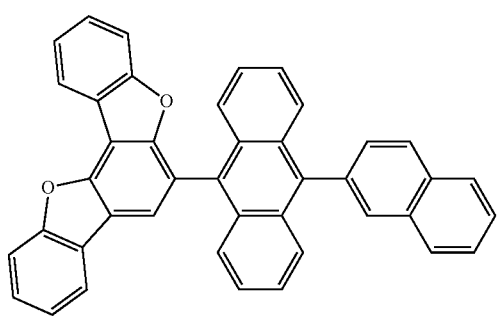

-continued
H65
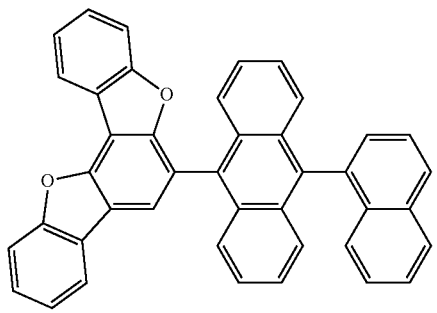
H66
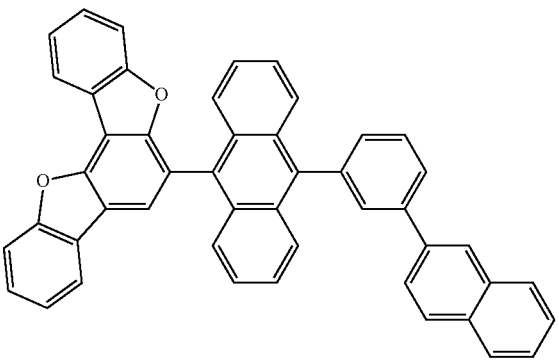
H67
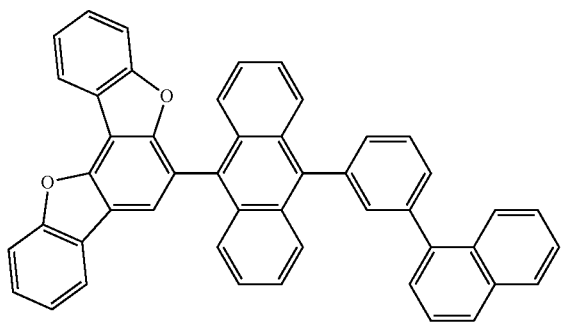
H68
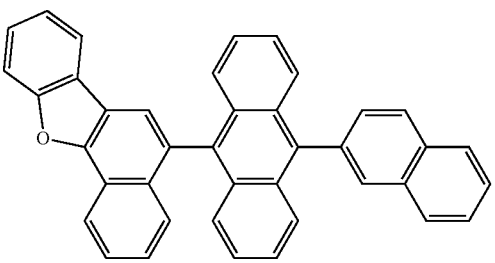
H69
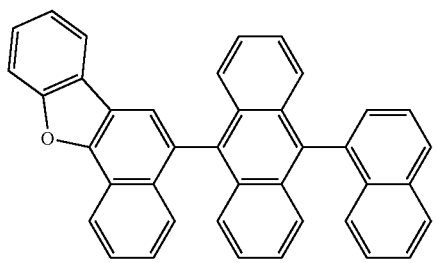
H70
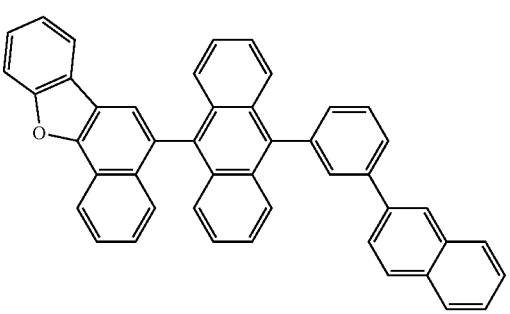
H71
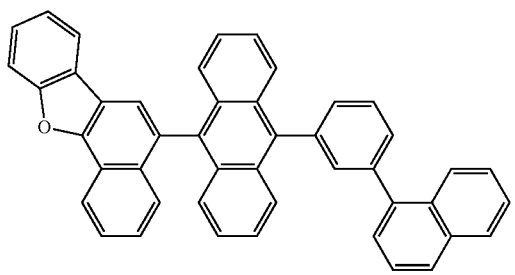
H72
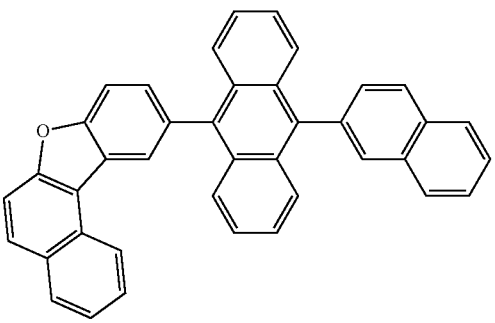

-continued
H73
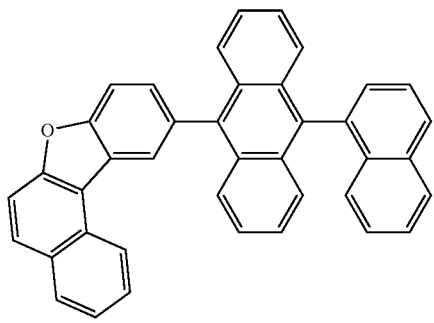
H74
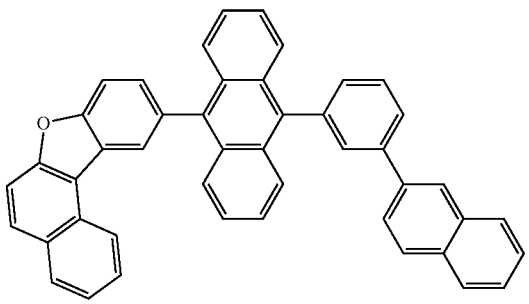
H75
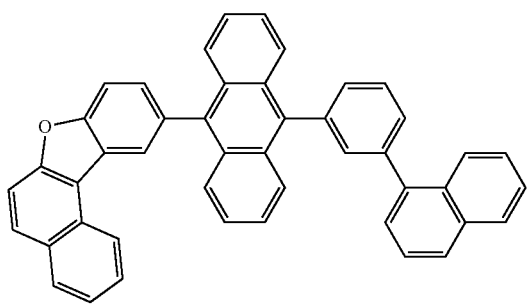
H76
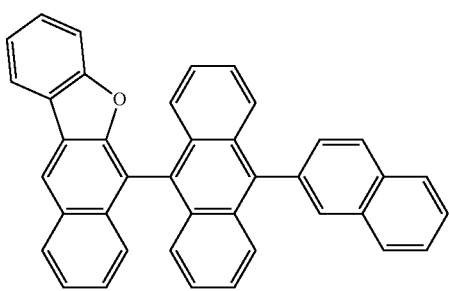
H77
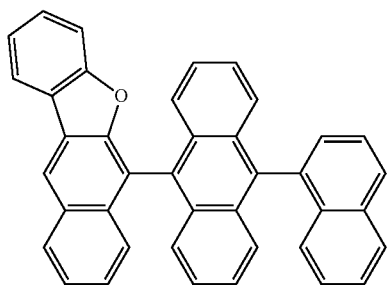
H78
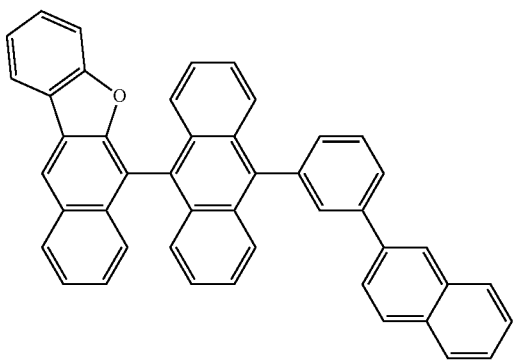
H79
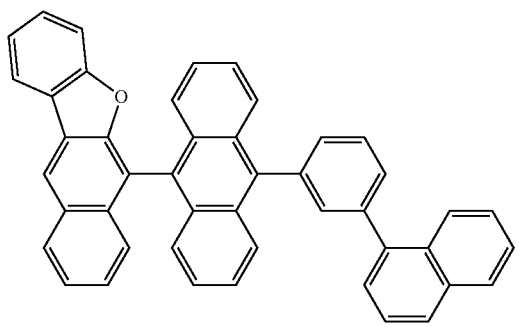
H80
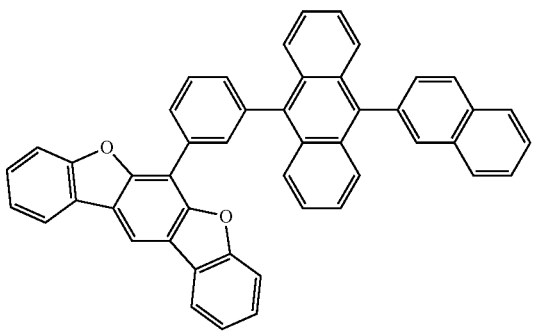

-continued
H81
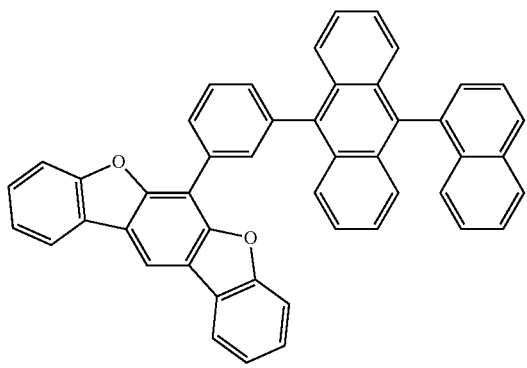
H82
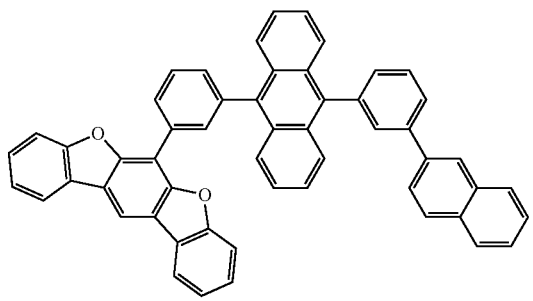
H83
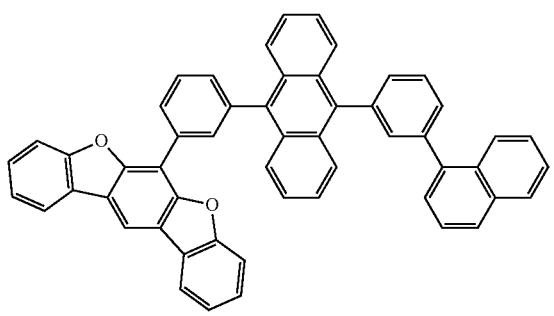
H84
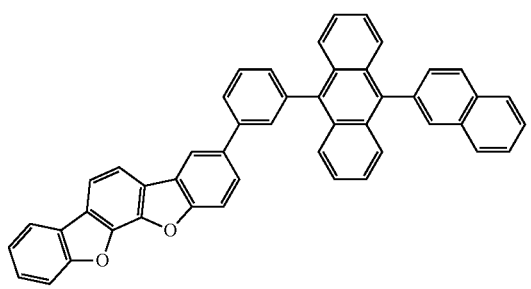
H85
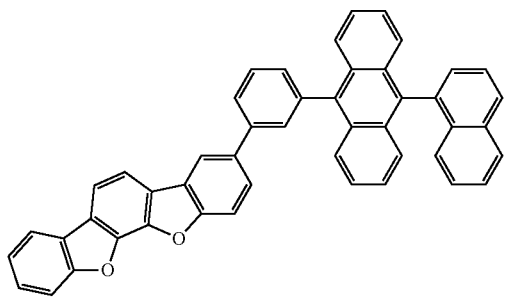
H86
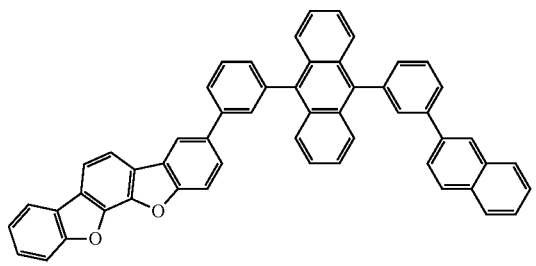
H87
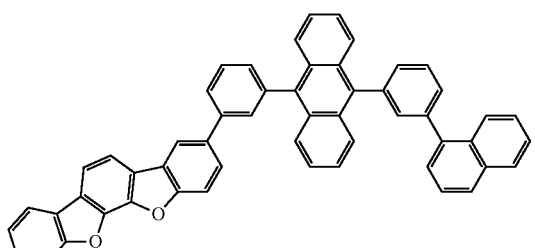
H88
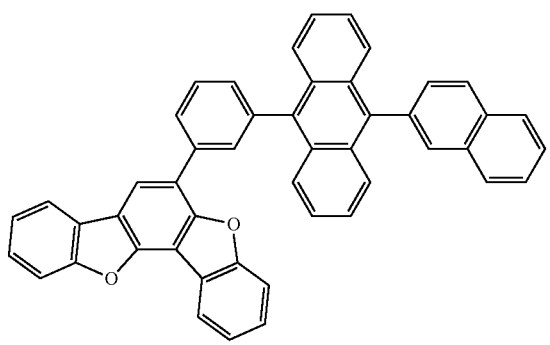

-continued
H89
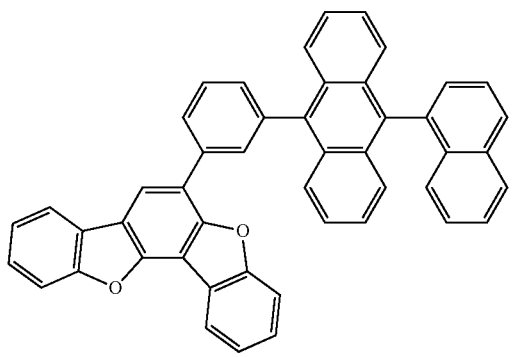
H90
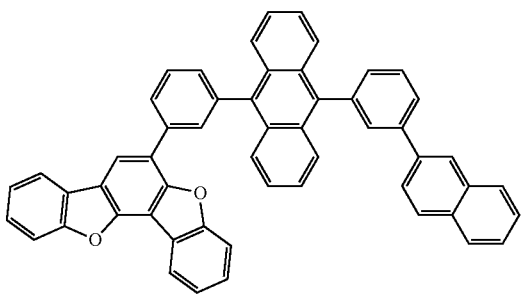
H91
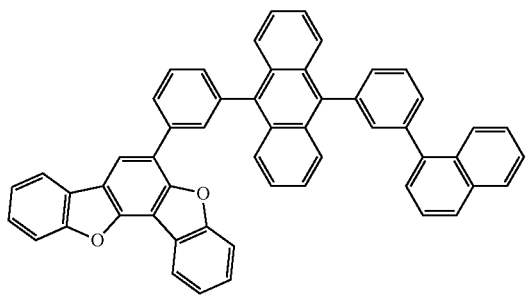
H92
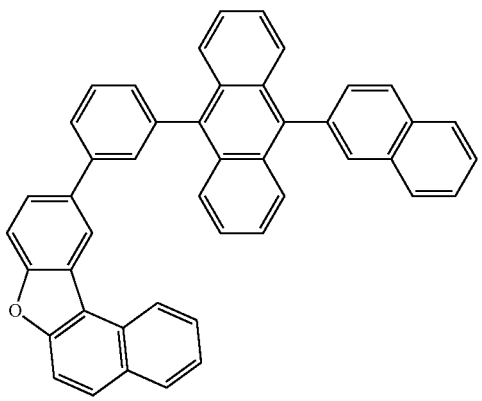
H93
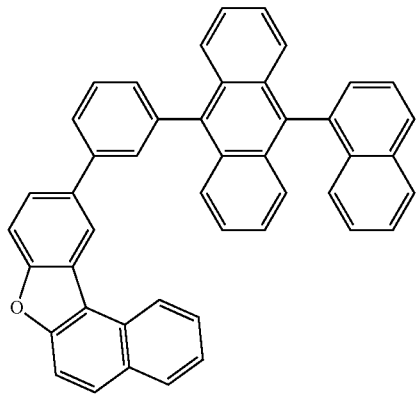
H94
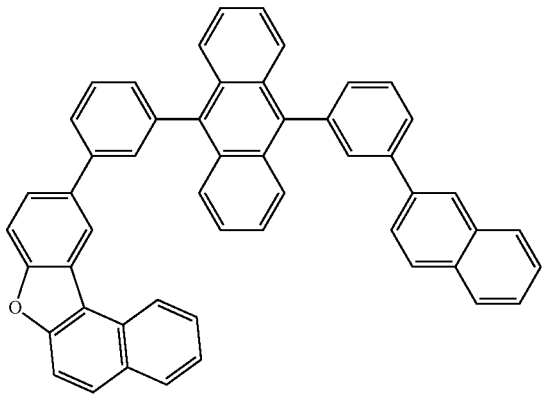
H95
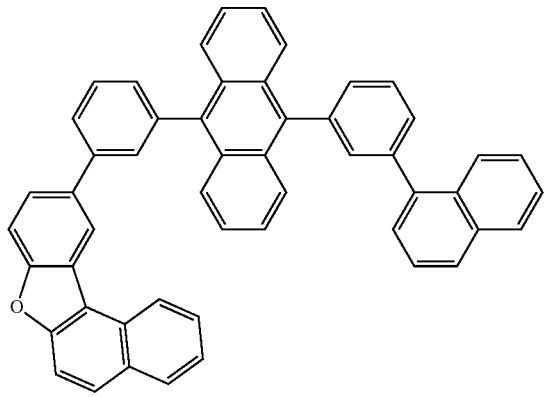
H96
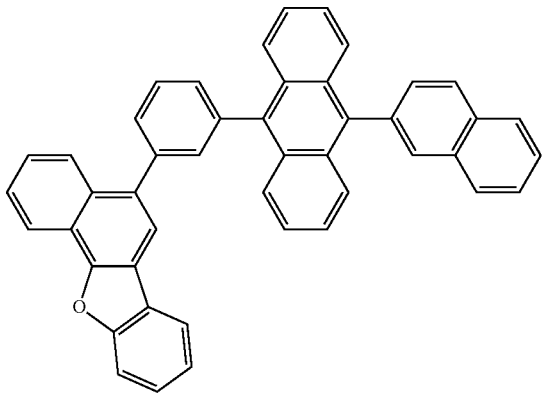

-continued
H97
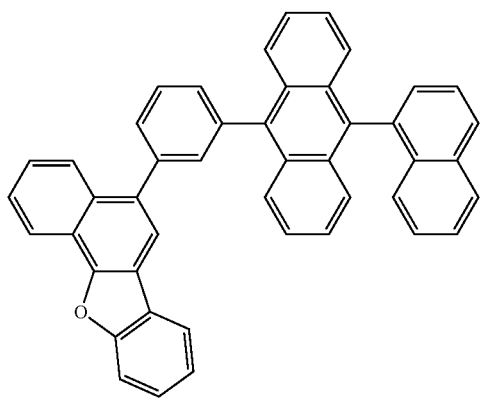
H98
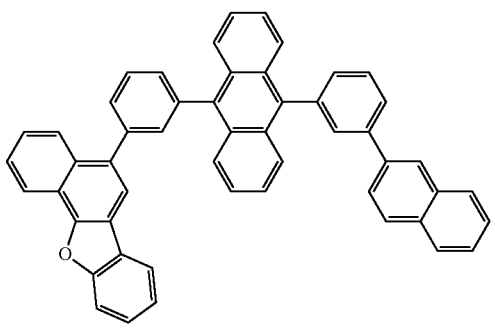
H99
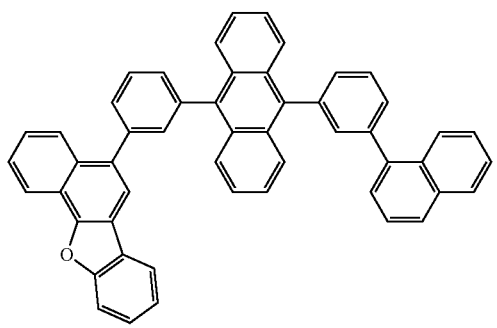
H100
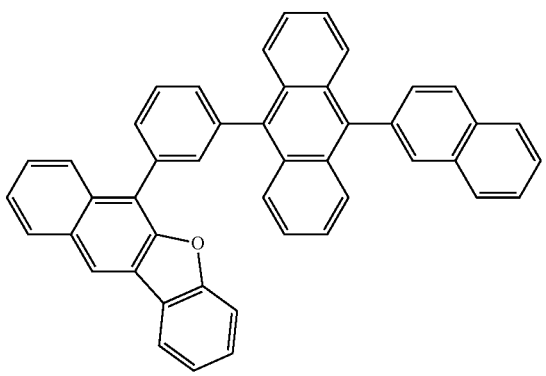
H101
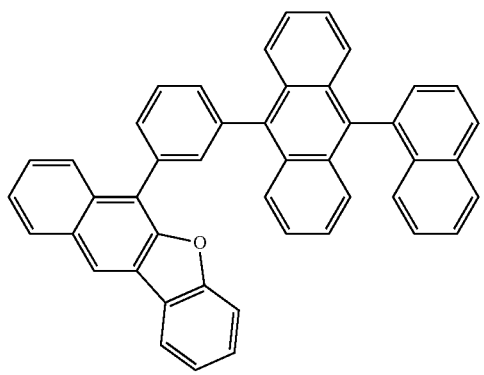
H102
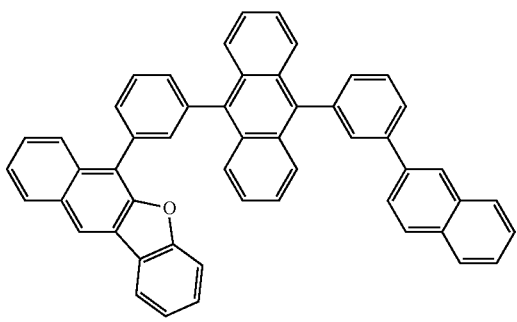
H103
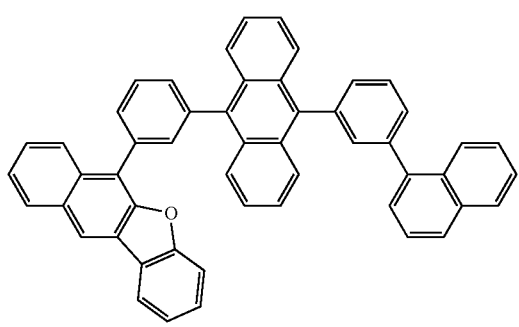
H104
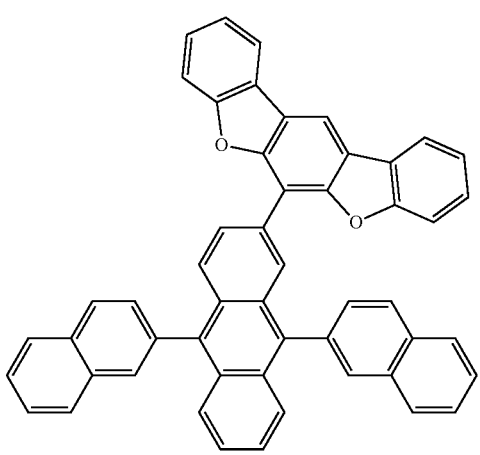

-continued
H105
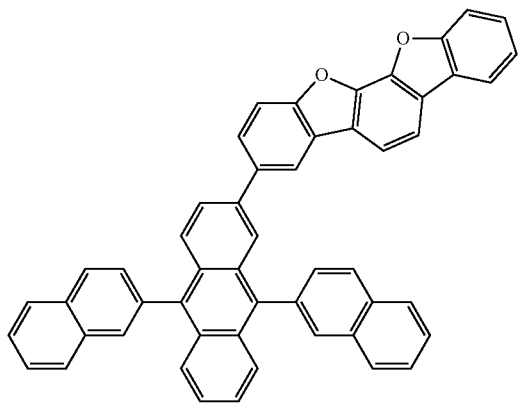
H106
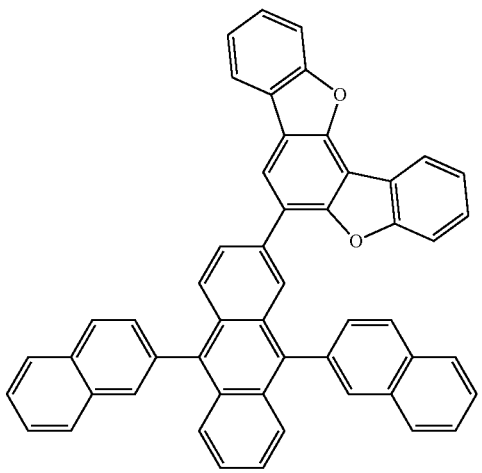
H107
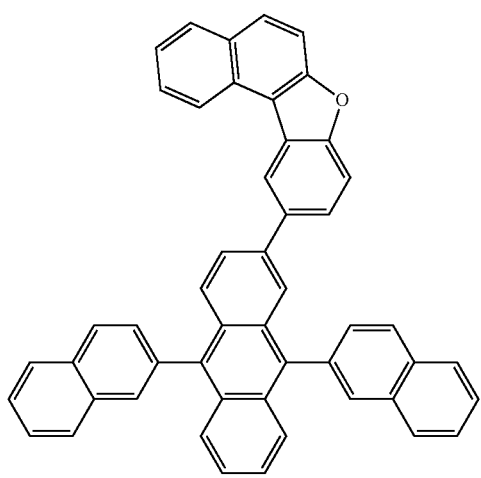
H108
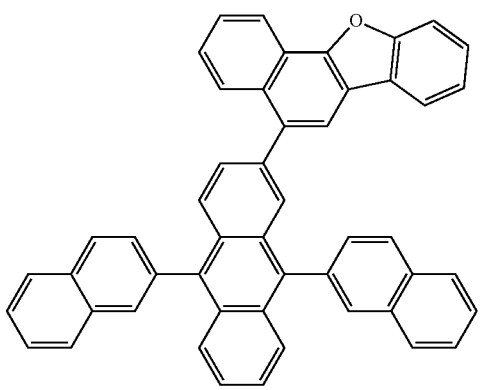
H109
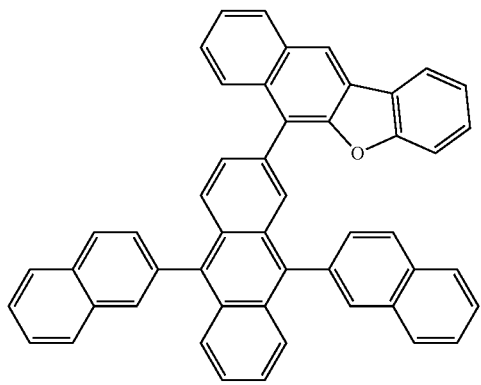
H110
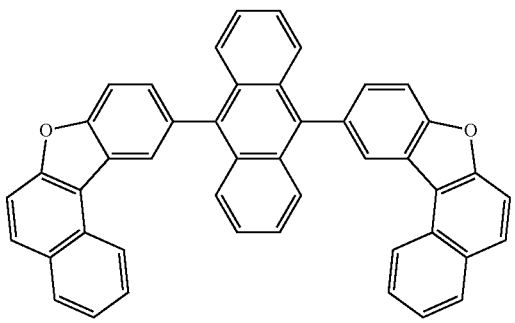
H111
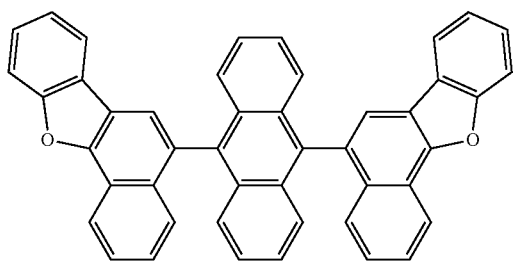
H112
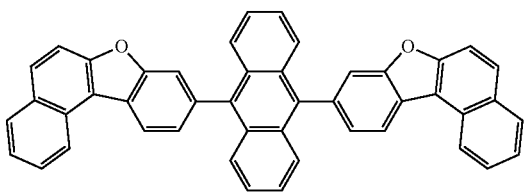

H113
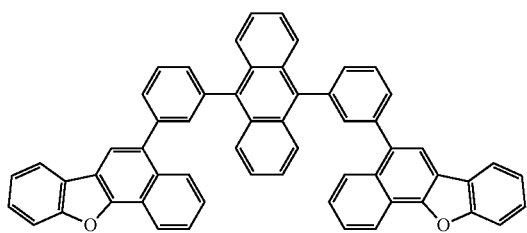
H114
H115
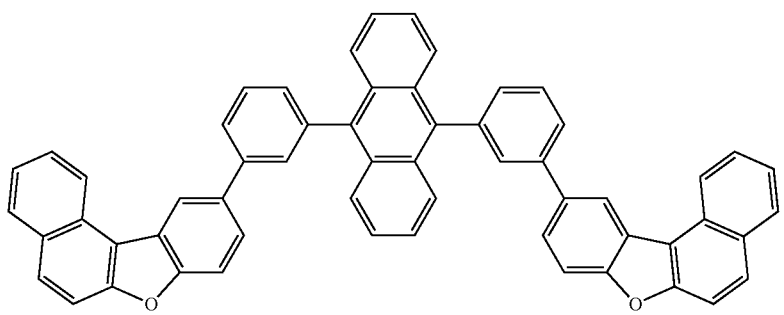
H116
H117
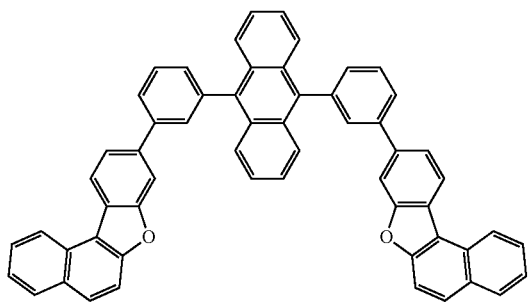
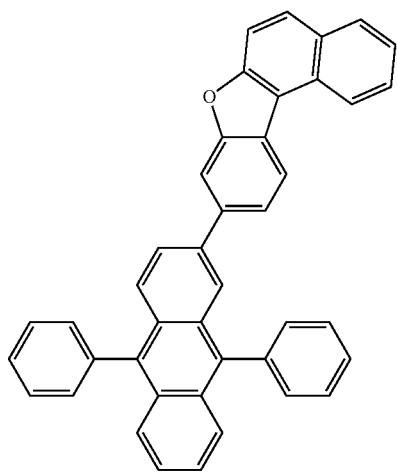
H118
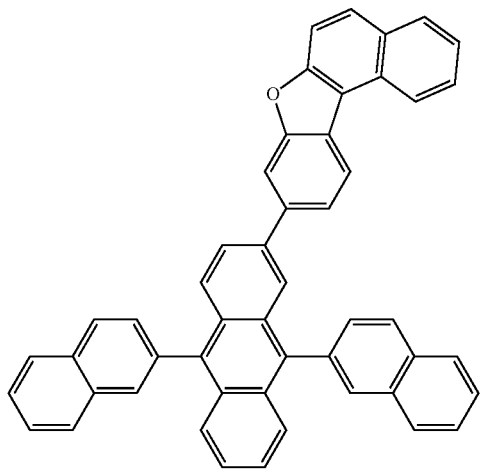
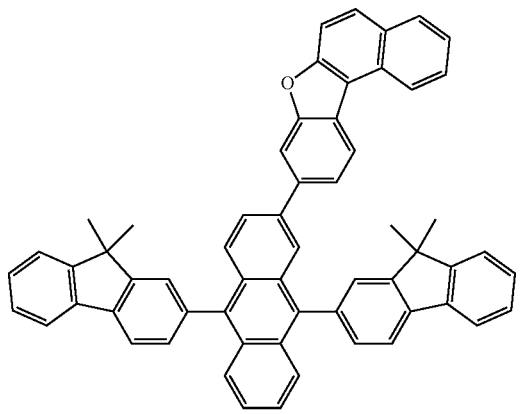

-continued
H119
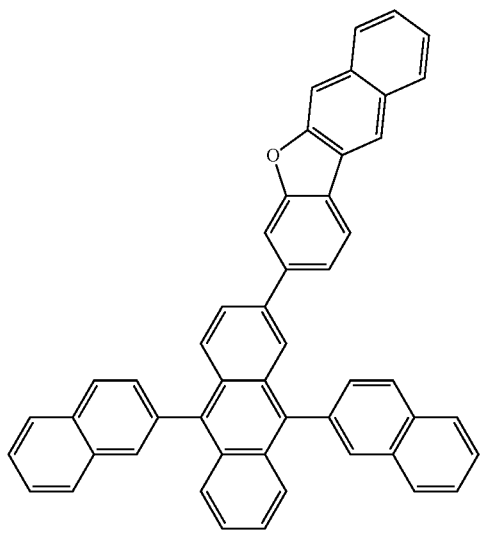
H120
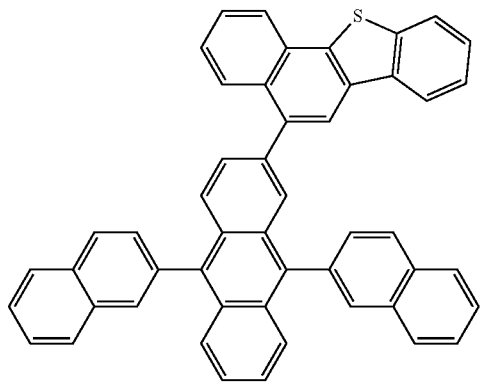
H121
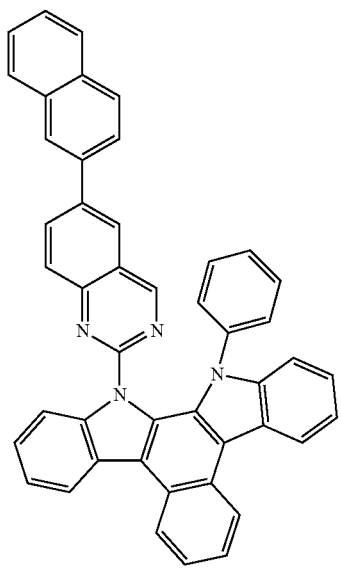
H122
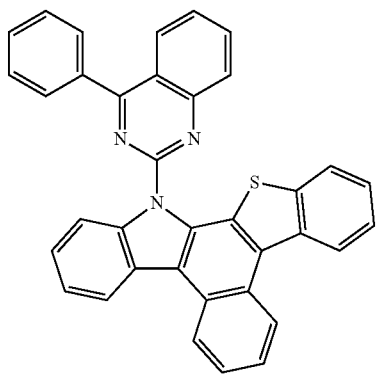
H123
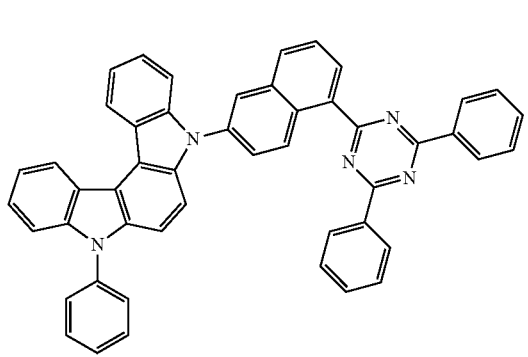
H124
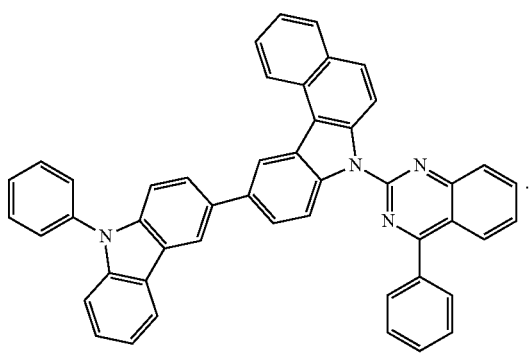

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

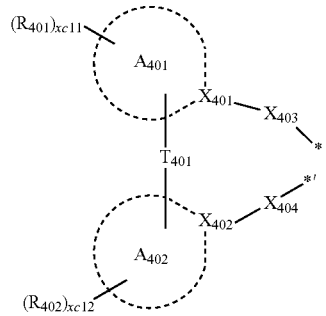

Formula 402 wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, and wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

For example, when xc1 in Formula 402 is 2 or more, two ring $A_{401}$(s) in two or more of $L_{401}$ (s) may be optionally linked to each other via $T_{402}$, which is a linking group, and two ring $A_{402}$(s) may optionally be linked to each other via $T_{403}$, which is a linking group (see Compounds PD1 to PD4 and PD7), wherein $T_{402}$ and $T_{403}$ may each be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of Compounds PD1 to PD25, or any combination thereof:

PD1

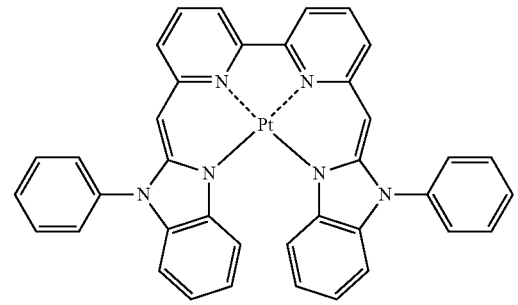

PD2

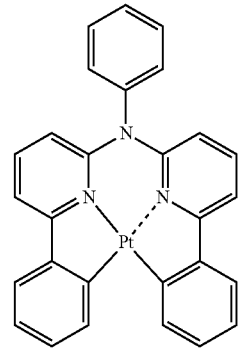

PD3

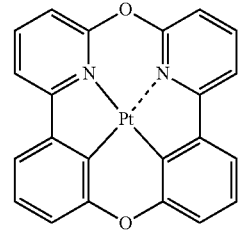

-continued
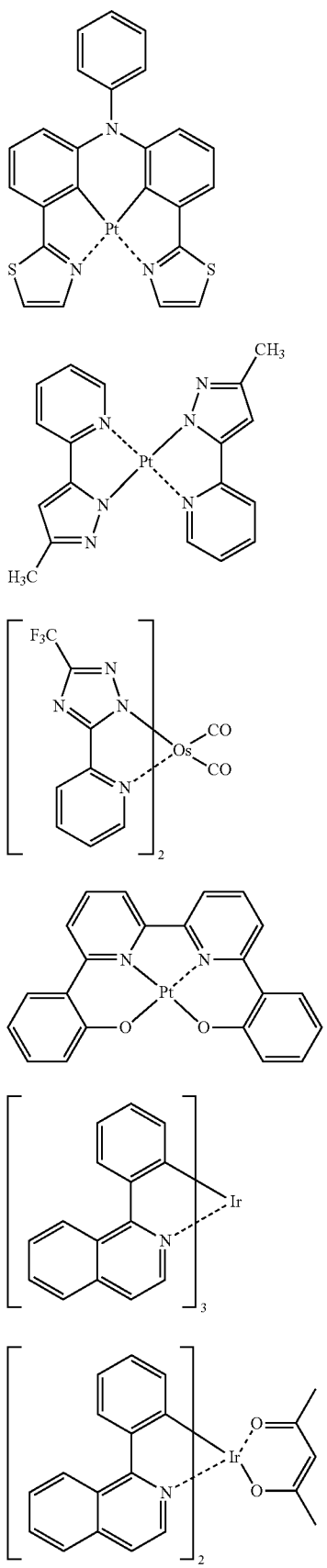
-continued
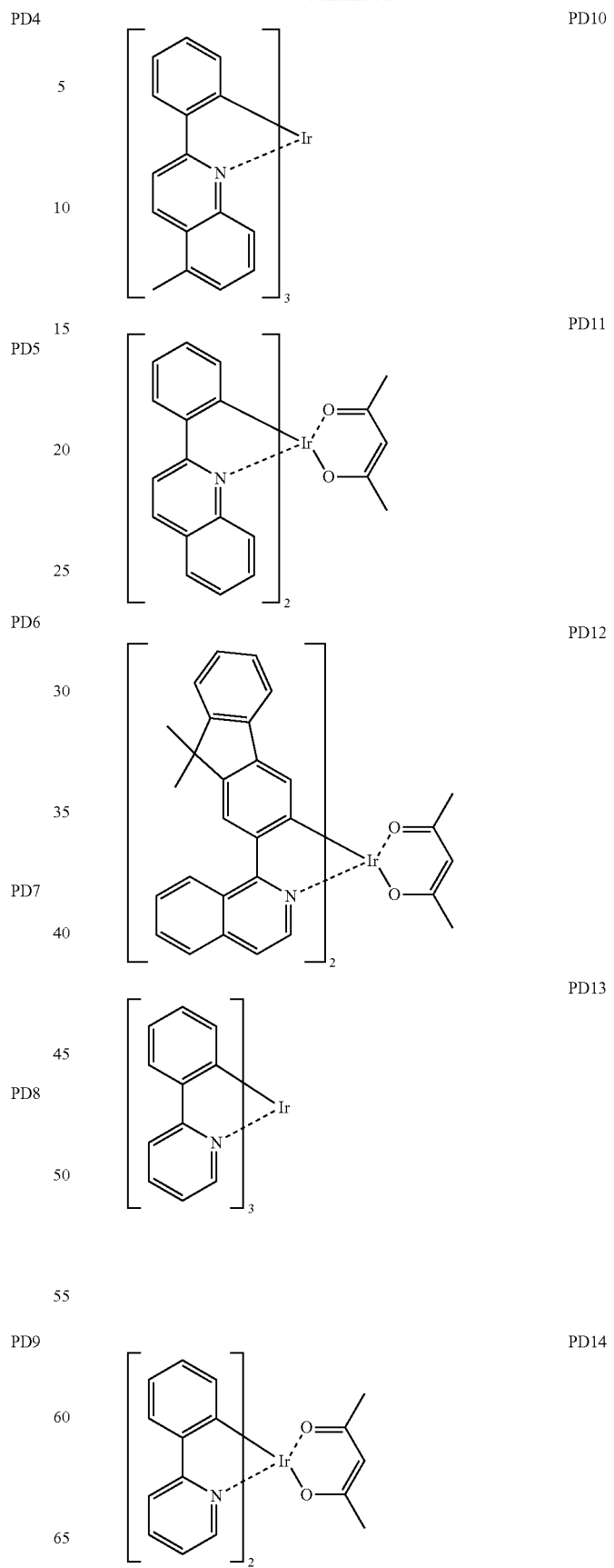

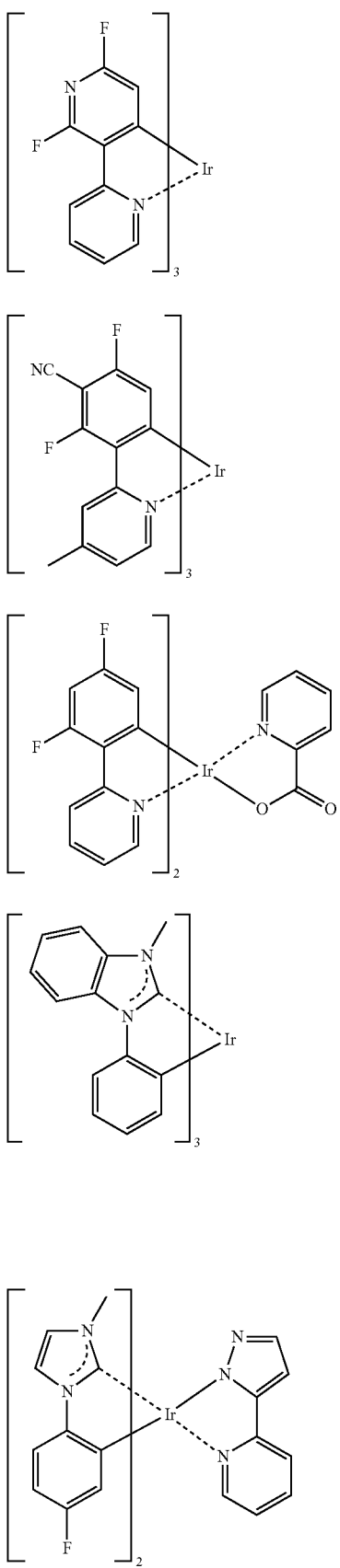
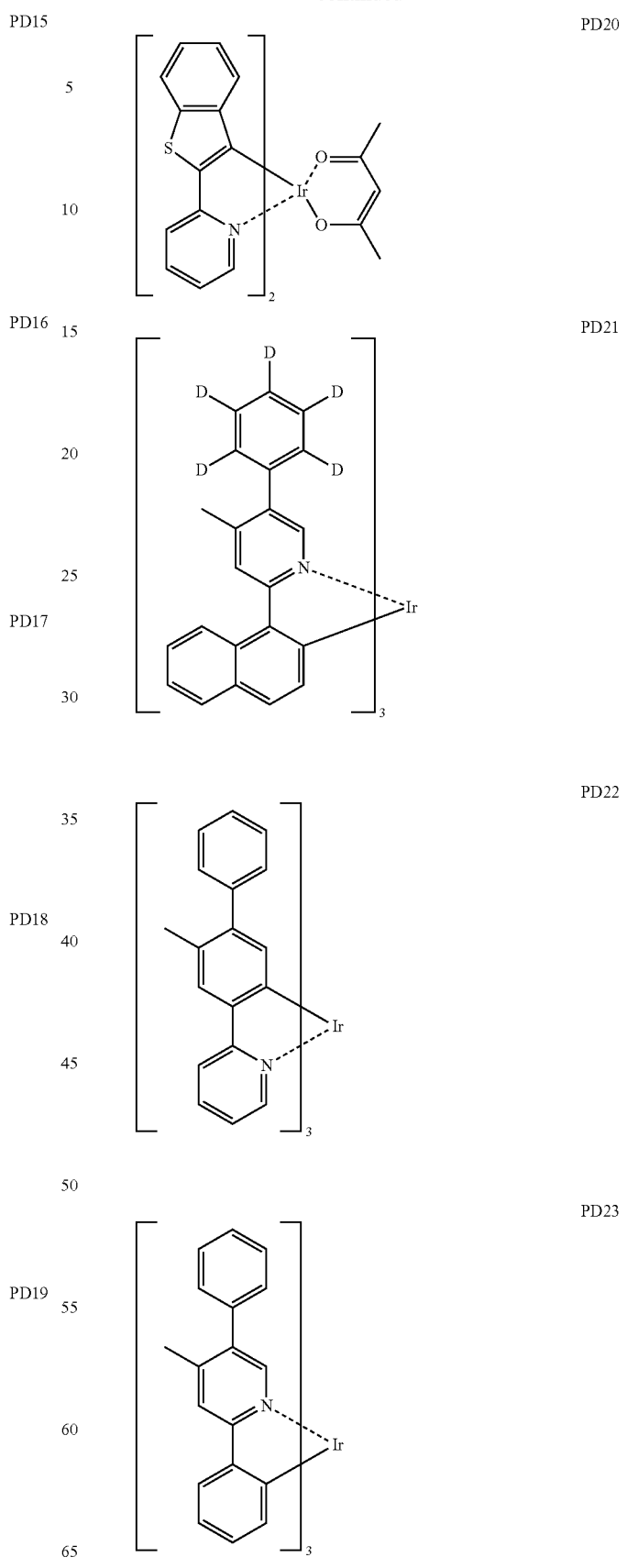

PD24

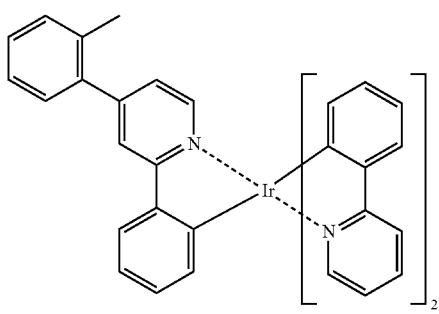

PD25

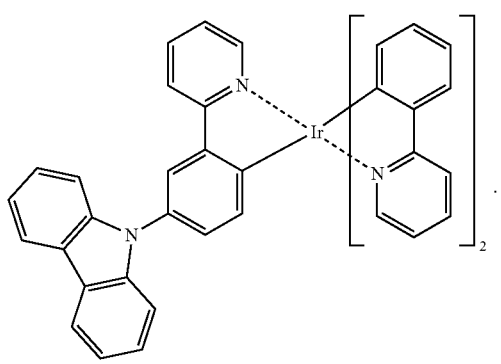

Fluorescent Dopant

In an embodiment, the fluorescent dopant may include an amine group-containing compound, a styryl group-containing compound, or any combination thereof.

In one or more embodiments, the fluorescent dopant may include a compound represented by Formula 501:

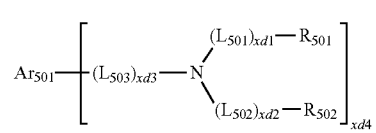

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together (e.g., combined together with each other).

In one or more embodiments, xd4 in Formula 501 may be 2.

In one or more embodiments, the fluorescent dopant may include: one of Compounds FD1 to FD36; DPVBi; DPAVBi; or any combination thereof:

FD1

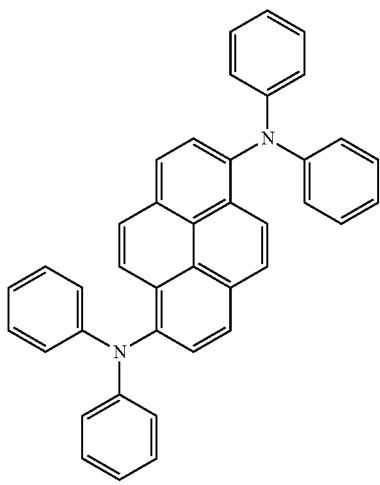

FD2

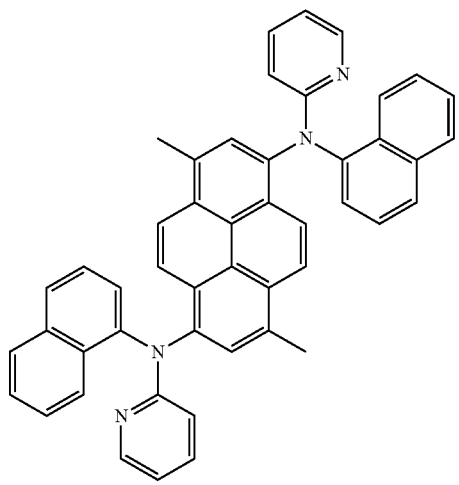

-continued
FD3
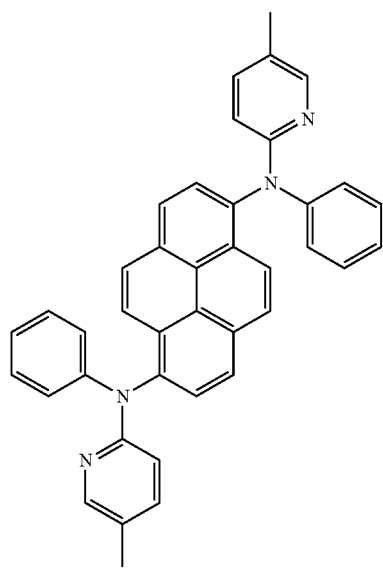
FD4
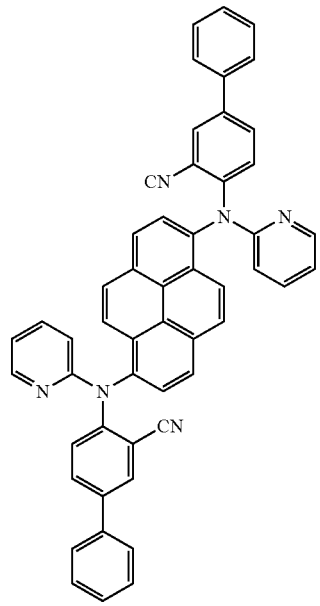
FD5
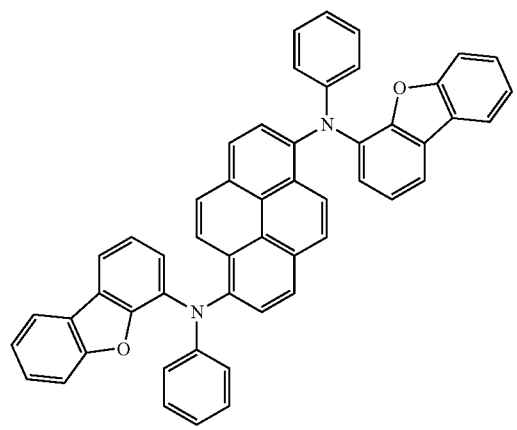
FD6
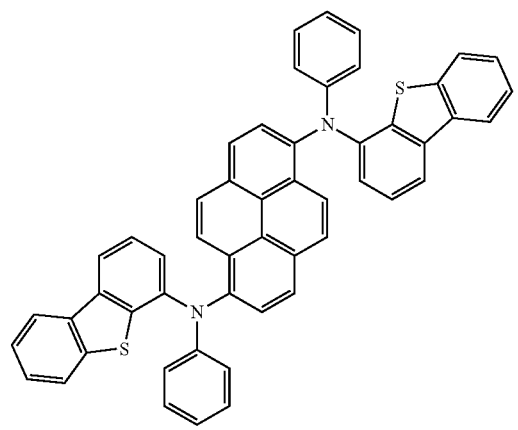
FD7
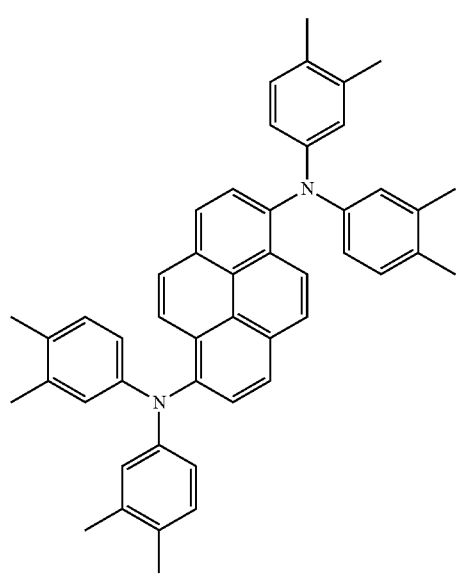
FD8
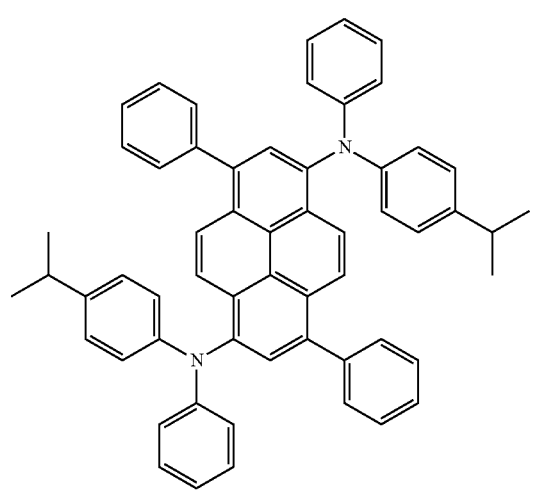

-continued
FD9
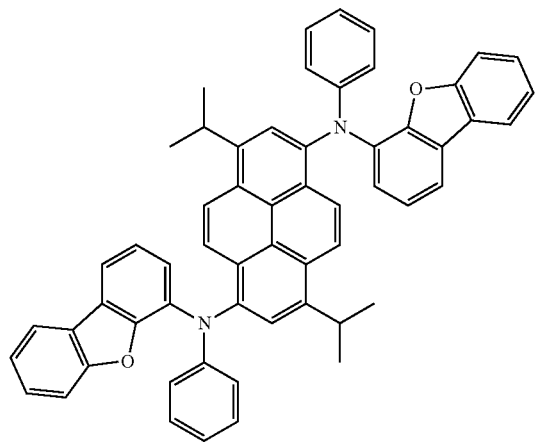
FD10
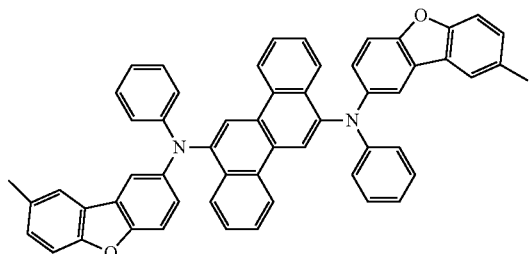
FD11
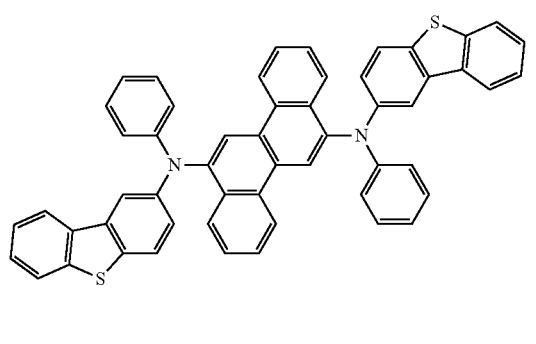
FD12
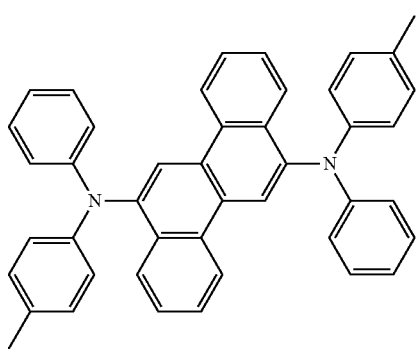
FD13
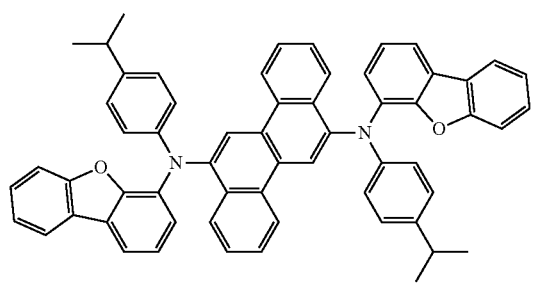
FD14
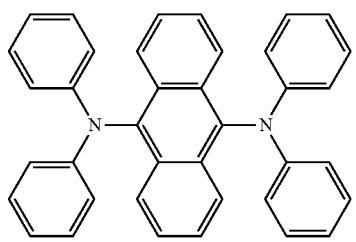
FD15
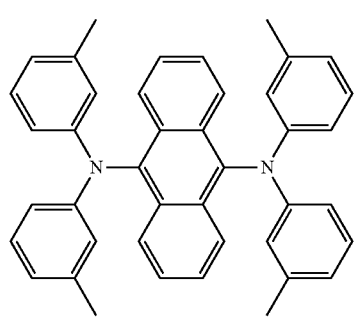
FD16
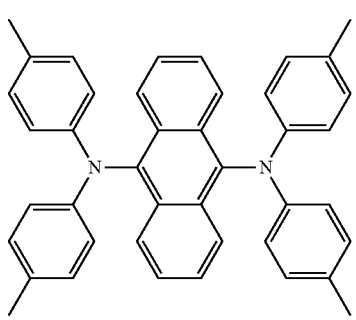

-continued
FD17
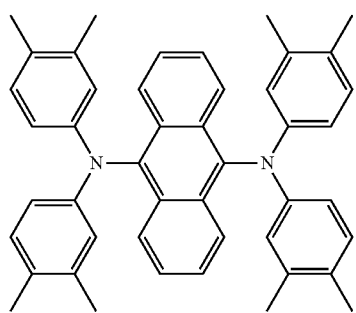
FD18
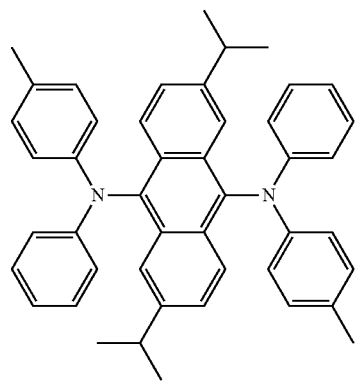
FD19
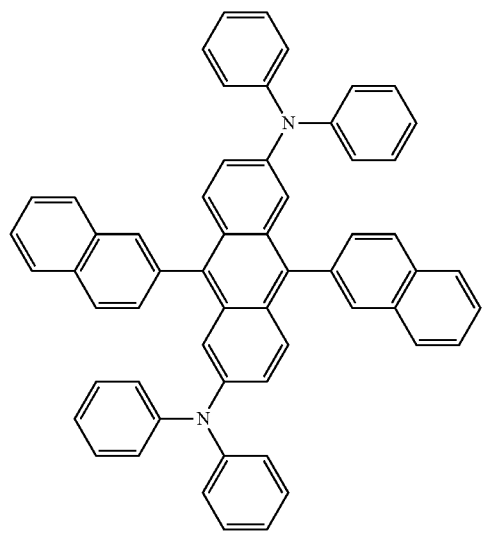
FD20
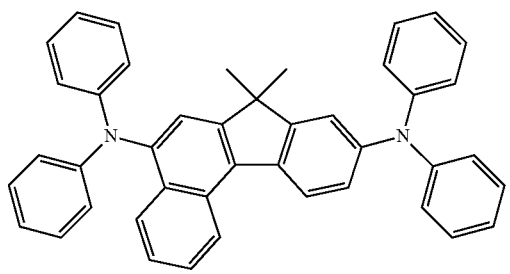
FD21
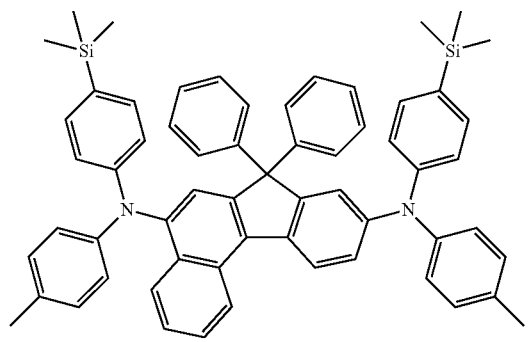
FD22
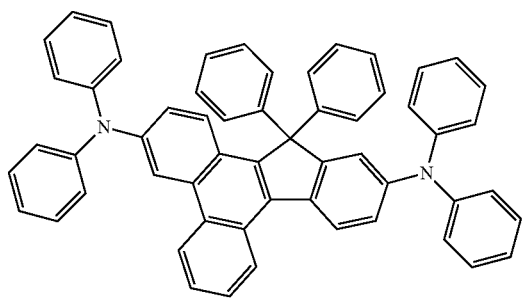
FD23
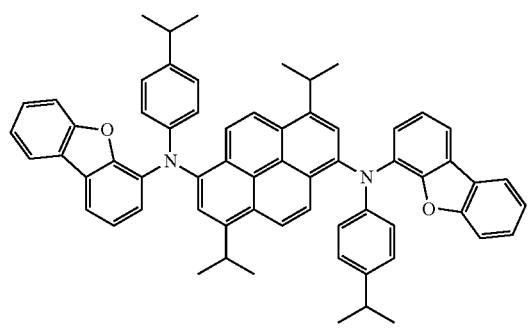
FD24
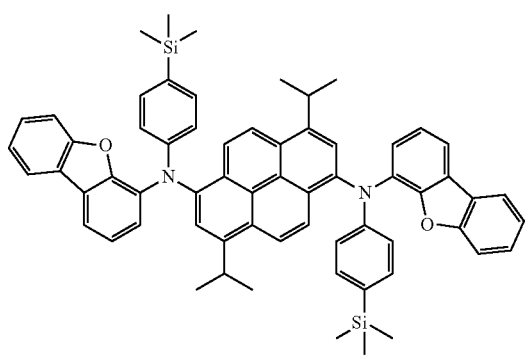

-continued
FD25
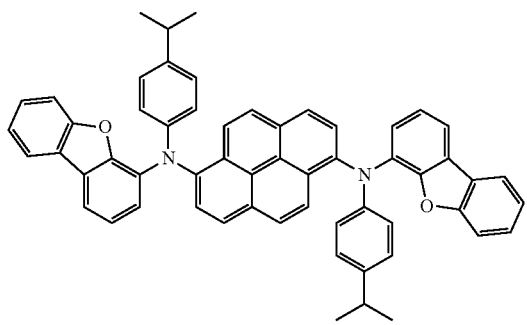
FD26
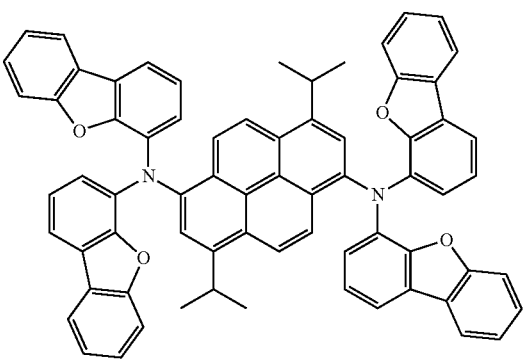
FD27
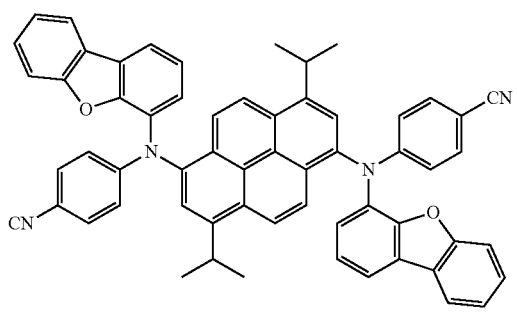
FD28
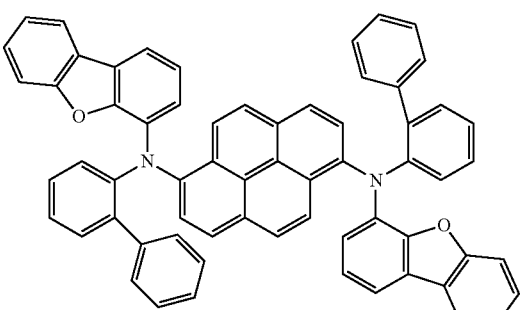
FD29
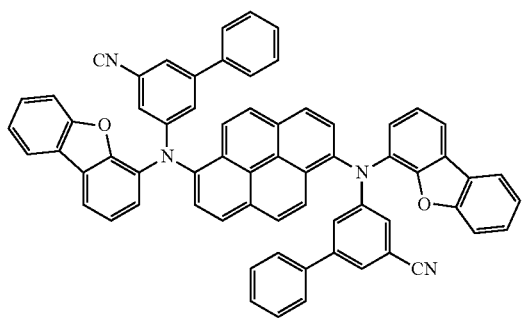
FD30
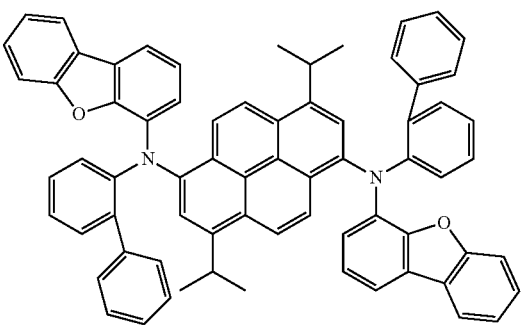
FD31
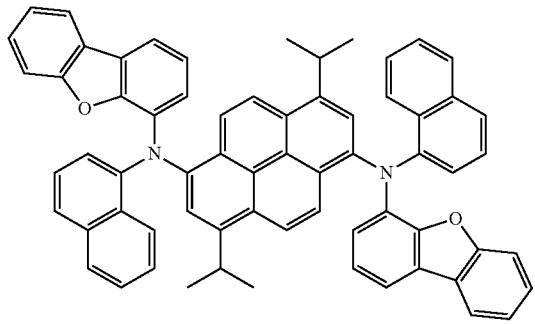
FD32
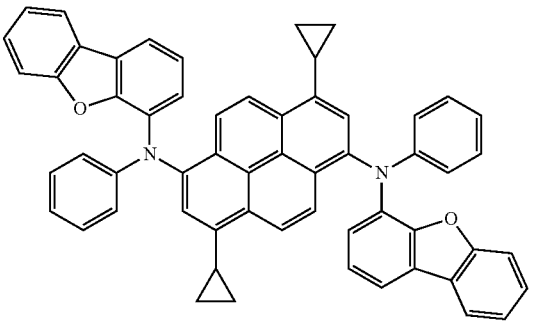

FD33

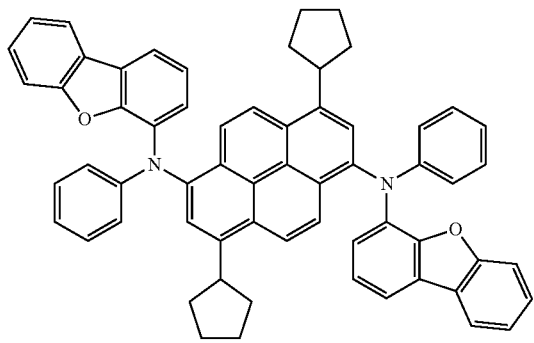

FD34

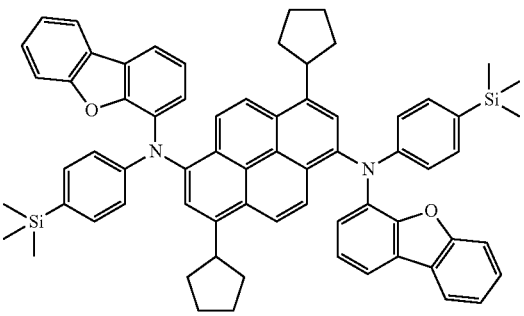

FD35

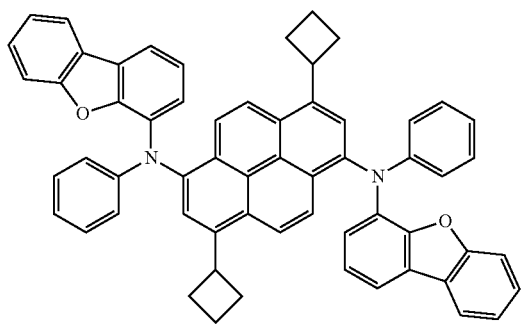

FD36

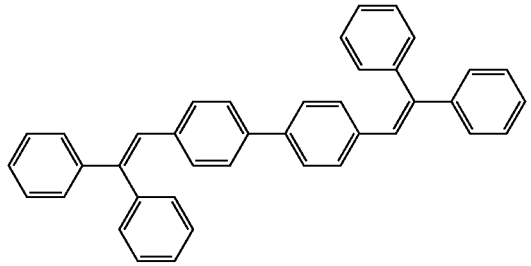

DPVBi

DPAVBi

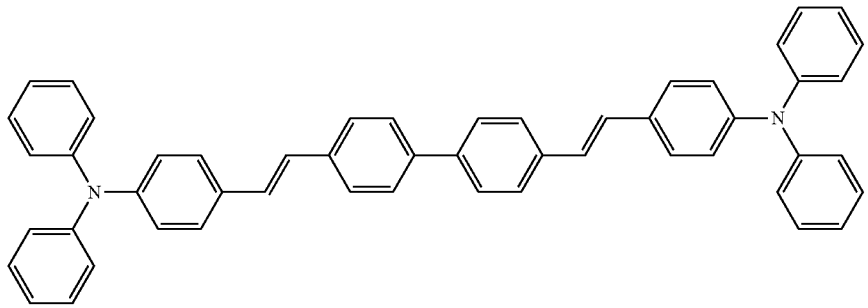

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescent material included in the emission layer may act as a host or a dopant depending on the type or kind of other materials included in the emission layer.

In an embodiment, a difference between a triplet energy level (eV) of the delayed fluorescence material and a singlet energy level (eV) of the delayed fluorescence material may be greater than or equal to 0 eV and less than or equal to 0.5 eV. When the difference between the triplet energy level (eV) of the delayed fluorescent material and the singlet energy level (eV) of the delayed fluorescence material is satisfied within the range above, up-conversion from the triplet state to the singlet state of the delayed fluorescence material may effectively occur, and thus, luminescence efficiency of the light-emitting device 10 may be improved.

For example, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).
An example of the delayed fluorescence material is at least one of Compounds DF1 to DF9:
DF1
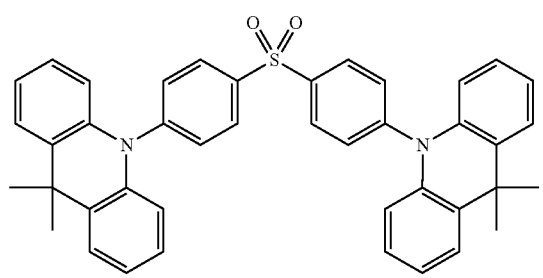
(DMAC-DPS)
DF2
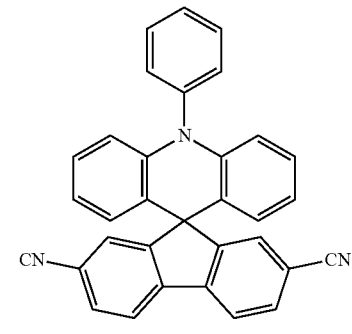
(ACRFLCN)
DF3
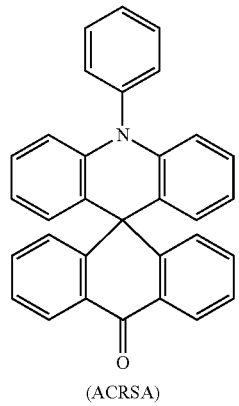
(ACRSA)
DF4
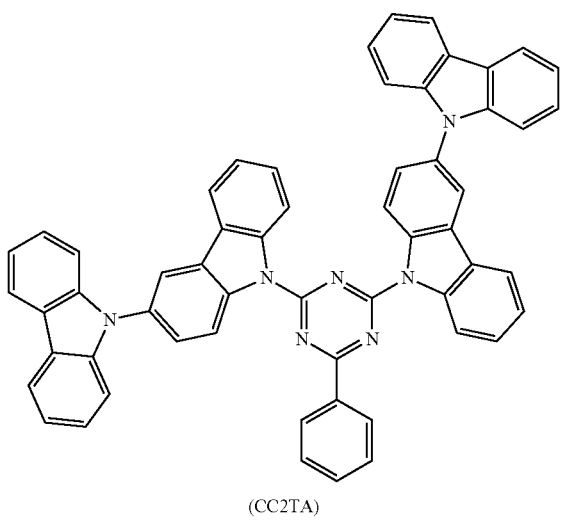
(CC2TA)
DF5
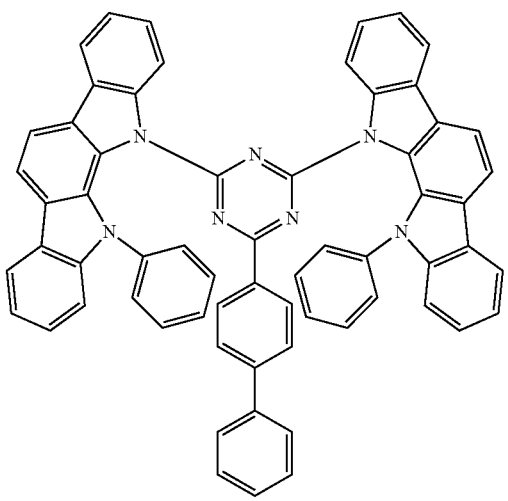
(PIC-TRZ)
DF6
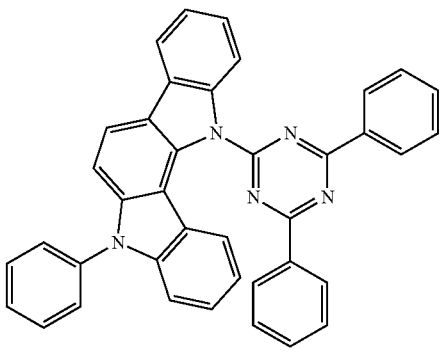
(PIC-TRZ2)

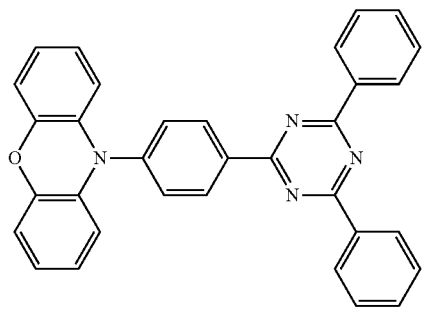

(PXZ-TRZ)

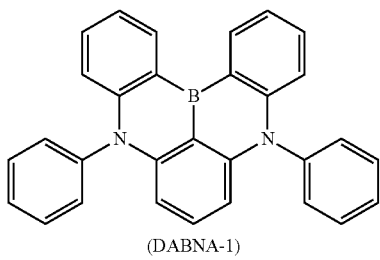

(DABNA-1)

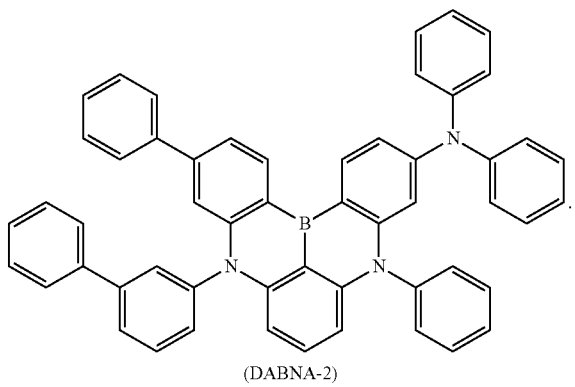

(DABNA-2)

Quantum Dot

The emission layer may include a quantum dot.

In the present specification, the quantum dot refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or any suitable process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which has relatively lower costs.

The quantum dot may include: a Group III-VI semiconductor compound; a Group II-VI semiconductor compound; a Group III-V semiconductor compound; a Group III-VI semiconductor compound; a Group semiconductor compound; a Group IV-VI semiconductor compound; a Group IV element or compound; or any combination thereof.

Examples of the Group III-VI semiconductor compound include: a binary compound, such as $In_2S_3$, GaS, GaSe, $Ga_2Se_3$, GaTe, InS, InSe, $In_2Se_3$, and InTe; a ternary compound, such as AgInS, $AgInS_2$, CuInS, $CuInS_2$, $InGaS_3$, and $InGaSe_3$; or any combination thereof.

Examples of the Group II-VI semiconductor compound include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; a quaternary compound, such as CdZnSeS, CdZnSeTe, CdZnSTe, CdHgSeS, CdHgSeTe, CdHgSTe, HgZnSeS, HgZnSeTe, and HgZnSTe; or any combination thereof.

Examples of the Group III-V semiconductor compound include: a binary compound, such as GaN, GaP, GaAs, GaSb, AlN, AlP, AlAs, AlSb, InN, InP, InAs, and InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; or any combination thereof. In an embodiment, the Group III-V semiconductor compound may further include a Group II element. Examples of the Group III-V further including a Group II element include InZnP, InGaZnP, InAlZnP, and the like.

Examples of the Group semiconductor compound include: a ternary compound, such as AgInS, $AgInS_2$, CuInS, $CuInS_2$, $CuGaO_2$, $AgGaO_2$, and $AgAlO_2$; or any combination thereof.

Examples of the Group IV-VI semiconductor compound include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, and SnPbTe; a quaternary compound, such as SnPbSSe, SnPbSeTe, and SnPbSTe; or any combination thereof.

Examples of the Group IV element or compound include: a single element compound, such as Si and Ge; a binary compound, such as SiC and SiGe; or any combination thereof.

Each element included in a multi-element compound, such as the binary compound, ternary compound, and quaternary compound, may exist in a particle with a uniform concentration or non-uniform concentration.

Meanwhile, the quantum dot may have a single structure or a dual core-shell structure. In the case of the quantum dot having a single structure, a concentration of each element included in the corresponding quantum dot may be uniform (e.g., substantially uniform). For example, a material included in the core may be different from a material included in the shell.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multilayer. The interface between the core and the shell may have a concentration gradient that decreases along a direction toward the center of the element present in the shell.

Examples of the shell of the quantum dot include an oxide of metal, and/or non-metal, a semiconductor compound, and any combination thereof. Examples of the oxide of metal or non-metal include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; a ternary compound, such as $MgAl_2O_4$, $CoFe_2O_4$, $NiFe_2O_4$, and $CoMn_2O_4$; or any combination thereof. Examples of the semiconductor compound include: as described herein, a Group III-VI semiconductor compound; a Group II-VI semiconductor compound; a Group III-V semiconductor compound; a Group I-III-VI semiconductor compound; a Group IV-VI semiconductor compound; or any combination thereof. Examples of the semiconductor compound include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less. In addition, because the light emitted through the quantum dot is emitted in all directions (e.g., substantially every direction), the wide viewing angle may be improved.

In addition, the quantum dot may be, for example, a spherical, pyramidal, multi-arm, and/or cubic nanoparticle, a nanotube, a nanowire, a nanofiber, and/or nanoplate particle.

Because an energy band gap can be adjusted by controlling the size of the quantum dot, light having various suitable wavelength bands may be obtained from a quantum dot emission layer. Therefore, by using quantum dots of different sizes, a light-emitting display that emits light of various suitable wavelengths may be implemented. In an embodiment, the size of the quantum dot may be selected to emit red, green, and/or blue light. In addition, the size of the quantum dot may be configured to emit white light by combining light of various suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a hole blocking layer, an electron transport layer, an electron injection layer, or any combination thereof.

For example, the electron transport region may have an electron transport layer/electron injection layer structure or a hole blocking layer/electron transport layer/electron injection layer structure, wherein layers in each structure are sequentially stacked on the emission layer.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In one or more embodiments, the electron transport region may include a compound represented by Formula 601:

$$[Ar_{601}]_{xe11}-[(L_{601})_{xe1}-R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked via a single bond.

In one or more embodiments, $Ar_{601}$ in Formula 601 may be a substituted or unsubstituted anthracene group.

In one or more embodiments, the electron transport region may include a compound represented by Formula 601-1:

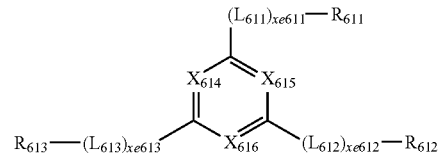

Formula 601-1 wherein, in Formula 601-1, $X_{614}$ may be N or $C(R_{614})$, $X_{615}$ may be N or $C(R_{615})$, and $X_{616}$ may be N or $C(R_{616})$, wherein at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1
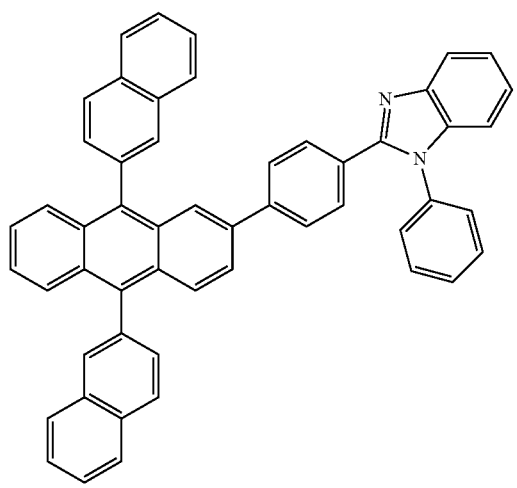
ET2
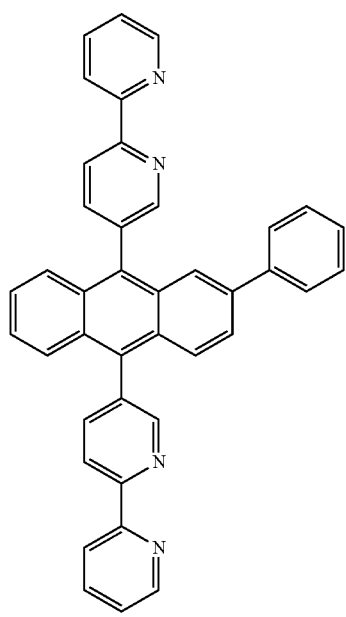
ET3
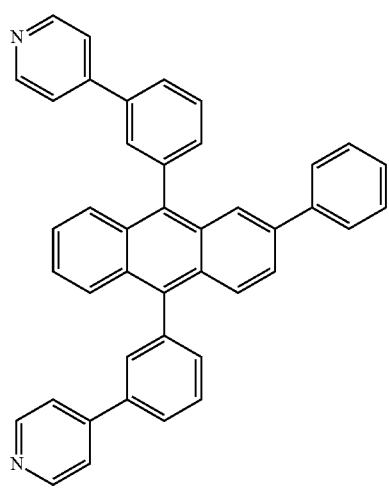
ET4
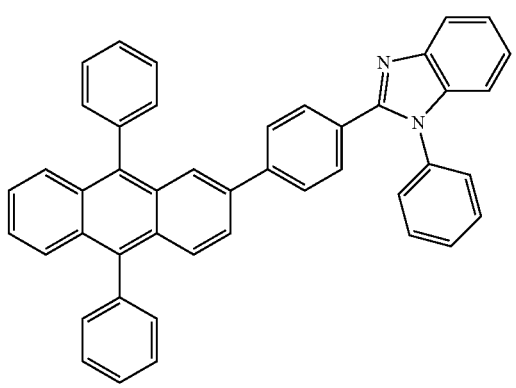
ET5
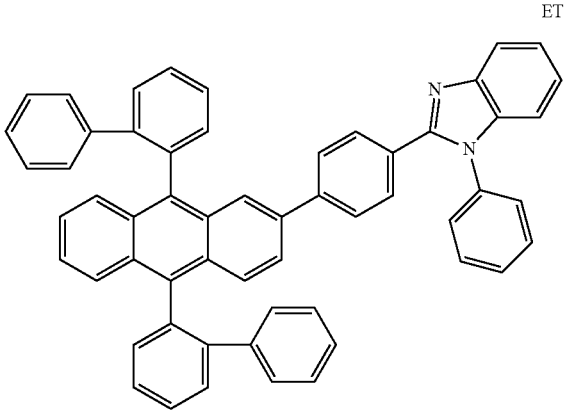
ET6
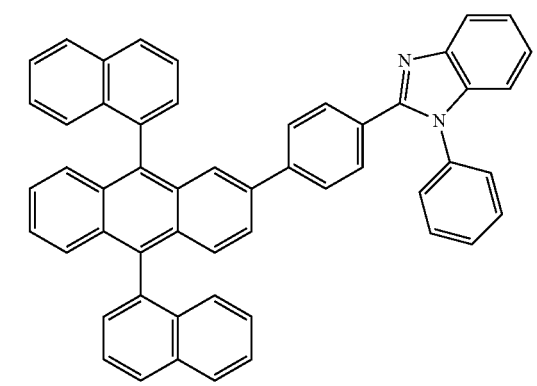

ET7
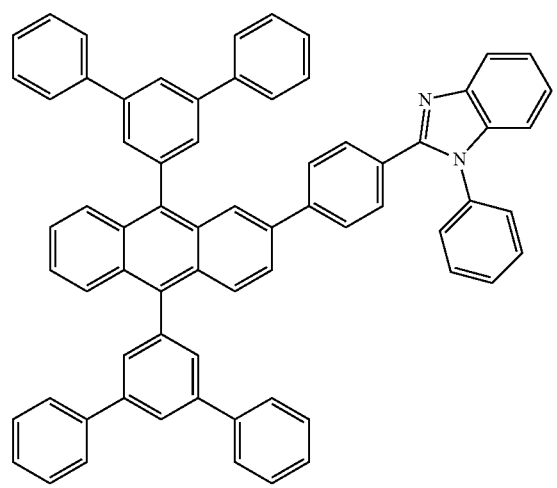
ET8
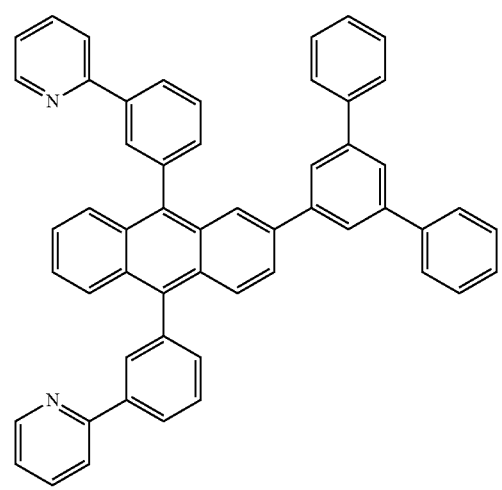
ET9
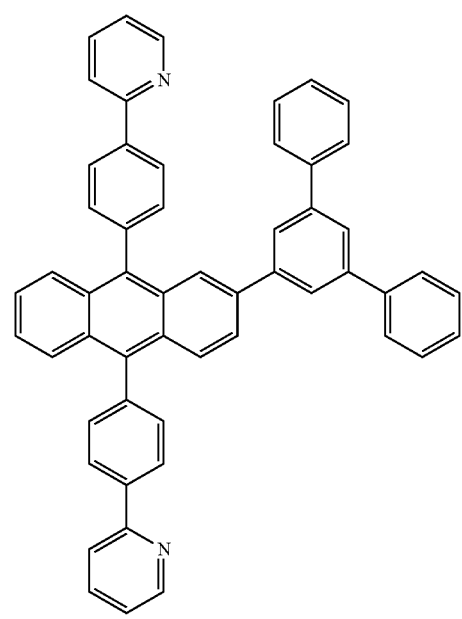
ET10
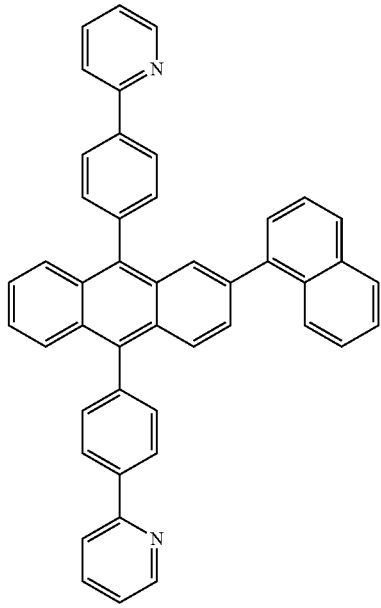
ET11
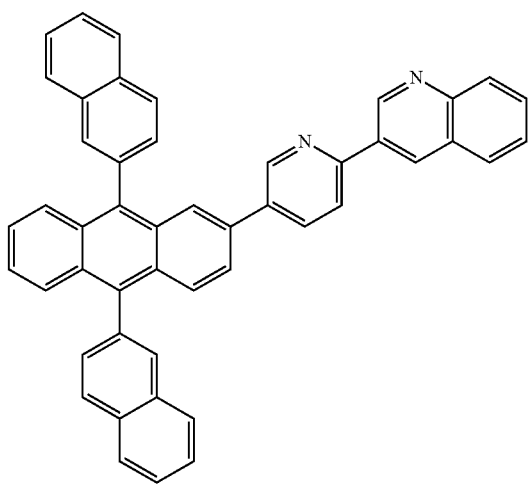
ET12
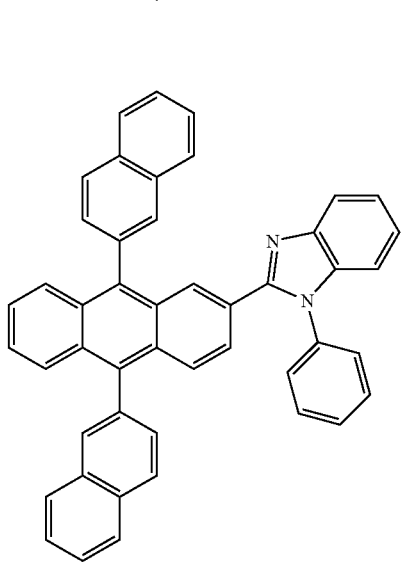

ET13
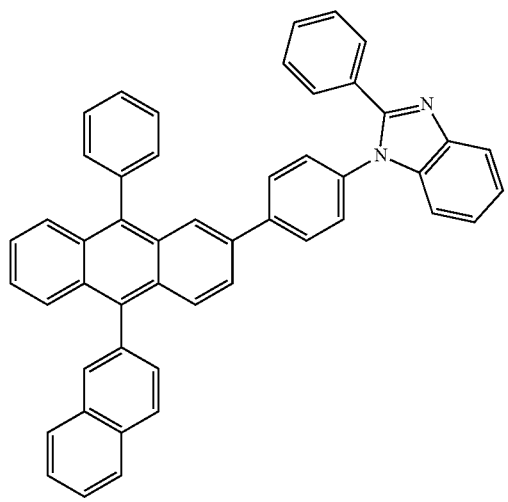
ET14
ET15
ET16
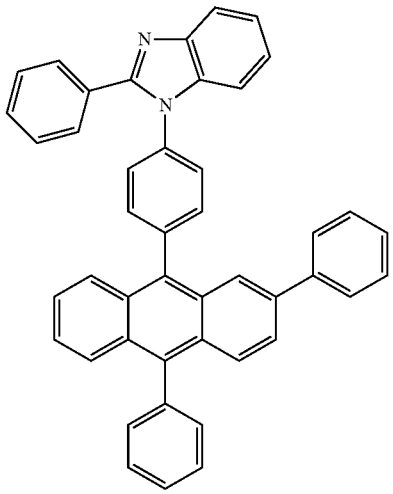
ET17
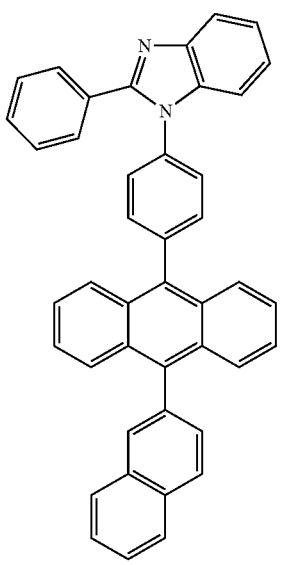
ET18
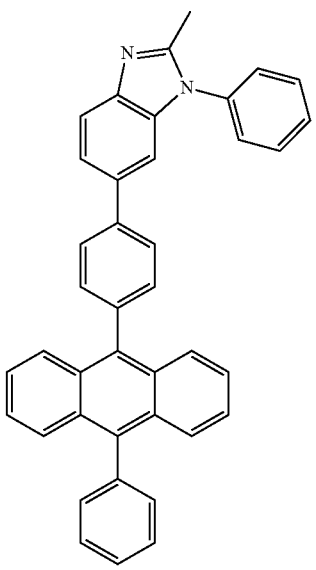

ET19
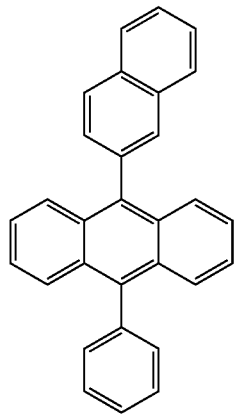
ET20
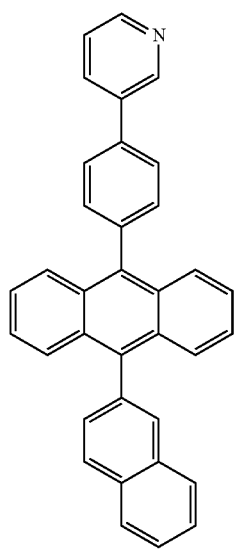
ET21
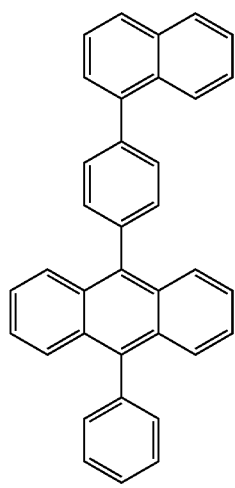
ET22
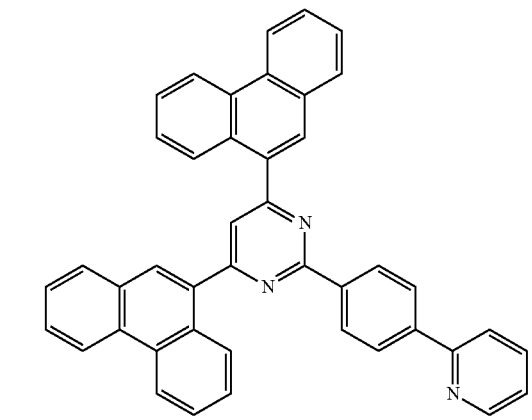
ET23
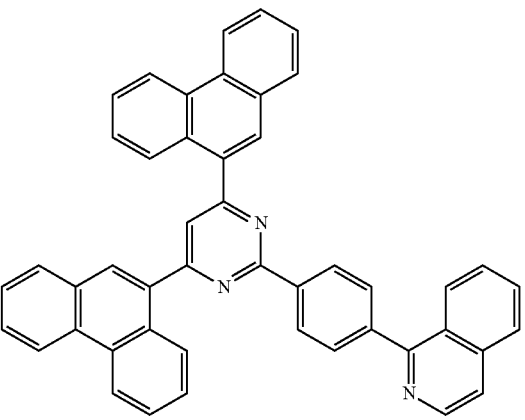
ET24

ET25
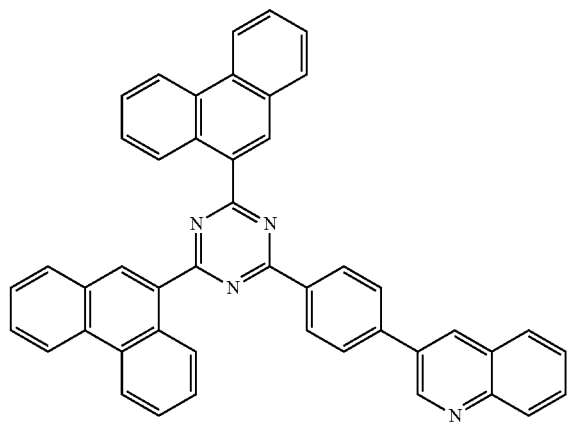
ET26
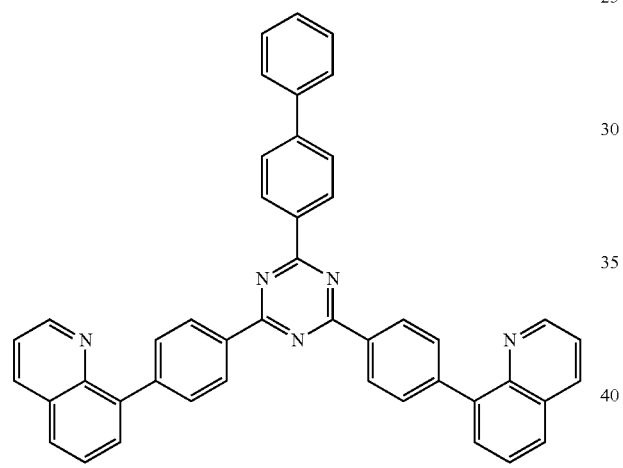
ET27
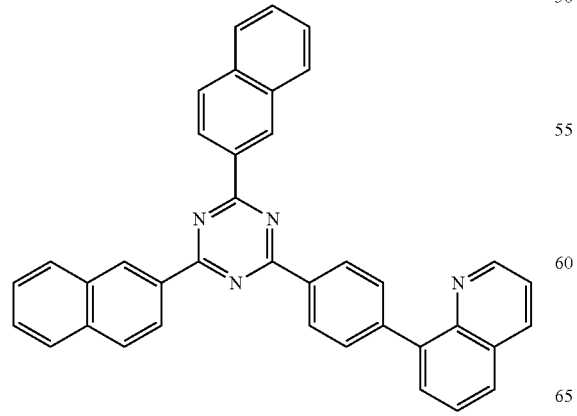
ET28
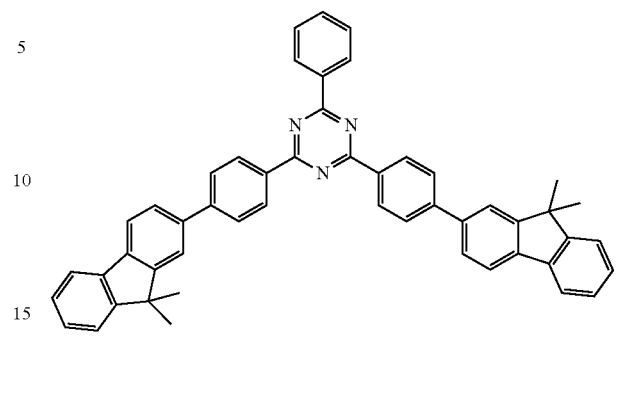
ET29
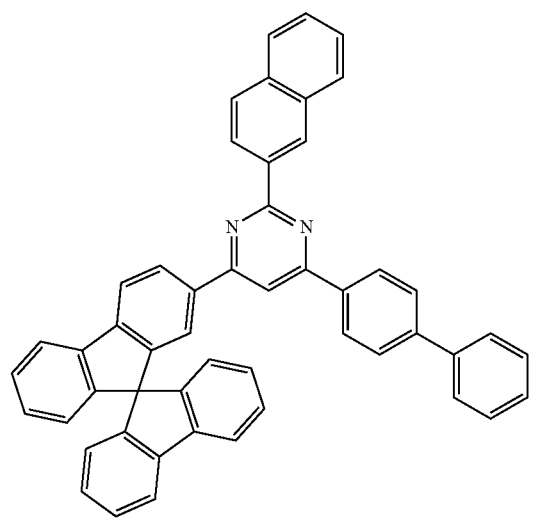
ET30
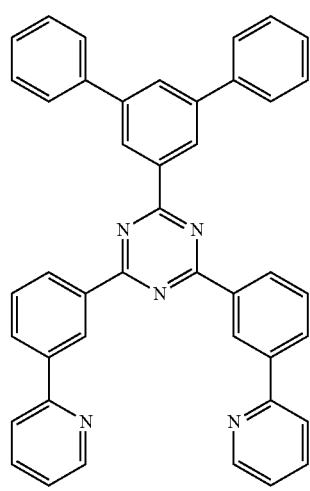

-continued
ET31
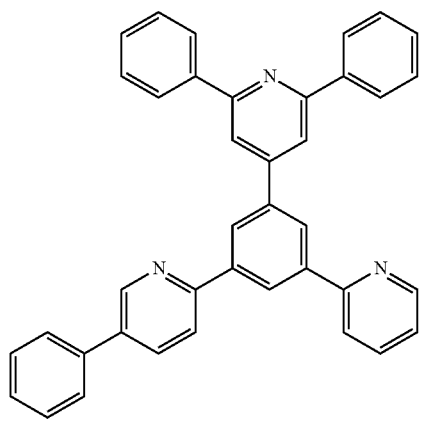
ET32
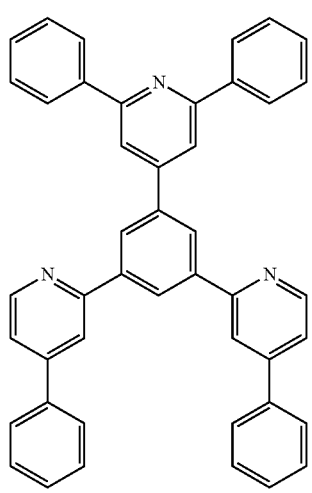
ET33
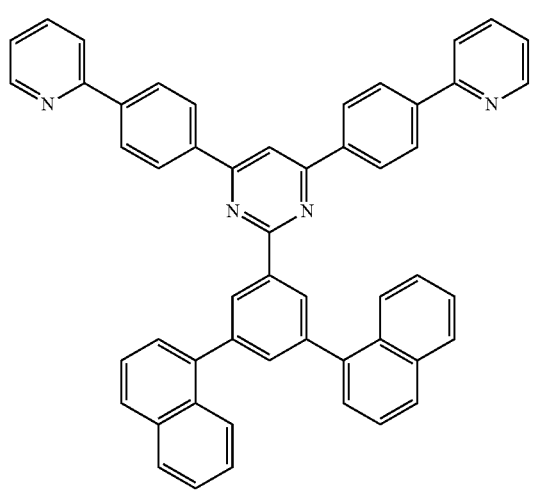
-continued
ET34
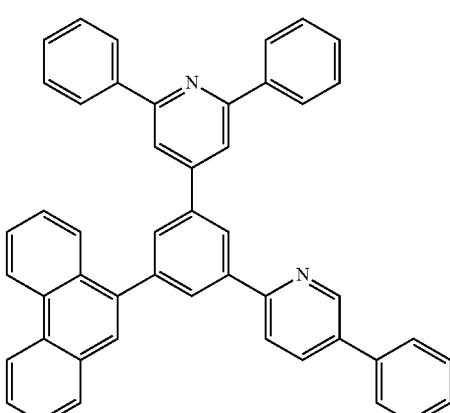
ET35
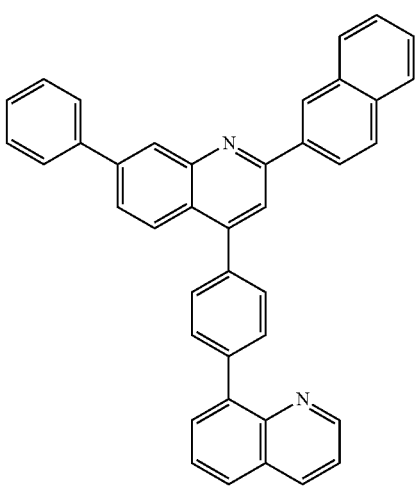
ET36
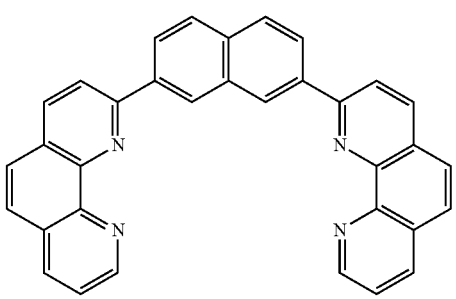
ET37
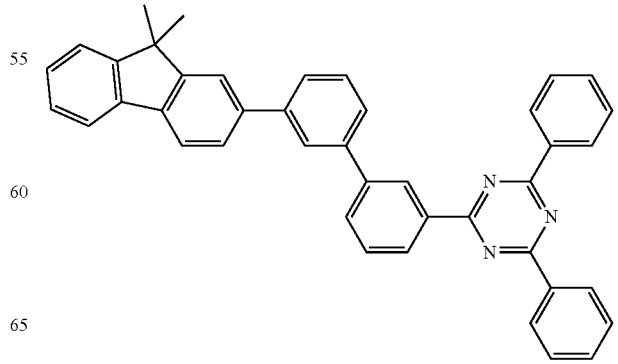

ET38
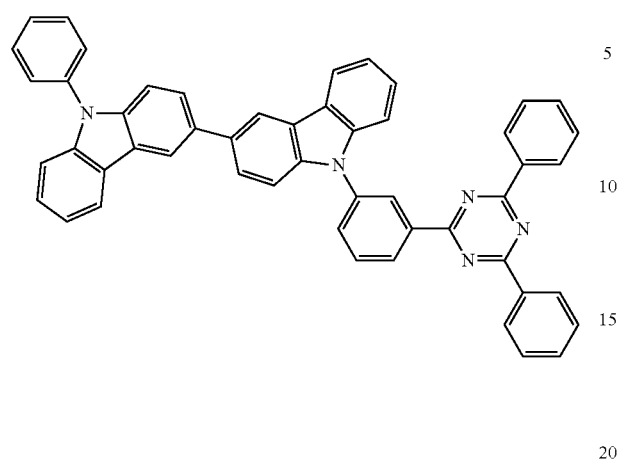
ET39
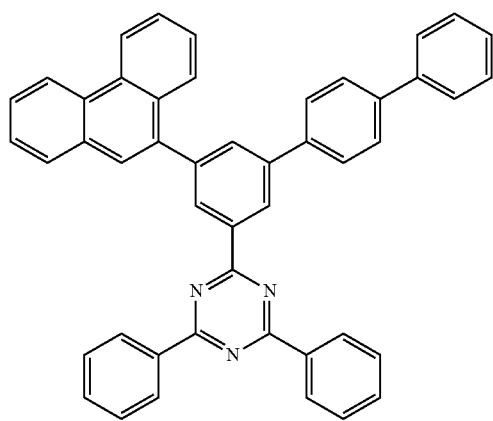
ET40
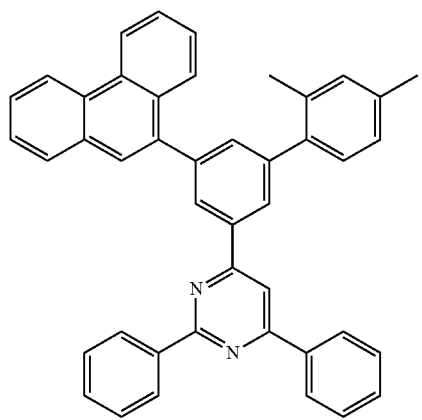
ET41
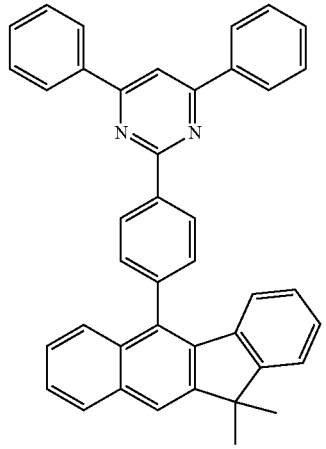
ET42
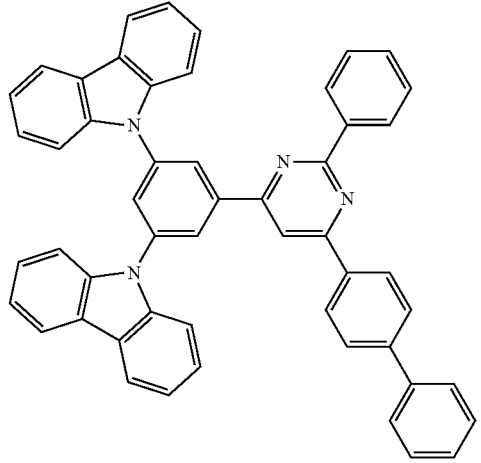
ET43
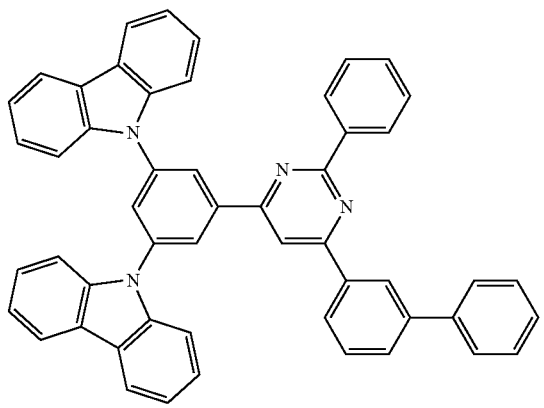

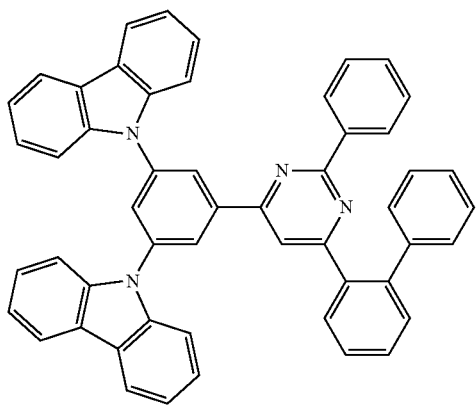

ET44

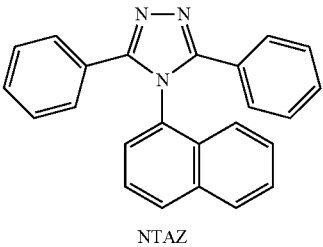

NTAZ

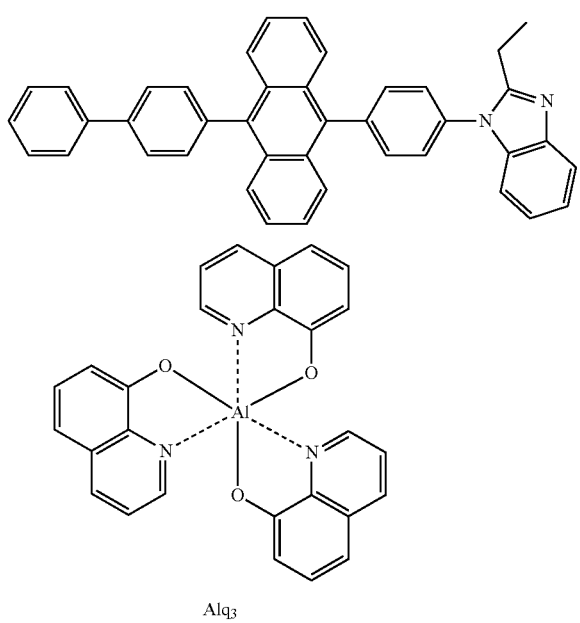

Alq₃

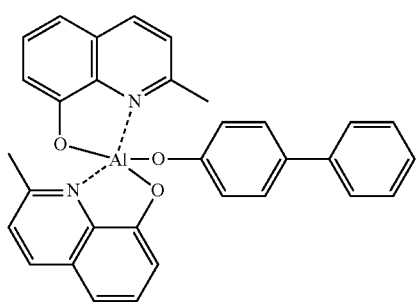

BAlq

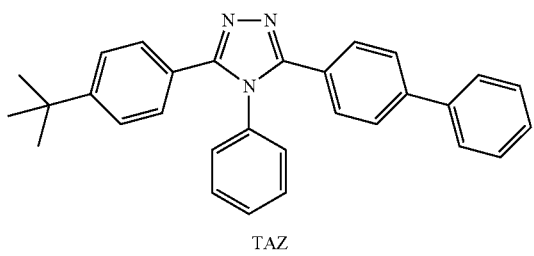

TAZ

A thickness of the electron transport region may be in a range of about 160 Å to about 5,000 Å, for example, from about 100 Å to about 4,000 Å. When the electron transport region includes a hole blocking layer, an electron transport layer, or any combination thereof, a thickness of the hole blocking layer or a thickness of the electron transport layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thickness of the hole blocking layer and/or the electron transport layer is within these ranges, suitable or satisfactory electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, alkaline earth metal complex, or any combination thereof. The metal ion of an alkali metal complex may be a Li ion, a Na ion, a K ion, a Rb ion, or a Cs ion, and the metal ion of alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

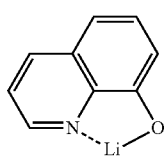

ET-D1

-continued

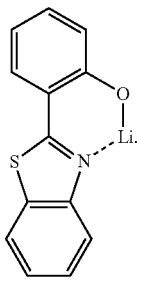
ET-D2

The electron transport region may include an electron injection layer that facilitates the injection of electrons from the second electrode 150. The electron injection layer may be in direct contact (e.g., physical contact) with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (wherein x is a real number satisfying the condition of 0<x<1), $Ba_xCa_{1-x}O$ (wherein x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. For example, the rare earth metal-containing compound may include lanthanide metal telluride. Examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. For example, the electron injection layer may be a KI:Yb co-deposited layer, an RbI:Yb co-deposited layer, and/or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have suitable or satisfactory electron injection characteristics without a substantial increase in driving voltage.

Second Electrode 150

The second electrode 150 is on the interlayer 130 having such a structure. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be outside the first electrode 110, and/or a second capping layer may be outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward the outside through the first electrode 110, which is a semi-transmissive electrode or a transmissive electrode, and the first capping layer, or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 is increased, so that the luminescence efficiency of the light-emitting device 10 may be improved.

Each of the first capping layer and second capping layer may include a material having a refractive index (at a wavelength of 589 nm) of equal to or greater than 1.6.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-based complex, or any combination thereof. The carbocyclic compound, the heterocyclic compound, and the amine group-containing compound may optionally be substituted with a substituent containing O, N, S, Se, Si, F, Cl, Br, I, or any combination thereof. In an embodiment, at least one of the first capping layer and the second capping layer may each independently include an amine group-containing compound.

In one or more embodiments, at least one of the first capping layer and the second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP6, β-NPB, or any combination thereof, but embodiments of the present disclosure are not limited thereto:

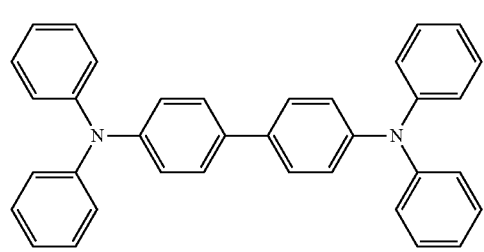

CP1

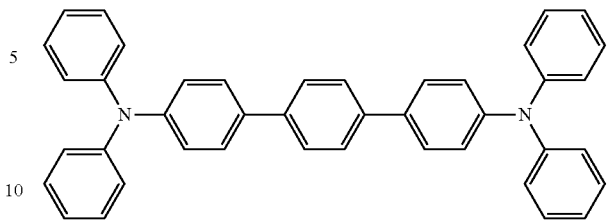

CP2

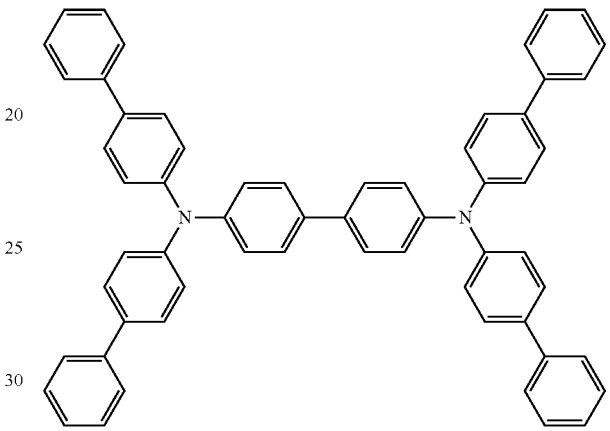

CP3

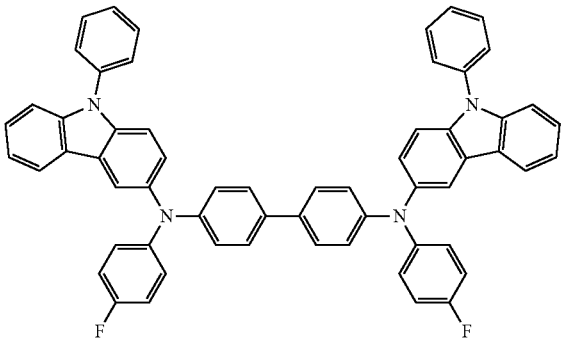

CP4

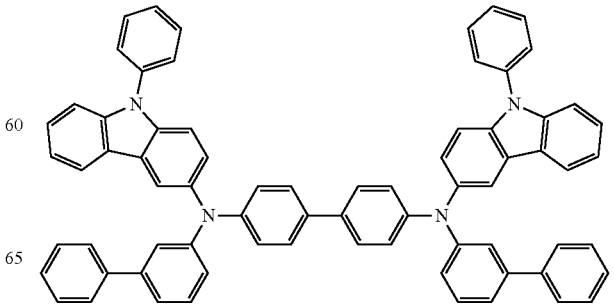

CP5

-continued

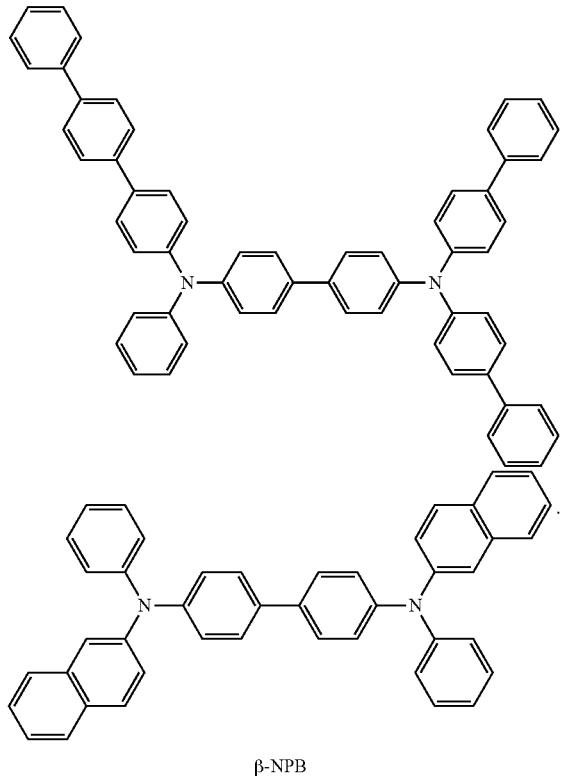

CP6

β-NPB

Electronic Apparatus

The light-emitting device may be included in various suitable electronic apparatuses. For example, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be in at least one traveling direction of light emitted from the light-emitting device. For example, the light emitted from the light-emitting device may be blue light. The light-emitting device may be the same as described above. In an embodiment, the color conversion layer may include quantum dots. The quantum dots may be the same as described elsewhere herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-blocking patterns located among the color filter areas, and the color conversion layer may include a plurality of color conversion areas and light-blocking patterns among between the color conversion areas.

The plurality of color filter areas (or the plurality of color conversion areas) may include a first area that emits a first color light, a second area that emits a second color light, and/or a third area that emits a third color light, and the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. In more detail, the first area may include red quantum dots, the second area may include green quantum dots, and the third area may not include quantum dots. The quantum dots may be the same as described elsewhere herein. The first area, the second area, and/or the third area may each include a scatterer.

In an embodiment, the light-emitting device may emit a first light, the first area may absorb the first light to emit a first first-color light, the second area may absorb the first light to emit a second first-color light, and the third area may absorb the first light to emit a third first-color light. In this embodiment, the first first-color light, the second first-color light, and the third-first light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one selected from the source electrode and the drain electrode may be electrically coupled to any one selected from the first electrode and the second electrode of the light-emitting device.

The thin-film transistor may include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion and/or the color conversion layer may be placed between the color filter and the light-emitting device. The sealing portion allows light from the light-emitting device to be extracted to the outside, while concurrently (e.g., simultaneously) preventing or reducing penetration of ambient air and/or moisture into the light-emitting device. The sealing portion may be a sealing substrate including a transparent glass and/or a plastic substrate. The sealing portion may be a thin-film encapsulation layer including at least one layer of an organic layer and/or an inorganic layer. When the sealing portion is a thin-film encapsulation layer, the electronic apparatus may be flexible.

Various suitable functional layers may be additionally on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, and/or an infra-red touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
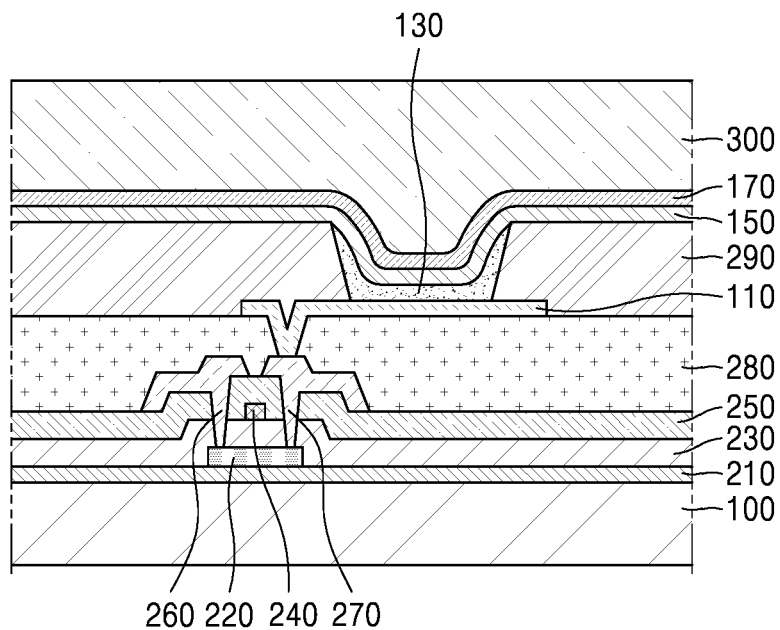
FIG. 2 is a cross-sectional view of a light-emitting apparatus according to an embodiment.
Figure 3:
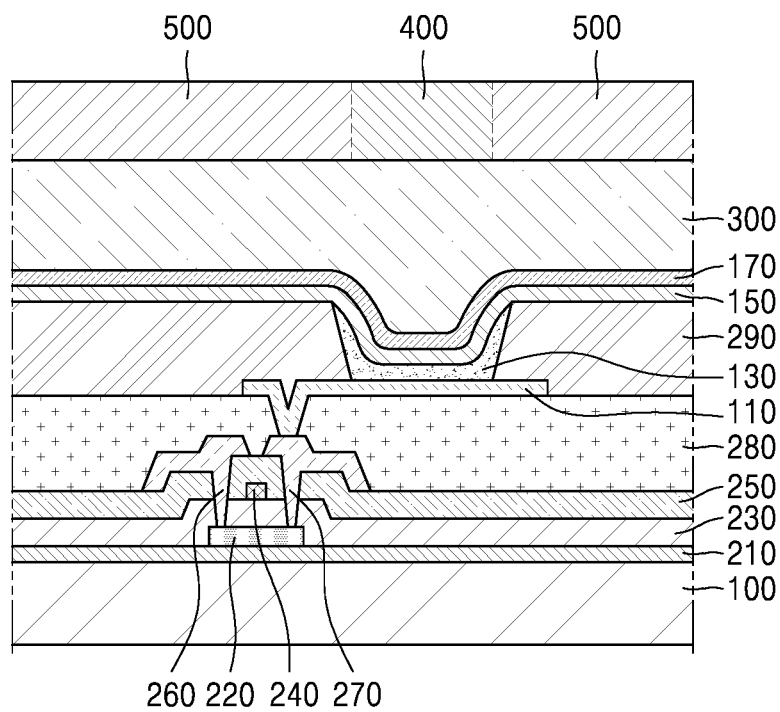
FIG. 3 is a cross-sectional view of a light-emitting apparatus according to another embodiment.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be on the substrate 100. The buffer layer 210 may prevent or reduce penetration of impurities through the substrate 100 and may provide a flat surface on the substrate 100.

A TFT may be on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be between the gate electrode 240 and the source electrode 260 to insulate the gate electrode 240 from the source electrode 260, and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may expose the source region and the drain region of the activation layer 220, and the source electrode 260 and the drain electrode 270 may be in contact (e.g., physical contact) with the exposed portions of the source region and the drain region of the activation layer 220.

The TFT may be electrically coupled to a light-emitting device to drive the light-emitting device, and may be covered by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may expose a portion of the drain electrode 270 without completely covering the drain electrode 270, and the first electrode 110 may be coupled to the exposed portion of the drain electrode 270.

A pixel defining layer 290 containing an insulating material may be on the first electrode 110. The pixel defining layer 290 exposes a region of the first electrode 110, and an interlayer 130 may be in the exposed region of the first electrode 110. The pixel defining layer 290 may be a polyimide-based organic film and/or a polyacrylic-based organic film. In one or more embodiments, at least some layers of the interlayer 130 may extend beyond the upper portion of the pixel defining layer 290 to be in the form of a common layer.

The second electrode 150 may be on the interlayer 130, and a capping layer 170 may be additionally on the second electrode 150. The capping layer 170 may cover the second electrode 150.

The encapsulation portion 300 may be on the capping layer 170. The encapsulation portion 300 may be on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or a combination of the inorganic film and the organic film.

FIG. 3 shows a cross-sectional view of a light-emitting apparatus according to another embodiment of the present disclosure.

The light-emitting apparatus of FIG. 3 is substantially the same as the light-emitting apparatus of FIG. 2, except that a light-blocking pattern 500 and a functional region 400 are additionally on the encapsulation portion 300. The functional region 400 may include i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When respective layers included in the hole transport region, the emission layer, and respective layers included in the electron transport region are formed by vacuum deposition, the deposition conditions may include, for example, a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec, by taking into account a material to be included in a layer to be formed and the structure of a layer to be formed.

When respective layers included in the hole transport region, the emission layer, and respective layers included in the electron transport region are formed by spin coating, the coating conditions may include, for example, a coating speed in a range of about 2,000 rpm to about 5,000 rpm and a heat treatment temperature in a range of about 80° C. to 200° C., by taking into account a material to be included in a layer to be formed and the structure of a layer to be formed.

General Definition of at Least Some of the Substituents

The term "$C_3$-$C_{60}$ carbocyclic group," as used herein, refers to a cyclic group consisting of carbon only and having three to sixty carbon atoms, and the term "$C_1$-$C_{60}$ heterocyclic group," as used herein, refers to a cyclic group that further has 1 to 60 carbon atoms in addition to a heteroatom. The $C_3$-$C_{60}$ carbocyclic group and the $C_1$-$C_{60}$ heterocyclic group may each be a monocyclic group consisting of one ring or a polycyclic group in which two or more rings are condensed with each other (e.g., combined together with each other). For example, the number of ring-forming atoms of the $C_1$-$C_{60}$ heterocyclic group may be from 3 to 61.

The "cyclic group," as used herein, may include the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has 3 to 60 carbon atoms and does not include *—N=*' as a ring-forming moiety, and the term "π electron-deficient nitrogen-containing $C_1$-$C_{60}$ cyclic group," as used herein, refers to a heterocyclic group that has 1 to 60 carbon atoms and includes *—N=*' as a ring-forming moiety.

For example,
- the $C_3$-$C_{60}$ carbocyclic group may be i) group T1 or ii) a condensed cyclic group in which two or more groups T1 are condensed with (e.g., combined together with) each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, or an indenoanthracene group),
- the $C_1$-$C_{60}$ heterocyclic group may be i) group T2, ii) a condensed cyclic group in which two or more groups T2 are condensed with (e.g., combined together with) each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.),
- the π electron-rich $C_3$-$C_{60}$ cyclic group may be i) group T1, ii) a condensed cyclic group in which two or more groups T1 are condensed with (e.g., combined together with) each other, iii) group T3, iv) a condensed cyclic group in which two or more groups T3 are condensed with (e.g., combined together with) each other, or v) a condensed cyclic group in which at least one group T3 and at least one group T1 are condensed with (e.g., combined together with) each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.),
- the π electron-deficient nitrogen-containing $C_1$-$C_{60}$ cyclic group may be i) group T4, ii) a condensed cyclic group in which two or more group T4 are condensed with (e.g., combined together with) each other, iii) a condensed cyclic group in which at least one group T4 and at least one group T1 are condensed with (e.g., combined together with) each other, iv) a condensed cyclic group in which at least one group T4 and at least one group T3 are condensed with (e.g., combined together with) each other, or v) a condensed cyclic group in which at least one group T4, at least one group T1, and at least one group T3 are condensed with (e.g., combined together with) one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.),
- group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group," as used herein, refer to a group condensed to any suitable cyclic group or a polyvalent group (for example, a divalent group, a trivalent group, a tetravalent group, etc.), depending on the structure of a formula in connection with which the terms are used. For example, "a benzene group" may be a benzo group, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group that has 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at the terminus of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of the $C_2$-$C_{60}$ alkyl group, and examples thereof include an ethynyl group and a propynyl group. The term "$C_1$-$C_{60}$ alkynylene group," as used herein refers to a divalent group having substantially the same structure as the $C_1$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has three to ten carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having six to sixty carbon atoms, and the term "$C_6$-$C_{60}$ arylene group," as used herein, refers to a divalent group having a carbocyclic aromatic system having six to sixty carbon atoms. Examples of the $C_6$-$C_{60}$ aryl group include a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed with each other (e.g., combined together with each other).

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other (e.g., combined together with each other).

The term "monovalent non-aromatic condensed polycyclic group," as used herein, refers to a monovalent group (for example, having 8 to 60 carbon atoms) having two or more rings condensed to each other (e.g., combined together with each other), only carbon atoms as ring-forming atoms, and no aromaticity in its entire molecular structure (e.g., is not aromatic when considered as a whole). Examples of the monovalent non-aromatic condensed polycyclic group include an indenyl group, a fluorenyl group, a spiro-bifluorenyl group, a benzofluorenyl group, an indeno phenanthrenyl group, and an indenon anthracenyl group. The term "divalent non-aromatic condensed polycyclic group," as used herein, refers to a divalent group having substantially the same structure as a monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together with each other), at least one heteroatom other than carbon atoms, as a ring-forming atom, and no aromaticity in its entire molecular structure (e.g., is not aromatic when considered as a whole). Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterocondensed polycyclic group" as used herein refers to a divalent group having substantially the same structure as a monovalent non-aromatic heterocondensed polycyclic group.

The term "$C_6$-$C_{60}$ aryloxy group," as used herein, indicates —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "$R_{10a}$," as used herein, refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom," as used herein, refers to any atom other than a carbon atom. Examples of the heteroatom include O, S, N, P, Si, B, Ge, Se, or any combination thereof.

The term "Ph," as used herein, refers to a phenyl group, the term "Me," as used herein, refers to a methyl group, the term "Et," as used herein, refers to an ethyl group, the term "ter-Bu" or "But," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

*and *', as used herein, unless defined otherwise, each refer to a binding site to a neighboring atom in a corresponding formula.

Hereinafter, a compound according to embodiments and a light-emitting device according to embodiments will be described in more detail with reference to Examples.

EXAMPLES

Manufacture of Light-Emitting Device

Comparative Example 1

A glass substrate (anode) including ITO 300 Å/Ag 50 Å/ITO 300 Å was cut to a size of 50 mm×50 mm×0.7 mm, sonicated with isopropyl alcohol and pure water each for 5 minutes, and then cleaned by exposure to ultraviolet rays and ozone for 30 minutes. Then, the glass substrate was provided to a vacuum deposition apparatus.

HATCN was vacuum-deposited on the glass substrate to form a hole injection layer having a thickness of 50 Å. Next, NPB as a hole transport compound was vacuum-deposited on the hole injection layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

Yb was vacuum-deposited on the electron transport layer to a thickness of 10 Å, AgMg was continuously vacuum-deposited on thereon to form a cathode having a thickness of 100 Å, and CPL was deposited on the cathode to form a capping layer having a thickness of 700 Å, thereby completing the manufacture of a light-emitting device.

Example 1

A light-emitting device was manufactured in substantially the same manner as in Comparative Example 1, except that, in forming the second emission layer, Compound host-2 (host), Compound 100 (dopant), and TPM-TAZ (electron transport compound) were co-deposited to form a second emission layer having a thickness of 100 Å (a weight ratio of Compound host-2: Compound 100 was 97:3 and a weight of TPM-TAZ was about 10 wt % based on the total weight of the compounds).

Comparative Example 2

A glass substrate (anode) including ITO 300 Å/Ag 50 Å/ITO 300 Å was cut to a size of 50 mm×50 mm×0.7 mm, sonicated with isopropyl alcohol and pure water each for 5 minutes, and then cleaned by exposure to ultraviolet rays and ozone for 30 minutes. Then, the glass substrate was provided to a vacuum deposition apparatus.

HATCN was vacuum-deposited on the glass substrate to form a hole injection layer having a thickness of 50 Å. Next, NPB as a hole transport compound was vacuum-deposited on the hole injection layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (I) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

BCP and Li were co-deposited at a weight ratio of 5:5 on the electron transport layer to form a first n-charge generation layer having a thickness of 300 Å, and HATCN was deposited on the first n-charge generation layer to form a first p-charge generation layer having a thickness of 50 Å.

NPB as a hole transport compound was vacuum-deposited on the first p-charge generation layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (II) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

BCP and Li were co-deposited at a weight ratio of 5:5 on the electron transport layer to form a second n-charge generation layer having a thickness of 300 Å, and HATCN was deposited on the second n-charge generation layer to form a second p-charge generation layer having a thickness of 50 Å.

NPB as a hole transport compound was vacuum-deposited on the second p-charge generation layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (III) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

Yb was vacuum-deposited on the electron transport layer to a thickness of 10 Å, AgMg was continuously vacuum-deposited on thereon to form a cathode having a thickness of 100 Å, and CPL was deposited on the cathode to form a capping layer having a thickness of 700 Å, thereby completing the manufacture of a tandem-type or kind of light-emitting device including three emission layer stacks.

Example 2

A light-emitting device was manufactured in substantially the same manner as in Comparative Example 2, except that, in forming the second emission layer of the emission layer stack (I), Compound host-2 (host), Compound 100 (dopant), and TPM-TAZ (electron transport compound) were co-deposited to form a second emission layer having a thickness of 100 Å (a weight ratio of Compound host-2: Compound 100 was 97:3 and a weight of TPM-TAZ was about 10 wt % based on the total weight of the compounds).

Example 3

A light-emitting device was manufactured in substantially the same manner as in Comparative Example 2, except that, in forming each of the second emission layer of the emission layer stack (I) and the second emission layer of the emission layer stack (II), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Example 4

A light-emitting device was manufactured in substantially the same manner as in Comparative Example 2, except that, in forming each of the second emission layer of the emission layer stack (I) and the second emission layer of the emission layer stack (III), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Example 5

A light-emitting device was manufactured in substantially the same manner as in Comparative Example 2, except that, in forming each of the second emission layer of the emission layer stack (I), the second emission layer of the emission layer stack (II), and the second emission layer of the emission layer stack (III), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Comparative Example 3

A glass substrate (anode) including ITO 300 Å/Ag 50 Å/ITO 300 Å was cut to a size of 50 mm×50 mm×0.7 mm, sonicated with isopropyl alcohol and pure water each for 5 minutes, and then cleaned by exposure to ultraviolet rays and ozone for 30 minutes. Then, the glass substrate was provided to a vacuum deposition apparatus.

HATCN was vacuum-deposited on the glass substrate to form a hole injection layer having a thickness of 50 Å. Next, NPB as a hole transport compound was vacuum-deposited on the hole injection layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (I) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

BCP and Li were co-deposited at a weight ratio of 5:5 on the electron transport layer to form a first n-charge generation layer having a thickness of 300 Å, and HATCN was deposited on the first n-charge generation layer to form a first p-charge generation layer having a thickness of 50 Å.

NPB as a hole transport compound was vacuum-deposited on the first p-charge generation layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (II) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

BCP and Li were co-deposited at a weight ratio of 5:5 on the electron transport layer to form a second n-charge generation layer having a thickness of 300 Å, and HATCN was deposited on the second n-charge generation layer to form a second p-charge generation layer having a thickness of 50 Å.

NPB as a hole transport compound was vacuum-deposited on the second p-charge generation layer to form a hole transport layer having a thickness of 600 Å.

TCTA was vacuum-deposited on the hole transport layer to form an electron blocking layer having a thickness of 50 Å.

Compound host-1 (host) and Compound 100 (dopant) were co-deposited at a weight ratio of 97:3 on the electron blocking layer to form a first emission layer having a thickness of 100 Å.

Compound host-2 (host) and Compound 100 (dopant) were co-deposited at a weight ratio of 97:3 on the first emission layer to form a second emission layer having a thickness of 100 Å, thereby forming an emission layer stack (III) including the first emission layer and the second emission layer.

T2T was vacuum-deposited on the second emission layer to form a hole blocking layer having a thickness of 50 Å.

TPM-TAZ and LiQ were deposited at a weight ratio of 5:5 on the hole blocking layer to form an electron transport layer having a thickness of 300 Å.

BCP and Li were co-deposited at a weight ratio of 5:5 on the electron transport layer to form a third n-charge generation layer having a thickness of 300 Å, and HAT-CN was deposited on the third n-charge generation layer to form a third p-charge generation layer having a thickness of 50 Å.

NPB as a hole transport compound was vacuum-deposited on the third p-charge generation layer to form a hole transport layer having a thickness of 600 Å.

TCTA was vacuum-deposited on the hole transport layer to form an electron blocking layer having a thickness of 50 Å.

TPBI as a host and Irppy$_3$ as a phosphorescent dopant compound were co-deposited at a weight ratio of 97:3 on the electron blocking layer to form a green emission layer having a thickness of 100 Å.

TPM-TAZ and LiQ were deposited at a weight ratio of 5:5 on the green emission layer to form an electron transport layer having a thickness of 300 Å.

Yb was vacuum-deposited on the electron transport layer to a thickness of 10 Å, AgMg was continuously vacuum-deposited on thereon to form a cathode having a thickness of 100 Å, and CPL was deposited on the cathode to form a capping layer having a thickness of 700 Å, thereby completing the manufacture of a tandem-type or kind of light-emitting device including three emission layer stacks and a single-layered green emission layer.

Example 6

A light-emitting device was manufactured in substantially the same manner as in Comparative Example 3, except that, in forming the second emission layer of the emission layer stack (I), Compound host-2 (host), Compound 100 (dopant), and TPM-TAZ (electron transport compound) were co-deposited to form a second emission layer having a thickness of 100 Å (a weight ratio of Compound host-2: Compound 100 was 97:3 and a weight of TPM-TAZ was about 10 wt % based on the total weight of the compounds).

Example 7

A light-emitting device was manufactured in substantially the same manner as in Comparative Example 3, except that, in forming the second emission layer of the emission layer stack (II), Compound host-2 (host), Compound 100 (dopant), and TPM-TAZ (electron transport compound) were co-deposited to form a second emission layer having a thickness of 100 Å (a weight ratio of Compound host-2: Compound 100 was 97:3 and a weight of TPM-TAZ was about 10 wt % based on the total weight of the compounds).

Example 8

A light-emitting device was manufactured in substantially the same manner as in Comparative Example 3, except that, in forming the second emission layer of the emission layer stack (III), Compound host-2 (host), Compound 100 (dopant), and TPM-TAZ (electron transport compound) were co-deposited to form a second emission layer having a thickness of 100 Å (a weight ratio of Compound host-2: Compound 100 was 97:3 and a weight of TPM-TAZ was about 10 wt % based on the total weight of the compounds).

Example 9

A light-emitting device was manufactured in substantially the same manner as in Comparative Example 3, except that, in forming each of the second emission layer of the emission layer stack (I) and the second emission layer of the emission layer stack (II), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Example 10

A light-emitting device was manufactured in substantially the same manner as in Comparative Example 3, except that, in forming each of the second emission layer of the emission layer stack (I) and the second emission layer of the emission layer stack (III), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Example 11

A light-emitting device was manufactured in substantially the same manner as in Comparative Example 3, except that, in forming each of the second emission layer of the emission layer stack (II) and the second emission layer of the emission layer stack (III), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

Example 12

A light-emitting device was manufactured in substantially the same manner as in Comparative Example 3, except that, in forming each of the second emission layer of the emission layer stack (I), the second emission layer of the emission layer stack (II), and the second emission layer of the emission layer stack (III), Compound host-2 (host), Compound 100 (dopant), and TPM-TAZ (electron transport compound) were co-deposited to a thickness of 100 Å (a weight ratio of Compound host-2: Compound 100 was 97:3 and a weight of TPM-TAZ was about 10 wt % based on the total weight of the compounds).

To evaluate the characteristics of the light-emitting devices of Comparative Examples 1 to 3 and Examples 1 to 12, the driving voltage at current density of 10 mA/cm$^2$, efficiency, and lifespan were measured.

The driving voltage and current density of the light-emitting devices were measured using a source meter (Keithley Instrument, 2400 series), and the efficiency was measured using a measurement device C9920-2-12 from Hamamatsu Photonics Inc.

-continued

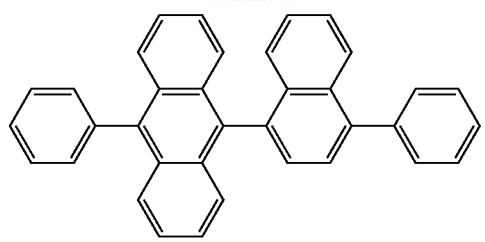

Host-1

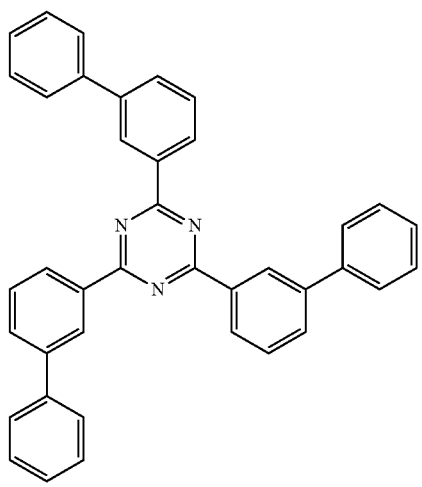

T2T

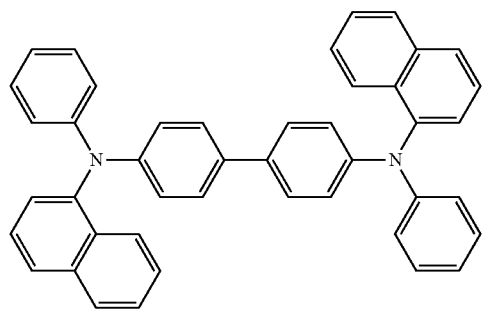

NPB

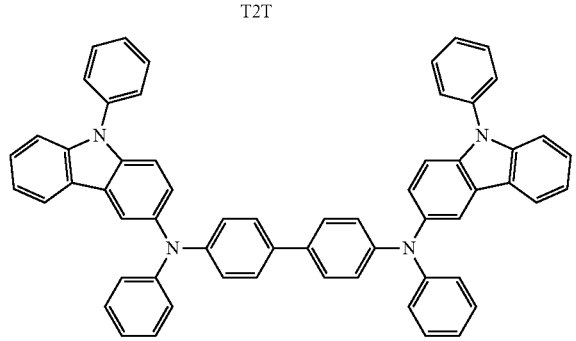

CPL

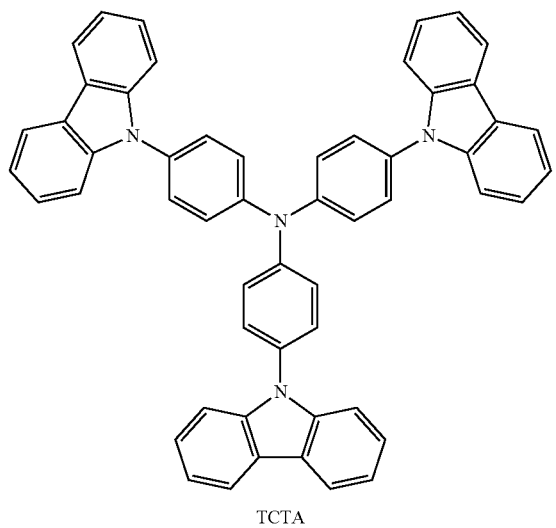

TCTA

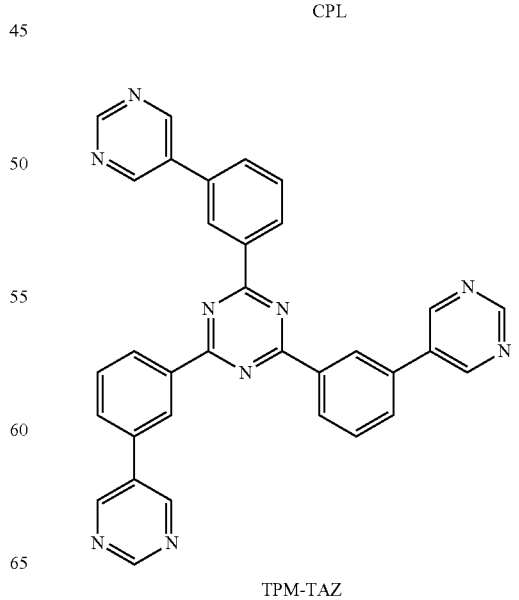

TPM-TAZ

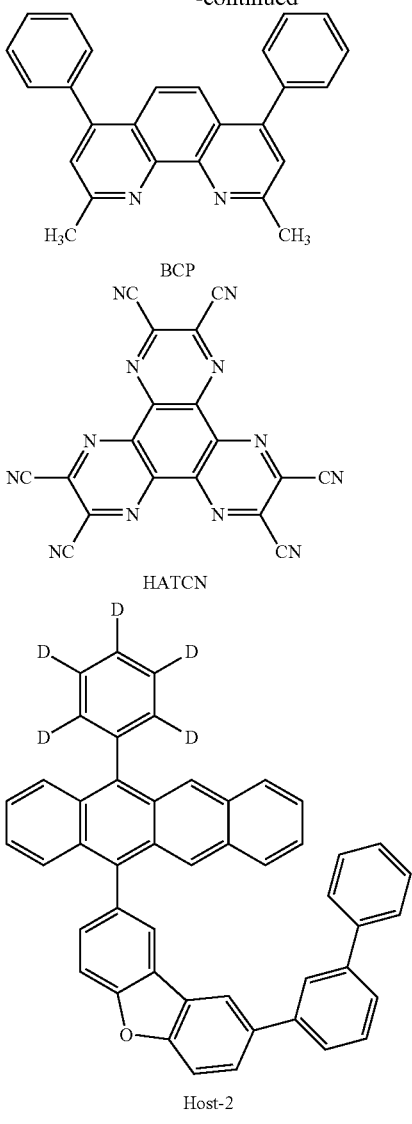

TABLE 1

| | Driving voltage (V) | Efficiency (Cd/A/y) | Lifespan ($T_{97}$) | Luminance (nit) |
|---|---|---|---|---|
| Comparative Example 1 | 100% | 100% | 100% | 1500 |
| Example 1 | 99% | 110% | 101% | 1500 |
| Comparative Example 2 | 100% | 100% | 100% | 1500 |
| Example 2 | 99% | 104% | 100% | 1500 |
| Example 3 | 98% | 109% | 101% | 1500 |
| Example 4 | 98% | 108% | 102% | 1500 |
| Example 5 | 97% | 115% | 101% | 1500 |
| Comparative Example 3 | 100% | 100% | 100% | 1500 |
| Example 6 | 99% | 104% | 101% | 1500 |
| Example 7 | 99% | 105% | 102% | 1500 |
| Example 8 | 99% | 105% | 100% | 1500 |
| Example 9 | 98% | 108% | 100% | 1500 |
| Example 10 | 98% | 110% | 101% | 1500 |
| Example 11 | 98% | 109% | 101% | 1500 |
| Example 12 | 97% | 115% | 102% | 1500 |

Referring to Table 1, it can be seen that the light-emitting device of Example 1 showed excellent results in terms of both efficiency and lifespan compared to the light-emitting device of Comparative Example 1, the light-emitting devices of Examples 2 to 5 showed equivalent or better results in terms of efficiency and lifespan compared to the light-emitting device of Comparative Example 2, and the light-emitting devices of Examples 6 to 12 showed equivalent or better results in terms of efficiency and lifespan compared to the light-emitting device of Comparative Example 3.

Hole Mobility ($M_H$) and Electron Mobility ($M_E$) of TPM-TAZ (Electron Transport Compound)

The hole mobility ($M_H$) and electron mobility ($M_E$) values of TPM-TAZ used in the forming of the second emission layer in each of the light-emitting devices of Examples 1 to 12 were measured using a SCLC measurement method for a hole-only device and an electron-only device, and results are shown in Table 2.

TABLE 2

| | $M_H$ | $M_E$ |
|---|---|---|
| TPM-TAZ | $3.2 \times 10^{-4}$ cm$^2$/Vs | $2.8 \times 10^{-3}$ cm$^2$/Vs |

Referring to the results of Table 2, it can be seen that TPM-TAZ satisfied Equation (1), thereby verifying the electron transport ability. In this regard, when such an electron transport compound was used together with a second host and a second dopant included in a second emission layer, the second host had improved electron mobility characteristics.

Consequently, a zone in which excitons were generated at the interface between the first emission layer and the second emission layer was significantly narrowed, resulting in maximization or an increase of the TTA components, and accordingly, problems of lifespan reduction upon luminescence at the interface between the first emission layer and the second emission layer were solved while efficiency was maximized or increased at substantially the same time. Also, these results corresponded well with the device results of Table 1.

According to the one or more embodiments, a light-emitting device shows improved results in terms of efficiency and lifespan compared to devices of the related art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:
1. A light-emitting device comprising:
a first electrode;
a second electrode facing the first electrode;
an interlayer between the first electrode and the second electrode and comprising an emission layer stack,
wherein the emission layer stack comprises:
a first emission layer comprising a first host and a first dopant; and
a second emission layer comprising a second host, a second dopant, and an electron transport compound,
the first host and the second host are different compounds from each other,
the first emission layer is in contact with the second emission layer, and
the second emission layer is closer to the second electrode than the first emission layer.
2. The light-emitting device of claim 1, wherein the first electrode is an anode,
the second electrode is a cathode, and
the light-emitting device further comprises a hole transport region between the first electrode and the emission layer stack and comprising a hole injection layer, a hole transport layer, an electron blocking layer, or any combination thereof.
3. The light-emitting device of claim 1, wherein the first electrode is an anode,
the second electrode is a cathode, and
the light-emitting device further comprises an electron transport region between the second electrode and the emission layer stack and comprising a hole blocking layer, an electron transport layer, an electron injection layer, or any combination thereof.
4. The light-emitting device of claim 1, wherein the emission layer stack emits blue light.
5. The light-emitting device of claim 1, wherein the first emission layer emits blue light.
6. The light-emitting device of claim 1, wherein the second emission layer emits blue light.
7. The light-emitting device of claim 1, wherein a hole mobility ($M_H$) and an electron mobility ($M_E$) of the electron transport compound satisfy Formula (1):

$$M_H \leq M_E \times 0.95 \tag{1}$$

8. The light-emitting device of claim 1, wherein the electron transport compound comprises: a CN moiety-containing compound; a triazole moiety-containing compound; an oxadiazole moiety-containing compound; an aromatic imidazole moiety-containing compound; a naphthalene diimide moiety-containing compound; a perylene moiety-containing compound; a boron-containing compound; a compound comprising anthracene and a phosphine oxide moiety; a triazine moiety-containing compound; a pyridine moiety-containing compound; a pyrimidine moiety-containing compound; or a carbazole moiety-containing compound.
9. The light-emitting device of claim 1, wherein the electron transport compound comprises one of compounds below:

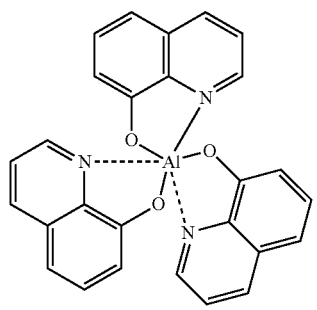

1

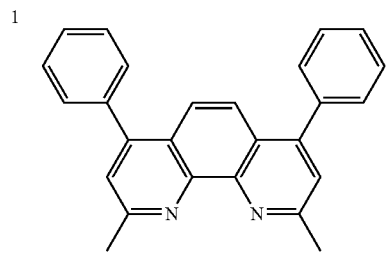

2

-continued
3
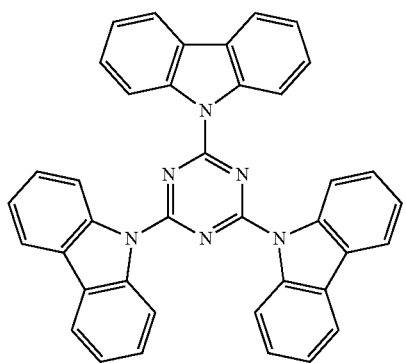
4
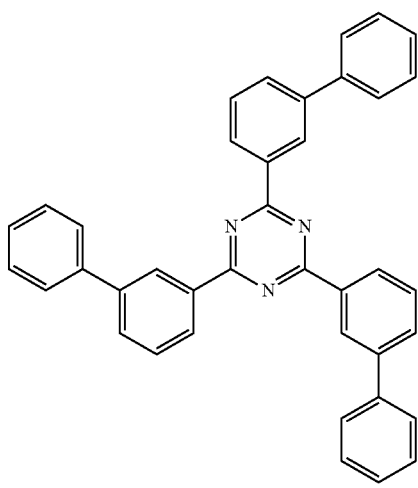
5
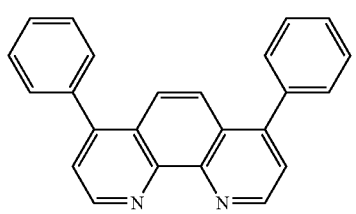
6
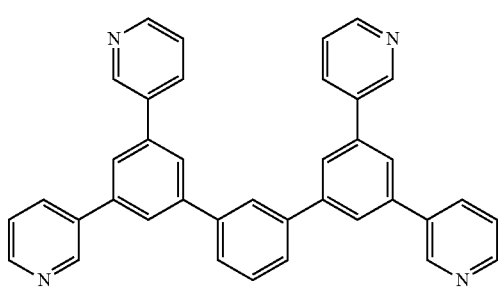
7
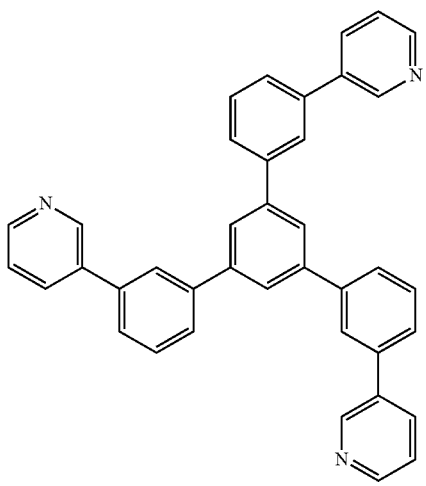
8
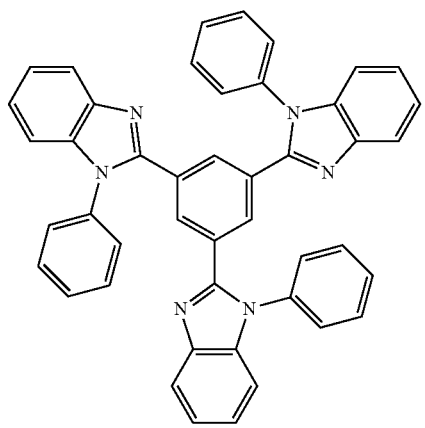
9
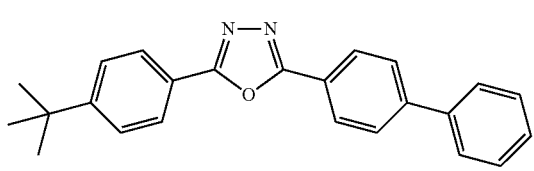
10
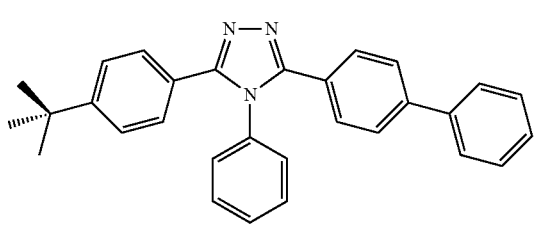

-continued
11
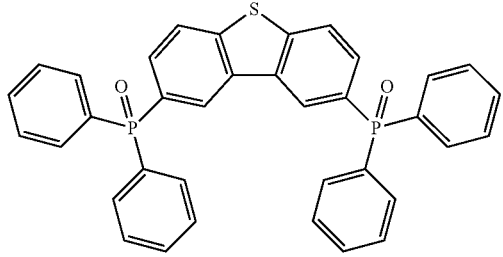
12
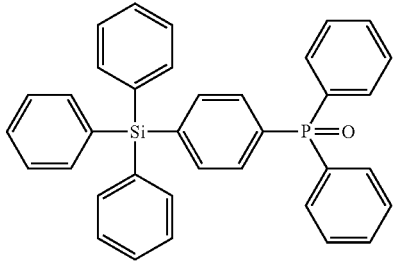
13
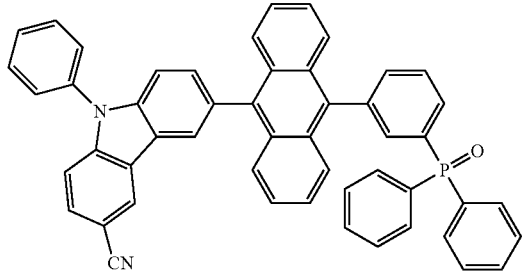
14
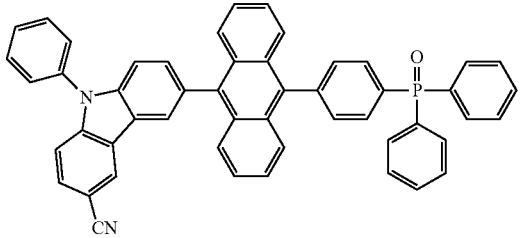
15
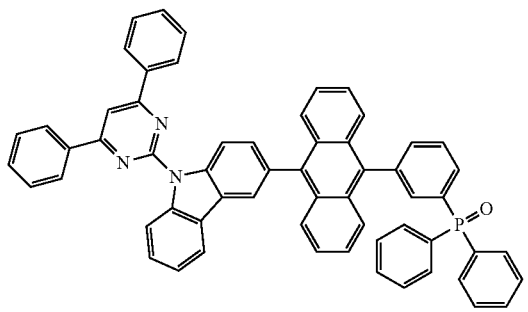
16
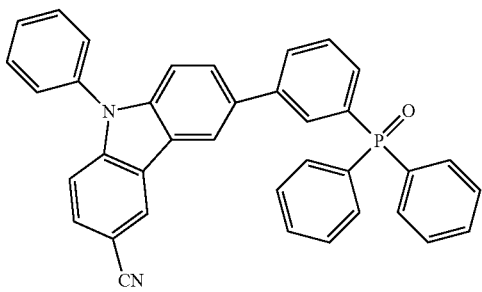
17
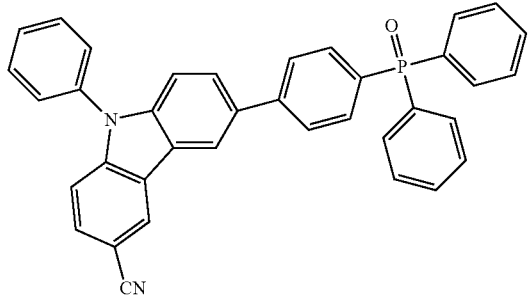
18
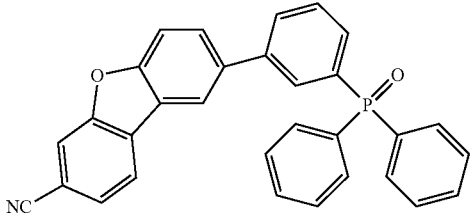
19
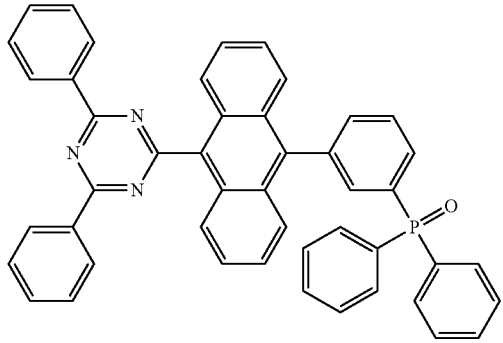
20
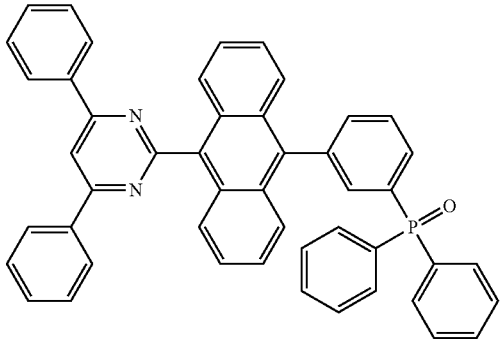

-continued
21
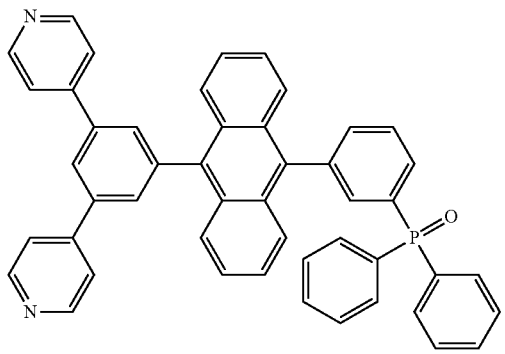
22
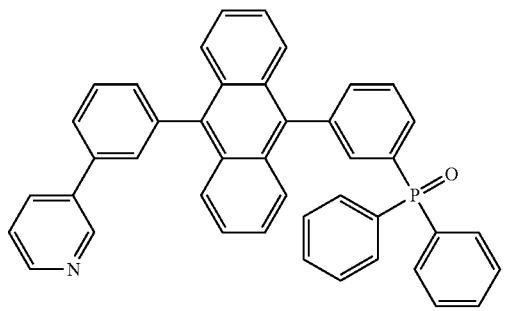
23
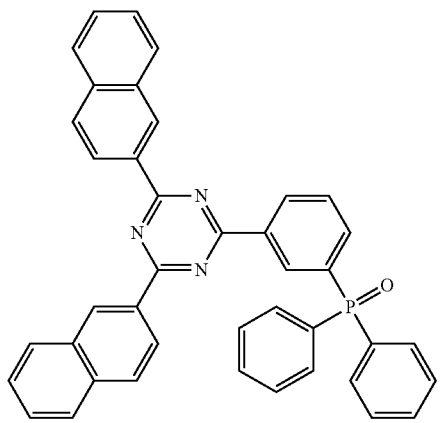
24
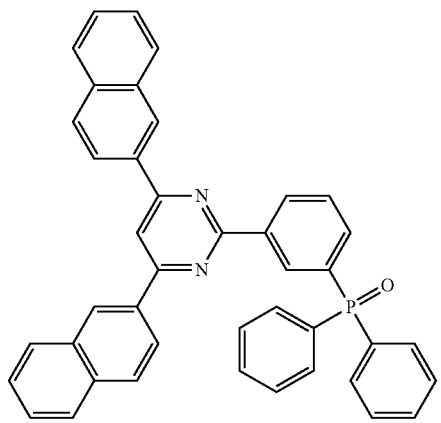
25
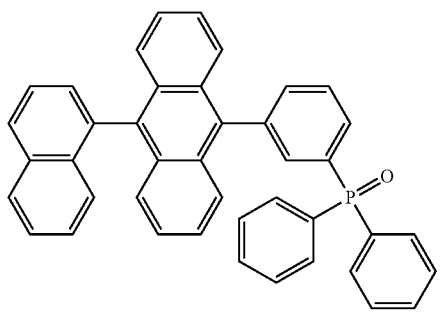
26
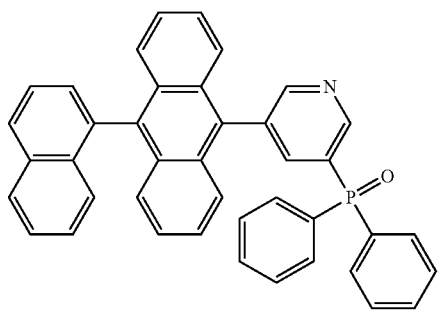
27
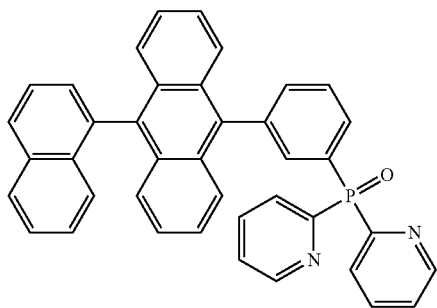
28
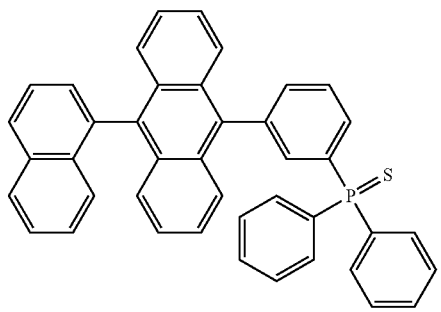

-continued
29
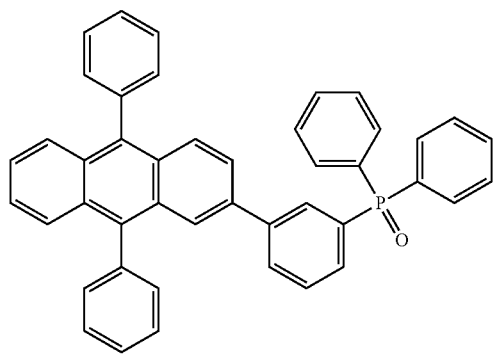
30
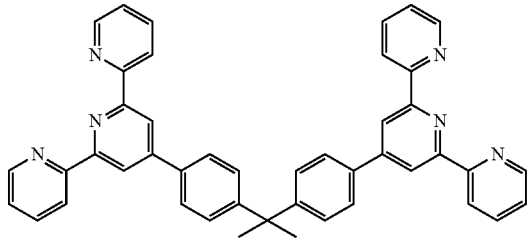
31
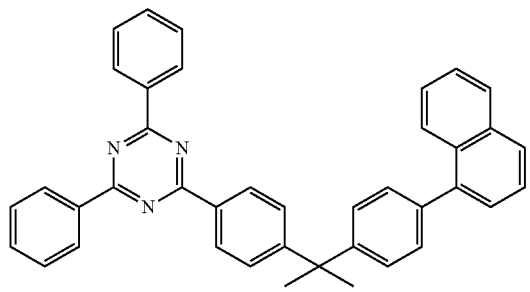
32
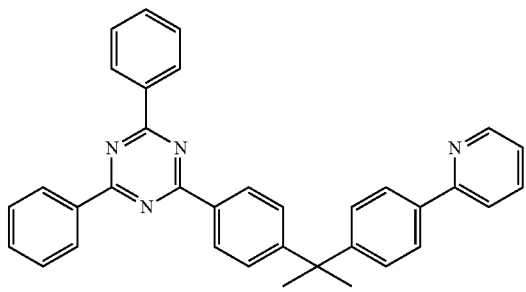
33
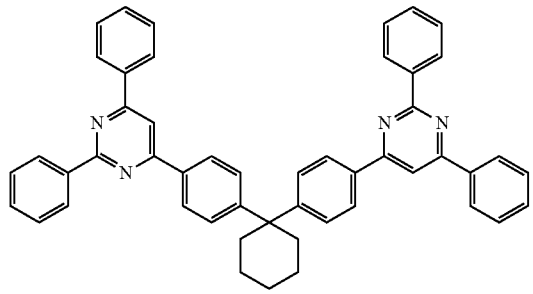
34
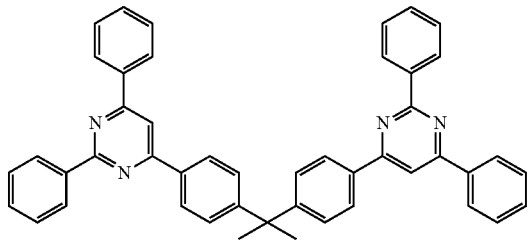
35
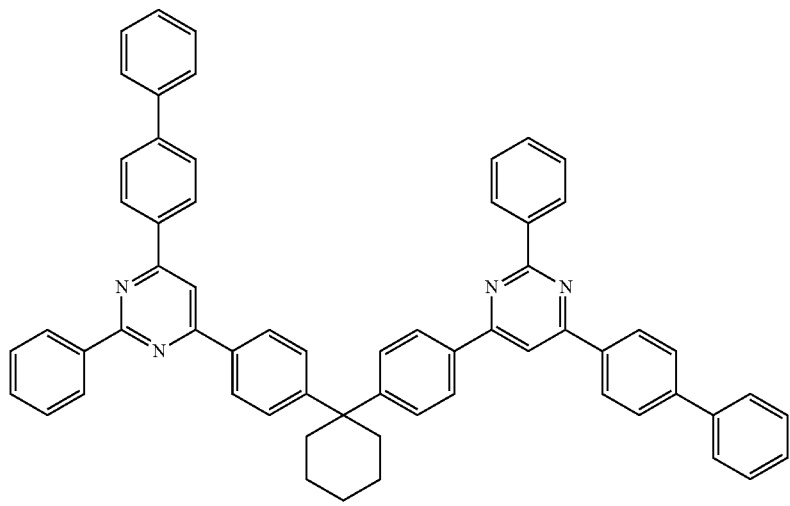

36
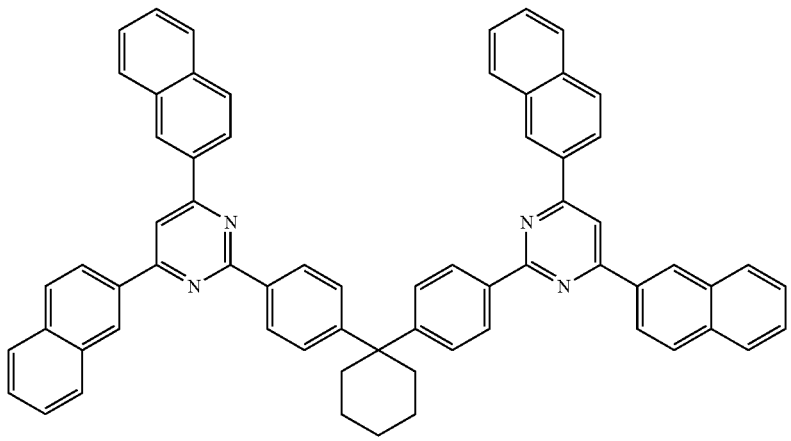
37
38
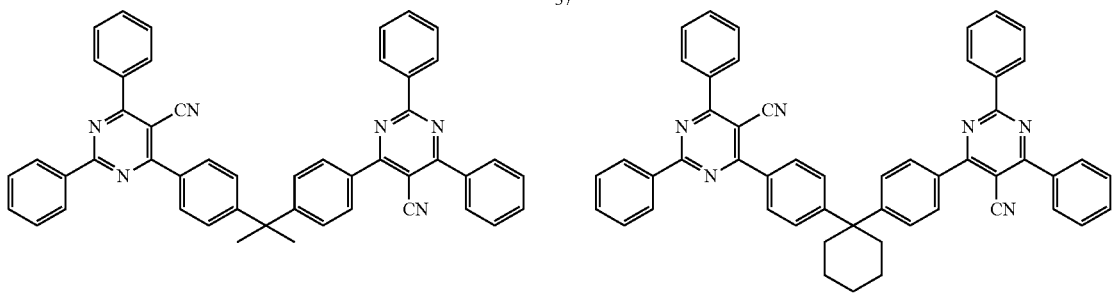
39
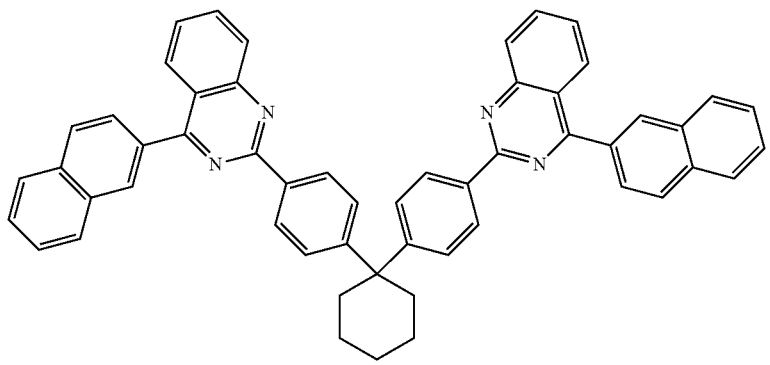
40
41
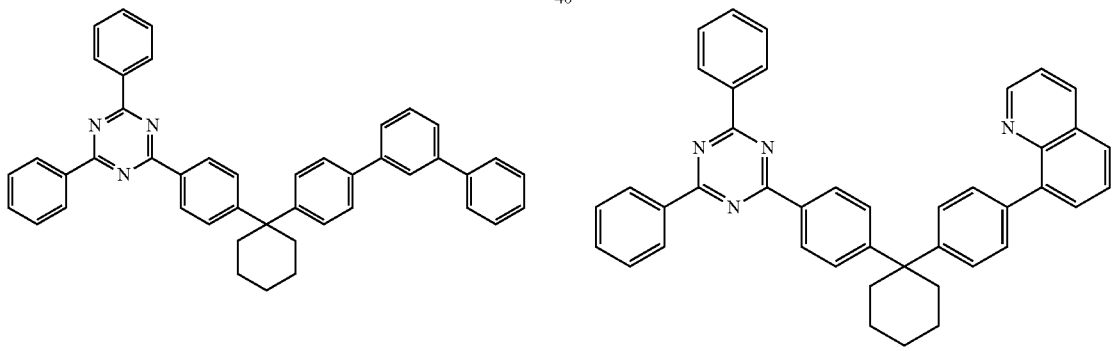

-continued
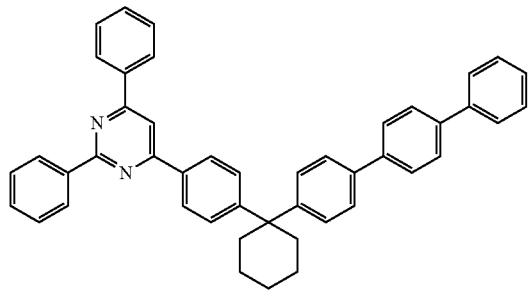
42
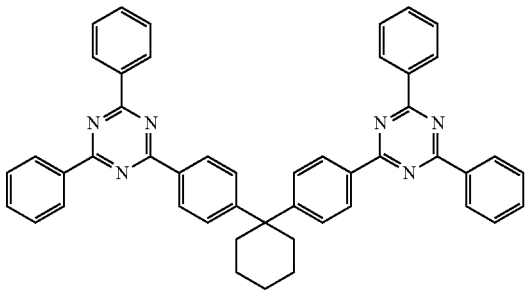
43
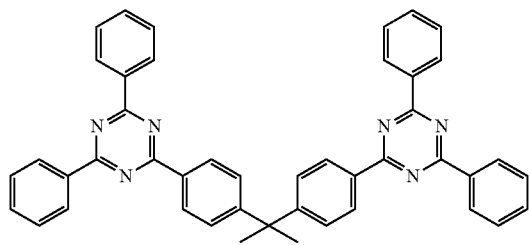
44
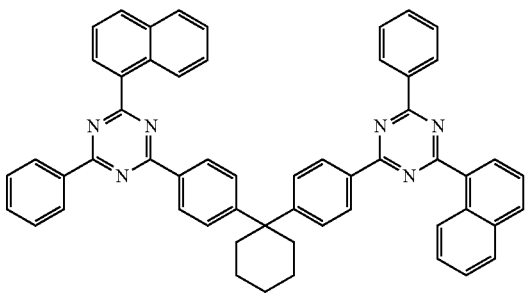
45
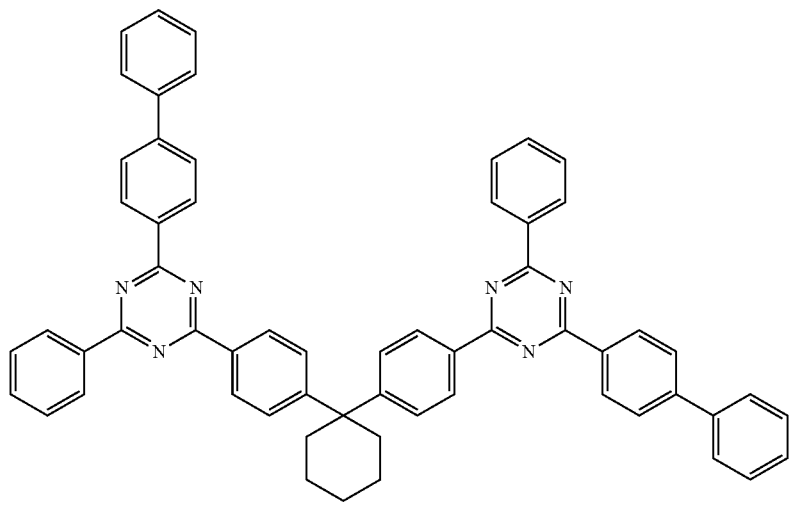
46
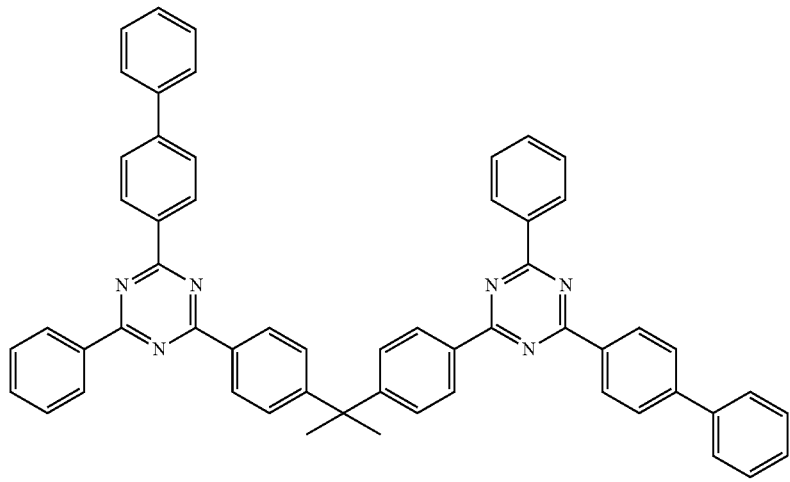
47

48

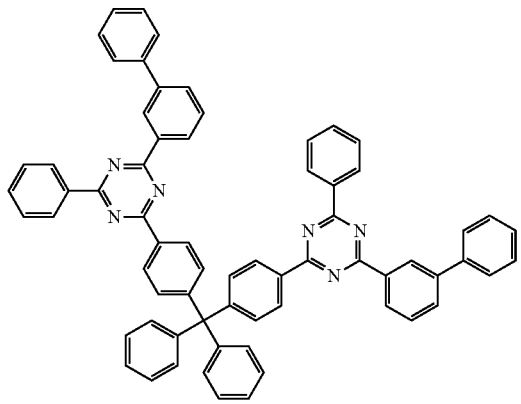

49

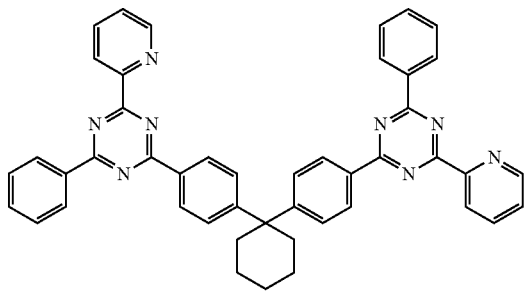

50

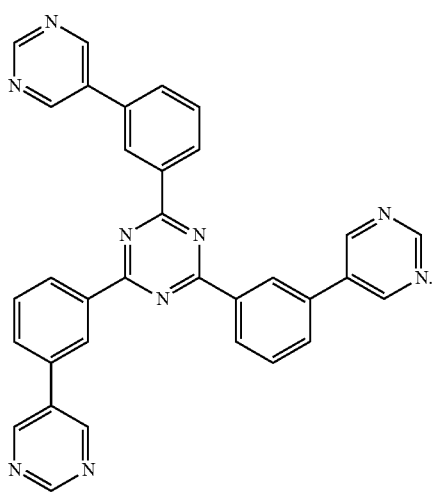

10. The light-emitting device of claim 1, wherein an amount of the electron transport compound in the second emission layer is equal to or less than 20 wt % based on a total amount of compounds in the second emission layer.

11. The light-emitting device of claim 1, wherein the first emission layer and the second emission layer emit light by a delayed fluorescence emission mechanism.

12. The light-emitting device of claim 1, wherein holes injected from the first electrode and electrons injected from the second electrode recombine at an interface between the first emission layer and the second emission layer.

13. The light-emitting device of claim 1, wherein the emission layer stack comprises a plurality of emission layer stacks.

14. The light-emitting device of claim 13, wherein a charge generation layer is between adjacent ones of the plurality of emission layer stacks.

15. The light-emitting device of claim 14, wherein the charge generation layer comprises a quinone derivative, a cyano group-containing compound, or any combination thereof.

16. The light-emitting device of claim 1, wherein the first host comprises the compound below:

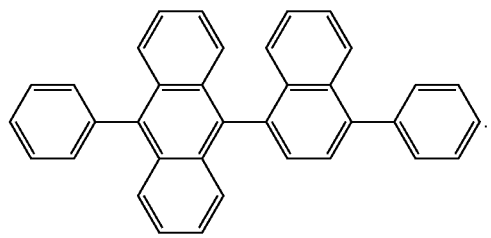 [SMILES: c1ccc(-c2ccc(-c3c4ccccc4c(-c4ccccc4)c4ccccc34)c3ccccc23)cc1]

17. The light-emitting device of claim 1, wherein the second host comprises the compound below:

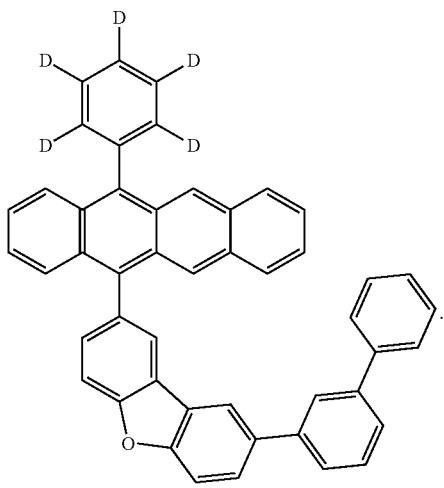 [SMILES: [2H]c1c([2H])c([2H])c(-c2c3ccccc3c(-c3ccc4oc5ccc(-c6cccc(-c7ccccc7)c6)cc5c4c3)c3cc4ccccc4cc23)c([2H])c1[2H]]

18. An electronic apparatus comprising the light-emitting device of claim 1.

19. The electronic apparatus of claim 18, further comprising:
a thin-film transistor,
wherein the thin-film transistor comprises a source electrode and a drain electrode, and
the first electrode of the light-emitting device is electrically coupled to at least one selected from the source electrode and the drain electrode of the thin-film transistor.

20. The electronic apparatus of claim 18, further comprising:
a color filter, a color conversion layer, a touch screen layer, a polarizing layer, or any combination thereof.

* * * * *